US010563080B2

(12) United States Patent
Druffel et al.

(10) Patent No.: US 10,563,080 B2
(45) Date of Patent: Feb. 18, 2020

(54) CORE-SHELL NANOSTRUCTURES AND RELATED INKS, FILMS AND METHODS

(71) Applicant: University of Louisville Research Foundation, Inc., Louisville, KY (US)

(72) Inventors: Theodore Druffel, Louisville, KY (US); Ruvini Dharmadasa, Louisville, KY (US); Menaka Jha, Louisville, KY (US); Delaina Amos, Louisville, KY (US)

(73) Assignee: UNIVERSITY OF LOUISVILLE RESEARCH FOUNDATION, INC., Louisville, KY (US)

( * ) Notice: Subject to any disclaimer, the term of this patent is extended or adjusted under 35 U.S.C. 154(b) by 408 days.

(21) Appl. No.: 15/507,363

(22) PCT Filed: Aug. 28, 2015

(86) PCT No.: PCT/US2015/047528
§ 371 (c)(1),
(2) Date: Feb. 28, 2017

(87) PCT Pub. No.: WO2016/033519
PCT Pub. Date: Mar. 3, 2016

(65) Prior Publication Data
US 2017/0253758 A1    Sep. 7, 2017

Related U.S. Application Data

(60) Provisional application No. 62/043,967, filed on Aug. 29, 2014.

(51) Int. Cl.
C09D 11/52    (2014.01)
C09D 11/037   (2014.01)
(Continued)

(52) U.S. Cl.
CPC ............ *C09D 11/52* (2013.01); *C09D 11/037* (2013.01); *C09D 11/322* (2013.01); *H05K 1/097* (2013.01);
(Continued)

(58) Field of Classification Search
None
See application file for complete search history.

(56) References Cited

U.S. PATENT DOCUMENTS 5,039,497 A       8/1991  Weber et al.
10,047,236 B1 *   8/2018  Druffel .................. C09D 11/52
(Continued)

FOREIGN PATENT DOCUMENTS

CN      101767205 B      12/2008
JP      2007224420 A  *   9/2007  ............. B01J 13/02
(Continued)

OTHER PUBLICATIONS

English translation of WO 2014/034996, Mar. 2014; 6 pages.*
(Continued)

*Primary Examiner* — Helene Klemanski
(74) *Attorney, Agent, or Firm* — Wyatt, Tarrant & Combs, LLP; Max E. Bridges; Stephen C. Hall

(57) ABSTRACT

Copper inks are provided that include a plurality of core-shell nanostructures, with each nanostructure including a copper core and a barrier metal shell, a diameter of less than about 500 nm, and a distinct boundary between the copper core and the barrier metal shell. Methods of forming a copper ink are further provided and include an initial step of synthesizing an amount of copper nanoparticles in an aqueous solution. An amount of a barrier metal is then added to the copper nanoparticles to form a dispersion of the barrier metal and the copper nanoparticles, and a reducing agent is subsequently added to the dispersion to produce a copper ink
(Continued)

comprising core-shell nanostructures having a copper core and a barrier metal shell. Copper films are then formed by applying that copper ink to a substrate and sintering the copper ink.

24 Claims, 35 Drawing Sheets

(51) Int. Cl.
| | |
|---|---|
| C09D 11/322 | (2014.01) |
| B22F 1/00 | (2006.01) |
| B22F 1/02 | (2006.01) |
| B22F 9/24 | (2006.01) |
| H05K 1/09 | (2006.01) |
| H05K 3/12 | (2006.01) |

(52) U.S. Cl.
CPC ... *H05K 3/1291* (2013.01); *H05K 2201/0218* (2013.01)

(56) References Cited

U.S. PATENT DOCUMENTS

| | | | | |
|---|---|---|---|---|
| 2007/0180954 | A1* | 8/2007 | Kim | B22F 1/0018 75/373 |
| 2007/0212562 | A1* | 9/2007 | Shim | H05K 1/097 428/548 |
| 2007/0290175 | A1* | 12/2007 | Kim | B22F 1/025 252/500 |
| 2011/0183128 | A1* | 7/2011 | Magdassi | H05K 1/097 106/31.92 |
| 2011/0296950 | A1* | 12/2011 | Buscall | B22F 1/0022 106/31.13 |
| 2015/0189761 | A1* | 7/2015 | Chan | C09D 11/52 427/125 |
| 2017/0118836 | A1* | 4/2017 | Kim | C09D 11/52 |
| 2017/0288075 | A1* | 10/2017 | Park | C09D 11/52 |

FOREIGN PATENT DOCUMENTS

| | | |
|---|---|---|
| KR | 10-2014-0056961 A | 5/2014 |
| WO | 2009/156990 A1 | 12/2009 |
| WO | 2014/034996 A1 | 3/2014 |

OTHER PUBLICATIONS

English translation of JP 2007/224420, Sep. 2007; 24 pages.*
Park, S.-H., et al. Flash light sintering of nickel nanoparticles for printed electronics. Thin Solid Films, 2014. 550: p. 575-581.
Perelaer, J., et al. Roll-to-roll compatible sintering of inkjet printed features by photonic and microwave exposure: from non-conductive ink to 40% bulk silver conductivity in less than 15 seconds. Adv Mater, 2012. 24(19): p. 2620-5.
Istratov, A.A., et al. Physics of Copper in Silicon. Journal of The Electrochemical Society, 2002. 149(1): p. G21.
Chung, W.H., et al. In situ monitoring of a flash light sintering process using silver nano-ink for producing flexible electronics. Nanotechnology, 2013. 24(3): p. 035202.
Galagan, Y., et al. Photonic sintering of inkjet printed current collecting grids for organic solar cell applications. Organic Electronics, 2013. 14(1): p. 38-46.
Hösel, M., et al. Large-scale roll-to-roll photonic sintering of flexo printed silver nanoparticle electrodes. Journal of Materials Chemistry, 2012.22(31): p. 15683.
Lee, D.J., et al. Pulsed light sintering characteristics of inkjet-printed nanosilver films on a polymer substrate. Journal of Micromechanics and Microengineering, 2011. 21(12): p. 125023.
Yung, K.C., et al. Ink-jet printing and camera flash sintering of silver tracks on different substrates. Journal of Materials Processing Technology, 2010. 210(15): p. 2268-2272.

Han, W.S., et al. Multi-pulsed white light sintering of printed Cu nanoinks. Nanotechnology, 2011. 22(39): p. 395705.
Hwang, H.J., et al. In situ monitoring of flash-light sintering of copper nanoparticle ink for printed electronics. Nanotechnology, 2012. 23(48): p. 485205.
Kim, H.-S., et al. Intense pulsed light sintering of copper nanoink for printed electronics. Applied Physics A, 2009. 97 (4): p. 791-798.
Ryu, J., et al. Reactive Sintering of Copper Nanoparticles Using Intense Pulsed Light for Printed Electronics. Journal of Electronic Materials, 2010. 40(1): p. 42-50.
Dharmadasa, R., et al. Room temperature synthesis of a copper ink for the intense pulsed light sintering of conductive copper films. ACS Appl Mater Interfaces, 2013. 5(24): p. 13227-34.
Dharmadasa, R., et al. Intense pulsed light treatment of cadmium telluride nanoparticle-based thin films. ACS Appl Mater Interfaces, 2014. 6(7): p. 5034-40.
Goodrich, A., et al. A wafer-based monocrystalline silicon photovoltaics road map: Utilizing known technology improvement opportunities for further reductions in manufacturing costs. Solar Energy Materials and Solar Cells, 2013. 114: p. 110-135.
Kern, W. The evolution of silicon wafer cleaning technology. Journal of the Electrochemical Society, 1990. 137(6): p. 1887-1892.
Huang, L., et al. Synthesis of copper nanoparticles containing diamond-like carbon films by electrochemical method. Electrochemistry communications, 2006. 8(2): p. 262-266.
Liu, Z., et al. Synthesis of copper nanowires via a complex-surfactant-assisted hydrothermal reduction process. The Journal of Physical Chemistry B, 2003. 107(46): p. 12658-12661.
Zhou, X., et al. Parametric study on electrochemical deposition of copper nanoparticles on an ultrathin polypyrrole film deposited on a gold film electrode. Langmuir, 2004. 20(12): p. 5109-5113.
Blosi, M., et al. Microwave-assisted polyol synthesis of Cu nanoparticles. Journal of Nanoparticle Research, 2011. 13(1): p. 127-138.
Kitchens, C.L., et al. Chloride ion effects on synthesis and directed assembly of copper nanoparticles in liquid and compressed alkane microemulsions. Langmuir, 2005. 21(11): p. 5166-5173.
Capek, I. Preparation of metal nanoparticles in water-in-oil (w/o) microemulsions. Advances in colloid and interface science, 2004. 110(1): p. 49-74.
Ponce, A.A., et al. Chemical and catalytic activity of copper nanoparticles prepared via metal vapor synthesis. Journal of Molecular Catalysis A: Chemical, 2005. 225(1): p. 1-6.
Mohamed, M.A., et al. A comparative study of the thermal reactivities of some transition metal oxalates in selected atmospheres. Thermochimica acta, 2005. 429(1): p. 57-72.
Kumar, B., et al. Enhanced hydrogen/oxygen evolution and stability of nanocrystalline (4-6 nm) copper particles. J. Mater. Chem. A, 2013. 1(15): p. 4728-4735.
Carroll, K.J., et al. Selective Nucleation and Growth of Cu and Ni Core/Shell Nanoparticles. Chemistry of Materials, 2010. 22(7): p. 2175-2177.
Yamauchi, T., et al., Magnetic Cu-Ni (core-shell) nanoparticles in a one-pot reaction under microwave irradiation. Nanoscale, 2010. 2(4): p. 515-23.
Kim, J.Y., et al. Reduction of CuO and Cu2O with H2: H Embedding and Kinetic Effects in the Formation of Suboxides. Journal of the American Chemical Society, 2003. 125(35): p. 10684-10692.
Svintsitskiy, D.A., et al. In Situ XRD, XPS, TEM, and TPR Study of Highly Active in CO Oxidation CuO Nanopowders. The Journal of Physical Chemistry C, 2013. 117(28): p. 14588-14599.
Richardson, J.T., et al. X-ray diffraction study of nickel oxide reduction by hydrogen. Applied Catalysis A: General, 2003. 246(1): p. 137-150.
Johnson, B.C. Electrical resistivity of copper and nickel thin-film interconnections. Journal of Applied Physics, 1990. 67(6): p. 3018-3024.
Istratov, A., et al. Electrical properties and recombination activity of copper, nickel and cobalt in silicon. Applied physics A, 1998. 66(2): p. 123-136.
Hall, R., et al. Diffusion and solubility of copper in extrinsic and intrinsic germanium, silicon, and gallium arsenide. Journal of Applied Physics, 2004. 35(2): p. 379-397.

(56) References Cited

OTHER PUBLICATIONS

Wang, M., et al. Barrier properties of very thin Ta and TaN layers against copper diffusion. Journal of The Electrochemical Society, 1998. 145(7): p. 2538-2545.

Feldman, D., et al. Photovoltaic System Pricing Trends: Historical, Recent, and Near-Term Projections. 2013 Edition. 2013, Golden, CO: National Renewable Energy Laboratory.

Goodrich, A.C., et al. Assessing the drivers of regional trends in solar photovoltaic manufacturing. Energy & Environmental Science, 2013. 6(10): p. 2811-2821.

Stassen, A.Z., et al. New Ag Metallization Pastes for Soalr Energy Cost Reduction. 2013.

Buzby, D., et al. Fine line screen printing of thick film pastes on silicon solar cells. 2011.

Hong, K.K., et al. Role of PbO-Based Glass Frit in Ag Thick-Film Contact Formation for Crystalline Si Solar Cells. Metals and Materials International, 2009. 15(2): p. 307-312.

Schubert, G., et al. Physical understanding of printed thick-film front contacts of crystalline Si solar cells—Review of existing models and recent developments. Solar Energy Materials and Solar Cells, 2006. 90(18-19): p. 3399-3406.

Vendra, V.K., et al. Photoanode Area Dependent Efficiency and Recombination Effects in Dye-Sensitized Solar Cells. Journal of the Electrochemical Society, 2012. 159(8): p. H728-H733.

Vendra, V.K., et al. Nanowire architectures for iodide free dye-sensitized solar cells. Journal of Materials Chemistry A, 2013.

Kalio, A., et al. Development of lead-free silver ink for front contact metallization. Solar Energy Materials and Solar Cells, 2012. 106: p. 51-54.

Zhu, X.M., et al. Effects of $B_2O_3$ content variation on the Bi ions in $Bi_2O_3$—$B_2O_3$—$SiO_2$ glass structure. Journal of Non-Crystalline Solids, 2014. 388: p. 55-61.

Najeeb, C.K., et al. The effect of surface modifications of carbon nanotubes on the electrical properties of inkjet-printed SWNT/PEDOT-PSS composite line patterns. Nanotechnology, 2010. 21(38).

Neuhaus, D.-H., et al. Industrial silicon wafer solar cells. Advances in OptoElectronics, 2008. 2007.

Raval, M.C., et al. Review of Ni—Cu Based Front Side Metallization for c-Si Solar Cells. Journal of Solar Energy, 2013. 2013.

Deng, D., et al. Copper nanoparticles: Aqueous phase synthesis and conductive films fabrication at low sintering temperature. ACS applied materials & interfaces, vol. 5, pp. 3839-3846, 2013.

Yu, W., et al. Synthesis and characterization of monodispersed copper colloids in polar solvents. Nanoscale research letters, vol. 4, pp. 465-470, 2009.

Jha, M., et al. Solution phase synthesis and intense pulsed light sintering and reduction of a copper oxide ink with an encapsulating nickel oxide barrier. IOP Publishing Ltd., 2015.

United States Patent and Trademark Office, International Search Report and Written Opinion issued in corresponding Application No. PCT/US15/47528, dated Dec. 1, 2015.

Lee, Y., et al. Large-scale synthesis of copper nanoparticles by chemically controlled reduction for applications of inkjet-printed electronics. Nanotechnology, vol. 19, p. 415604, 2008.

\* cited by examiner

| (c) | Coefficients | Standard Error | t Stat | P-value | Lower 95% | Upper 95% |
|---|---|---|---|---|---|---|
| Intercept | 43.345 | 0.019 | 2317.877 | 0.000 | 43.305 | 43.385 |
| X Variable 1 | -0.002 | 0.003 | -0.513 | 0.616 | -0.009 | 0.005 |

CORE-SHELL NANOSTRUCTURES AND RELATED INKS, FILMS AND METHODS

RELATED APPLICATIONS

This application claims priority from U.S. Provisional Application Ser. No. 62/043,967, filed Aug. 29, 2014, the entire disclosure of which is incorporated herein by this reference.

TECHNICAL FIELD

The presently-disclosed subject matter relates to core-shell nanostructures and related inks, films, and methods. In particular, the presently-disclosed subject matter relates to core-shell nanostructures having a core comprised of copper nanoparticles and a shell comprised of a barrier metal, as well as inks and films including such core-shell nanostructures and methods of making the core-shell nanostructures.

BACKGROUND

Recently, there has been interest in the rapid sintering of nanoparticles using intense pulsed light (IPL) of non-coherent white light. This process, also known as photonic sintering and flash sintering, delivers rapid and high energy pulses of light to nanocomposite thin films. The absorbed light is transferred almost immediately to heat, sintering neighboring nanoparticles and resulting in a conductive film. The process differs significantly from laser sintering techniques in two distinct details: (1) a much larger spectrum of light spanning from the ultraviolet (UV) to the near infrared (NIR) is used; and (2) the processing area is significantly larger. Additionally, the nanoparticles can be deposited using known traditional solution-phase printing techniques over large areas. These considerations make the IPL process interesting for scalable manufacturing, especially roll-to-roll production.

Along these lines, conductive patterns printed using such solution-based processes also have the capability to drastically reduce production costs. This is especially relevant for large scale applications such as photovoltaics (PV) in which high throughput, efficient materials usage, and low energy techniques are needed to reduce the overall costs. In this regard, silver (Ag) is traditionally used in PV manufacturing due to its inherent stability in such a demanding application. The deposition of silver is typically accomplished using pastes followed by thermal treatment to produce conductive lines in a high-throughput process. Efforts to drive down the cost of the silver include reducing silver usage through optimizing the screen printing process and utilizing other schemes employed in the microelectronics industry. However, the photovoltaics industry still utilizes approximately 10 percent of the annual worldwide silver production with double digit compound annual growth rate expected to continue for the foreseeable future. Therefore, searches for lower cost earth abundant materials, such as copper or nickel, to replace silver are necessary to achieve and maintain positive profit margins. Nevertheless, a significant disadvantage to using copper as a direct replacement to silver in PV is copper's fast diffusion into silicon (Si), which results in a lower performance of the PC due to increased recombination of the minority carriers. To date, methods to overcome such diffusion of copper have included low temperature deposition techniques and incorporation of diffusion barrier layers, but have only yielded marginal successes.

SUMMARY

The presently-disclosed subject matter meets some or all of the above-identified needs, as will become evident to those of ordinary skill in the art after a study of information provided in this document.

This summary describes several embodiments of the presently-disclosed subject matter, and in many cases lists variations and permutations of these embodiments. This summary is merely exemplary of the numerous and varied embodiments. Mention of one or more representative features of a given embodiment is likewise exemplary. Such an embodiment can typically exist with or without the feature(s) mentioned; likewise, those features can be applied to other embodiments of the presently-disclosed subject matter, whether listed in this summary or not. To avoid excessive repetition, this summary does not list or suggest all possible combinations of such features.

The presently-disclosed subject matter includes core-shell nanostructures and related inks, films, and methods. In particular, the presently-disclosed subject matter includes core-shell nanostructures having a core comprised of copper nanoparticles and a shell comprised of a barrier metal, as well as inks and films including such core-shell nanostructures and methods of making the core-shell nanostructures.

In some embodiments, a copper ink is provided that comprises a plurality of core-shell nanostructures, with each nanostructure including a copper core and a barrier metal shell, with each core-shell nanostructure having a diameter of less than about 500 nm, and with each core-shell nanostructure including a boundary between the copper core and the barrier metal shell. In some embodiments, the copper nanoparticles forming the core of the core-shell nanostructures have a diameter of about 10 nm to about 20 nm. In some embodiments, the core-shell nanostructures themselves have a diameter of about 10 nm to about 100 nm.

To produce such a core-shell nanostructure, in some implementations, a method of forming a copper ink is provided in which an amount of copper nanoparticles are synthesized in a solution (e.g., an aqueous solution). In particular, in some implementations, to form the copper nanoparticles, a hydrate of a copper salt (e.g., copper nitrate $(Cu(NO_3)_2)$) is initially provided in the aqueous solution along with one or more reagents. For instance, in certain implementations, such additional reagents can include an organic solvent, such as, ethylene glycol, propylene glycol, diethylene glycol, and combinations thereof, which are capable of reducing the reaction rate and amount of reducing agent needed in subsequent synthesis steps. In some implementations, and as another example, a capping agent is added to the aqueous solution to influence the development of the copper nanoparticles and/or prevent their agglomeration during synthesis. Exemplary capping agents that may be used in this regard include, but are not limited to, Tergitol, cetyl trimethyl ammonium bromide (CTAB), poly(N-vinyl-2-pyrrolidone) (PVP), and combinations thereof.

Once the copper is placed in an aqueous solution, the pH of the aqueous solution is then typically raised so as to form a complex with the copper in the aqueous solution and allow copper oxide nanoparticles to be precipitated in subsequent steps. In some implementations, the step of adjusting the pH of the aqueous solution comprises adjusting the pH of the aqueous solution from about 7 to about 11. In some embodiments, the pH is adjusted to about 10 or about 11. In some embodiments, each of the foregoing steps, including the step of raising the pH, is performed at about ambient temperature.

Subsequent to raising the pH of the aqueous solution, in some implementations, a reducing agent is then added to the solution to precipitate copper oxide particles from the solution at ambient temperatures. In some implementations, adding the reducing agent to the solution comprises adding a solution of the reducing agent at a molar ratio of copper to reducing agent equal to or less than about 1:1. In some implementations, the exemplary reducing agents utilized are selected from a borohydride (e.g., $NaBH_4$), a hydrazine, a citrate, an ascorbic acid, and combinations thereof.

Upon isolation of the copper nanoparticles, to produce the core-shell nanostructures, the copper nanoparticles are then combined with an amount of a barrier metal in a suitable solvent (e.g., an aqueous solvent or an organic solvent, such as acetone) so as to form a dispersion of the barrier metal and the copper nanoparticles in the particular solvent. In some implementations, adding the barrier metal and forming the dispersion comprises adding a solution of the barrier metal at a barrier metal to copper nanoparticle molar ratio equal to or less than about 1:1. In some implementations, the barrier metal that is utilized is selected from tin, silver, nickel, lead, bismuth, and salts, oxides, and combinations thereof. In some implementations, the barrier metal comprises a hydrated salt of the barrier metal, such as, in some implementations, nickel nitrate hexahydrate.

To continue the synthesis of the core-shell nanostructures, upon forming the dispersion of the barrier metal and the copper nanoparticles, a reducing agent is then added to the dispersion to form the shell about the copper nanoparticles. Similar to the production of the copper nanoparticles, exemplary reducing agents capable of being utilized in this regard can be selected from a borohydride (e.g., $NaBH_4$), a hydrazine, a citrate, an ascorbic acid, and combinations thereof, and can be utilized at a reducing agent to barrier metal molar ratio equal to or less than about 1:1.

To form a copper film, upon the production of the core-shell nanostructures of the presently-disclosed subject matter, the core-shell nanostructures are then typically applied in oxidized form to a suitable substrate as part of a copper ink and are then further reduced to their metallic forms. In some implementations, the copper ink is applied to the substrate by printing the copper ink onto the substrate, such as by screen printing or inkjet printing the copper ink. Exemplary substrates that can be used in this regard include substrates such as glass and polyethylene terephthalate (PET), but further include substrates, such as silicon, into which copper traditionally would diffuse.

Irrespective of the particular substrate chosen, in some implementations, to further reduce the copper oxide/metal barrier oxide core-shell nanostructures to their metallic forms, the copper ink is subsequently sintered. In some implementations, the sintering of the copper ink is performed by intense pulsed light (IPL) sintering. In some implementations that make use of IPL sintering, the IPL sintering comprises applying one or more pulses of light each having an energy of about 1 to about 50 $Jcm^{-2}$ to the copper ink to thereby form the copper film.

Further features and advantages of the present invention will become evident to those of ordinary skill in the art after a study of the description, figures, and non-limiting examples in this document.

DESCRIPTION OF EXEMPLARY EMBODIMENTS

Figure 1:
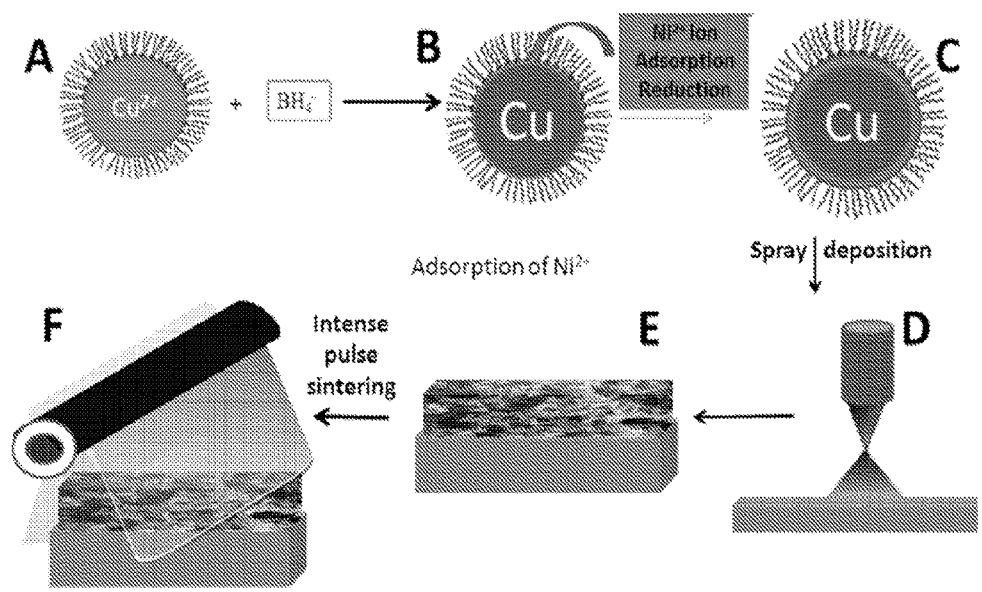
FIG. 1 is a schematic diagram showing the synthesis and thermal processing steps used to mitigate the diffusion of copper into silicon, where: in step A, a Cu-ammonia complex, capped with a surfactant is formed at the start of the synthesis; in step B, the complex is oxidized, forming $Cu_2O$ nanoparticles, and $Ni^{2+}$ ions are added and adsorb on the surface of the $Cu_2O$; in step C, further addition of a reducing agent results in the formation of a NiO shell on the nanoparticles; in steps D and E, the inks are ultrasonically sprayed on the substrate; and in step F, an intense pulsed light (IPL) process reduces the $Cu_2O$@NiO core-shell and sinters the metal film.

The details of one or more embodiments of the presently-disclosed subject matter are set forth in this document. Modifications to embodiments described in this document, and other embodiments, will be evident to those of ordinary skill in the art after a study of the information provided in this document. The information provided in this document, and particularly the specific details of the described exemplary embodiments, is provided primarily for clearness of understanding and no unnecessary limitations are to be understood therefrom. In case of conflict, the specification of this document, including definitions, will control.

Unless defined otherwise, all technical and scientific terms used herein have the same meaning as is commonly understood by one of skill in the art to which the invention(s) belong. All patents, patent applications, published applications and publications, databases, websites and other published materials referred to throughout the entire disclosure herein, unless noted otherwise, are incorporated by reference in their entirety. In the event that there are a plurality of definitions for terms herein, those in this section prevail. Where reference is made to a URL or other such identifier or address, it understood that such identifiers can change and particular information on the internet can come and go, but equivalent information can be found by searching the internet. Reference thereto evidences the availability and public dissemination of such information.

Although any methods, devices, and materials similar or equivalent to those described herein can be used in the practice or testing of the presently-disclosed subject matter, representative methods, devices, and materials are now described.

Following long-standing patent law convention, the terms "a", "an", and "the" refer to "one or more" when used in this application, including the claims. Thus, for example, reference to "a nanoparticle" includes a plurality of such nanoparticles, and so forth.

Unless otherwise indicated, all numbers expressing quantities of ingredients, properties such as reaction conditions, and so forth used in the specification and claims are to be understood as being modified in all instances by the term "about". Accordingly, unless indicated to the contrary, the numerical parameters set forth in this specification and claims are approximations that can vary depending upon the desired properties sought to be obtained by the presently-disclosed subject matter.

As used herein, the term "about," when referring to a value or to an amount of mass, weight, time, volume, concentration or percentage is meant to encompass variations of in some embodiments ±20%, in some embodiments ±10%, in some embodiments ±5%, in some embodiments ±1%, in some embodiments ±0.5%, and in some embodiments ±0.1% from the specified amount, as such variations are appropriate to perform the disclosed method.

As used herein, ranges can be expressed as from "about" one particular value, and/or to "about" another particular value. It is also understood that there are a number of values disclosed herein, and that each value is also herein disclosed as "about" that particular value in addition to the value itself. For example, if the value "10" is disclosed, then "about 10" is also disclosed. It is also understood that each unit between two particular units are also disclosed. For example, if 10 and 15 are disclosed, then 11, 12, 13, and 14 are also disclosed.

The presently-disclosed subject matter is based, at least in part, on the discovery of a technique to synthesize core-shell nanostructures having a copper (Cu) core and a nickel (Ni) shell or barrier layer (also referred to herein as "Cu@Ni" core-shell nanoparticles) and having defined and controlled diameters and shell thicknesses. In particular, it has been determined that the presently-disclosed core-shell nanostructures can be synthesized at ambient or room temperature to produce a copper ink, and that such core-shell nanostructures and copper inks do not require further processing prior to deposition as a film. In this regard, the deposited films can then be sintered to yield a highly-conductive film that only requires a short amount of process time, but yet is capable of reducing the amount of diffusion of Cu into substrates in which Cu has high diffusivity, such as silicon (Si).

The presently-disclosed subject matter thus includes core-shell nanostructures and related inks, films, and methods. In particular, the presently-disclosed subject matter includes core-shell nanostructures having a core comprised of copper nanoparticles and a shell comprised of a barrier metal, as well as inks and films including such core-shell nanostructures and methods of making the core-shell nanostructures. In some embodiments, a conductive ink is provided that comprises a plurality of core-shell nanostructures, where the core-shell nanostructures include a copper core and a barrier metal shell. In some embodiments, the metal shells of the presently-disclosed nanostructures can provide a degree of oxidation protection and act as a barrier for the diffusion of the core copper nanoparticles. In some embodiments, each of the core-shell nanostructures includes a distinct boundary between the copper core and the metal barrier shell of the nanostructures as a result of the prevention of the formation of alloys at the core-shell interface during synthesis, which, in turn, further preserves the properties attributable to the materials of the core and shell.

The terms "nanoparticle" and "nanostructure" are used herein to refer to particles that are generally measured on a nanometer scale. For example, in some embodiments, the nanoparticles or nanostructures described herein are about 1 nm, about 10 nm, about 20 nm, about 30 nm, about 40 nm, about 50 nm, about 60 nm, about 70 nm, about 80 nm, about 90 nm, to about 100 nm in diameter. In other embodiments, the diameters of the nanoparticle or nanostructures are about 100 nm, about 200 nm, about 300 nm, about 400 nm, about 500 nm, about 600 nm, about 700 nm, about 800 nm, about 900 nm, to about 1000 nm. In some embodiments, in the exemplary nanostructures described herein, the core copper nanoparticles include a diameter of about 1 nm to about 20 nm, and upon the addition of the barrier metal shell, each core-shell nanostructure has a diameter of less than about 100 nm. In some embodiments, each core-shell nanostructure has a diameter of less than about 500 nm.

The term "core-shell," as used herein in reference to the nanostructures of the presently-disclosed subject matter, refers to nanostructures comprising an inner core that is either partially or wholly covered or otherwise surrounded by an outer shell layer. As would be recognized by those skilled in the art, the extent to which the outer shell layer covers the inner core, depends, at least in part, on the amount of material for the outer shell layer that is combined with a particular amount of material for the inner core. In this regard, in some embodiments, various amounts and types of materials for the inner core and outer shell layer can be combined with one another to produce a core-shell nanostructure having desired properties. In all instances, however, the amount of material used to produce the outer shell of an exemplary core-shell nanoparticle will generally be sufficient to act as a barrier to at least a portion of the copper core and prevent or mitigate the oxidation of the copper core and the diffusion of copper from the core into the surrounding environment, such that the core-shell nanostructures can then be used as part of a copper ink for various applications, such as in the photovoltaics industry.

To produce a core-shell nanostructure in accordance with the presently-disclosed subject matter and, in turn, a copper ink including such core-shell nanostructures, an amount of copper nanoparticles are typically first produced in a solution (e.g., an aqueous solution) where an amount of copper is placed in an environment along with one or more additional reagents, as described in further detail below. In some implementations, the copper initially utilized is a copper salt or, in other words, a charged copper atom bound to another charged species. Exemplary copper salts that can be used in this regard include, but are not limited to, copper (I) chloride, copper (II) chloride, copper (II) sulfate, copper (II) carbonate, copper (II) nitrate, and the like. In some implementations, the copper salt is copper (II) nitrate or $Cu(NO_3)_2$. In some implementations, the copper salts used herein are further inclusive of hydrates thereof.

Regardless of the particular form of copper utilized, to produce a copper nanoparticle in accordance with the presently-disclosed subject matter and as noted above, the initial amount of copper is typically placed in the solution along with or more additional reagents. For instance, in certain implementations, such additional reagents can include an organic solvent, such as, ethylene glycol, propylene glycol, diethylene glycol, and combinations thereof, which are capable of reducing the reaction rate and amount of reducing agent needed in subsequent synthesis steps, as also described in further detail below. In some implementations, and as another example, a capping agent is added to the solution to influence the development of the copper nanoparticles and/or prevent their agglomeration during synthesis, as would be recognized by those skilled in the art. Exemplary capping agents that may be used in this regard include, but are not limited to, Tergitol, cetyl trimethyl ammonium bromide (CTAB), poly(N-vinyl-2-pyrrolidone) (PVP), citric acid, lactic acid, and combinations thereof.

In the synthesis of the copper nanostructures of the presently-disclosed subject matter, once the copper nanoparticles are placed in solution, the pH of the solution is then typically raised so as to form a copper complex in the solution and allow copper oxide particles to be precipitated in subsequent steps. For instance, in certain implementations, an ammonium hydroxide solution is added to the solution to form a copper-ammonium hydroxide complex and to raise the pH. In some implementations, the step of adjusting the pH of the solution comprises adjusting the pH of the solution from about 7 to about 11. In some implementations, the pH is adjusted to about 10 or about 11. In some implementations, each of the foregoing steps, including the step of raising the pH, is performed at about ambient temperature to about 200° C.

Subsequent to raising the pH of the aqueous solution, in the above-described implementations of the exemplary conductive ink synthesis methods, a reducing agent is then added to the aqueous solution to precipitate copper oxide particles from the aqueous solution at ambient temperatures or at temperatures up to about 200° C. The copper oxide nanoparticles can then be combined with an amount of a barrier metal to produce the core-shell nanostructures, as further described below. In some implementations, adding the reducing agent to the aqueous solution comprises adding an amount of the reducing agent at a copper to reducing agent molar ratio equal to or less than about 1:1. In some implementations, the exemplary reducing agents utilized are selected from a borohydride (e.g., $NaBH_4$), a hydrazine, a citrate, an ascorbic acid, and combinations thereof as each of these reducing agents can be utilized to form a precipitate of copper nanoparticles that can then be isolated. In some implementations, to isolate the copper nanoparticles, the solution including the copper oxide nanoparticles is subjected to centrifugation for a sufficient period of time.

Upon isolation of the copper nanoparticles (e.g., the copper oxide nanoparticles), to produce the core-shell nanostructures and, more specifically, to form the shell of the core-shell nanostructures, the copper nanoparticles are then combined with an amount of a barrier metal in a suitable solvent (e.g., an aqueous solvent or an organic solvent, such as acetone) so as to form a dispersion of the barrier metal and the copper nanoparticles in the particular solvent. In some implementations, adding the barrier metal and forming the dispersion comprises adding an amount of the barrier metal sufficient to achieve a barrier metal to copper nanoparticle molar ratio equal to or less than about 1:1.

The term "barrier metal," as used herein, is used to refer to a metal that can provide a degree of oxidation protection and act as a barrier for the diffusion of the core copper nanoparticles, but that is further suitable for use in the printing of copper inks and in applications such as photovoltaic applications. In some implementations, such a barrier metal is selected from, but is not limited to, tin, silver, nickel, lead, bismuth, and salts, oxides, combinations thereof. In some implementations, the barrier metal comprises a hydrated salt of the barrier metal, such as, in some implementations, nickel nitrate hexahydrate.

To continue the synthesis of the core-shell nanostructures, upon forming the dispersion of the barrier metal and the copper nanoparticles, a reducing agent is then added to the dispersion to form the shell about the copper nanoparticles. Similar to the production of the copper nanoparticles described herein above, in some implementations, the step of adding the reducing agent to the dispersion comprises adding a solution including a reducing agent to the dispersion. Exemplary reducing agents capable of being utilized in this regard can be selected from a borohydride (e.g., $NaBH_4$), a hydrazine, a citrate, an ascorbic acid, and combinations thereof, and can be utilized at reducing agent to barrier metal molar ratios equal to or less than about 1:1. In other implementations, however, the step of adding the reducing agent to the dispersion comprises placing the dispersion in a reductive atmosphere (e.g., $H_2$). As such, the phrase "adding a reducing agent" as used herein is inclusive of both combining the dispersion with a suitable reducing agent in solution, but is further inclusive of generally placing the dispersion in a reducing environment. In some instances, the thickness of the shell can be controlled (e.g., increased) by increasing the concentration of the barrier metal in the dispersion and/or increasing an amount of reducing agent added to the dispersion.

Depending on the particular form of copper utilized to form the copper nanoparticles and the form of barrier metal utilized, subsequent to the addition of the reducing agent to the dispersion of copper nanoparticles and barrier metal, the core-shell nanoparticles that are thereby formed can include oxides of copper and of the particular barrier metal utilized. For instance, in some embodiments that make use of copper oxide nanoparticles and hydrates of nickel salts, a copper oxide-nickel oxide core-shell structure is formed upon application of the reducing agent. As described below, further reducing treatments can then be applied to the oxide forms of the nanostructures to convert the nanostructures to their metallic forms. Thus, unless explicitly recited otherwise, the nanoparticles and nanostructures described herein include both oxidized and unoxidized forms of the nanoparticles. For instance, in some implementations, reference to a copper nanoparticle can refer to a pure metal form of the copper nanoparticles, copper oxide nanoparticles, or combinations thereof. Similarly, in some implementations, reference to a copper-nickel nanostructure can refer to a Cu—Ni nanostructure, a $Cu_2O$—NiO nanostructure, or a combination thereof.

To form a copper film, upon the production of the core-shell nanostructures of the presently-disclosed subject matter that are initially present in oxidized forms, the core-shell nanostructures are then typically applied to a suitable substrate as part of a copper ink and then further reduced, as necessary, to yield a metal form of the oxides present in the core-shell structures. In some implementations, the copper ink is applied to the substrate by printing the copper ink onto the substrate, such as by screen printing, inkjet printing, or aerosol jet printing the copper ink. Exemplary substrates that can be used in this regard include substrates such as glass and polyethylene terephthalate (PET), but further include substrates, such as silicon, into which copper traditionally would significantly diffuse. Specifically, in using such substrates and because the nanostructures described herein include a barrier metal shell, the copper in the resulting conductive films experience reduced or no oxidation and diffusion relative to pure copper films that are applied directly to equivalent substrates.

Irrespective of the particular substrate chosen, however, to further reduce the copper oxide/metal barrier oxide core-shell nanostructures to their metallic forms, the copper ink is typically sintered. In some implementations, the sintering of the copper ink is performed by intense pulsed light (IPL) sintering. Thus, the presently-disclosed copper inks can, in some implementations, be directly deposited onto a substrate without further processing and subsequently sintered using intense pulsed light (IPL) to form a copper film. In this regard, large area films and patterned lines can then be produced on a variety of substrates and present a significant advantage in terms of manufacturing scalability.

In some implementations, the induced pulsed light sintering comprises applying one or more pulses of light each having an energy of about 1 to about 50 $Jcm^{-2}$ to the copper ink. In some implementations, the methods described herein can include applying anywhere from 1 to about 100 pulses of light, wherein each pulse can be about less than 100 ms in duration (e.g., 2 ms). For instance, in one exemplary method, a copper film is made by providing one pulse of light having an energy of about 22.4 $Jcm^{-2}$.

The presently-disclosed subject matter is further illustrated by the following specific but non-limiting examples. Some of the following examples are prophetic, notwithstanding the numerical values, results and/or data referred to and contained in the examples. Additionally, the following examples may include compilations of data that are representative of data gathered at various times during the course of development and experimentation related to the present invention.

EXAMPLES

Materials and Methods for Examples 1-3

Copper nanoparticle inks sintered by intense pulsed light (IPL) were believed to be an inexpensive means to produce conductive patterns on a number of substrates; however, the oxidation and diffusion characteristics of copper were issues that had to be resolved before the nanoparticles could be considered as a viable solution. In this regard, and without wishing to be bound by any theory or mechanism, it was first believed that nickel could provide a degree of oxidation protection and act as a barrier for the diffusion of copper, and experiments were undertaken to synthesize Cu@Ni core-shell nanostructures using a solution phase synthesis process in the presence of a surfactant at room temperature.

Materials. Commercially available Tergitol NP-9 (Sigma Aldrich, 99%) was used as the capping agent for the synthesis of the copper nanoparticles. Anhydrous copper nitrate (Cu(NO3)2, Alfa Aesar, 99.99%), nickel nitrate hexahydrate (Alfa Aesar, 98%), ethylene glycol ($C_2H_6O_2$, Alfa Aesar, 99.5%), sodium borohydride ($NaBH_4$, Sigma Aldrich, 98%) and ammonium hydroxide (Fisher Scientific, 29.18%) were used in the synthesis of the Cu@Ni particles.

Synthesis of copper-nickel (Cu@Ni) core-shell nanostructures. The synthesis of the copper oxide ($Cu_2O$) nanoparticles was carried out using a method described earlier. Briefly, 5 ml of Tergitol and further 100 ml of water and/or ethylene glycol was added to a 50 ml aqueous solution of 0.1 M $Cu(NO_3)_2$. The pH of the solution was adjusted from pH 7 to 11 by adding ammonium hydroxide ($NH_4OH$) dropwise. To this solution, 50 ml of aqueous sodium borohydride ($NaBH_4$, 0.3 M) was added and the reaction was then stirred for 2 h. Next, the copper $Cu_2O$ nanoparticles in the form of a black precipitate were isolated by centrifugation at 5000 rpm for 5 min. 1.5 g of as obtained $Cu_2O$ nanoparticles was dispersed into a 25 ml solution of acetone and nickel nitrate hexahydrate $(Ni(NO_3)_2)*6H_2O$ (1 mM, 5 mM, 10 mM and 20 mM) under ultra-sonication at a power of 10 watt for one hour. Further, 25 ml of aqueous solution of $NaBH_4$ (1 mM, 5 mM, 10 mM and 20 mM) was added to the respective solution and sonicated for one hour.

Cu@Ni film deposition and IPL treatment. The nanoparticle dispersions were sonicated using a Virsonic 100 Ultrasonic Cell Disrupter for at least 30 minutes prior to film deposition. Films were fabricated from the different inks using a 48 kHz ultrasonic spray mounted on to a WideTrack Coating System (Sono Tek). The inks were sprayed onto glass substrates placed on a hotplate at 120° C. The films had a thickness of approximately 1.5-3.0 μm as measured using a Tencor AlphaStep 500 contact profilometer. Following deposition, the films were IPL treated under a nitrogen atmosphere using the procedure described previously. In this study, a Sinteron 2000 (Xenon Corporation) was used to apply 2.00 ms pulses of incoherent light. The energy density (ED) of the pulses was gradually increased with ED's of 10.2, 12.9, 15.5, 19.0, 22.4, 26.7, 31.1 and 34.5 $Jcm^{-2}$ being used. At each setting, 10 pulses of light were applied. In total, 80 pulses of light with a total energy density of 1723 $Jcm^{-2}$ was applied to each film. The films were labeled according to the concentration of nickel nitrate used to fabricate the Ni shell.

Thermoelectric measurements. <100> p-type silicon (Si) wafers (1-10 Ωcm, 500 μm thick, Silicon Prime Wafers) were cut into approximately 1.0×0.7 $cm^2$ samples and were cleaned using the standard RCA cleaning method prior to measurement of the thermoelectric power. A solution containing ammonium hydroxide (10 ml, 28% $NH_3OH$, Alfa Aesar), hydrogen peroxide (10 ml, 30% $H_2O_2$, J. T. Baker) and deionized water (50 ml) was heated to 70° C. The wafers were placed in the solution for 10 minutes to remove organic contaminants from the surface. Following cleaning, the rinsed wafers were etched in an approximately 2.5 vol % Hydrofluoric acid (48% HF, Cole Parmer) solution for 10 minutes to remove native oxides from the surface. The wafers were then rinsed again with deionized water. A solution containing hydrochloric acid (10 ml, 37% HCl, Sigma Aldrich), $H_2O_2$ (10 ml) and deionized water (50 ml) was heated to 70° C. The wafers were placed in the cleaning solution for 10 minutes prior to deposition to remove ionic contaminants from the surface and create a thin passivation layer on the surface of the wafer.

Figure 5:
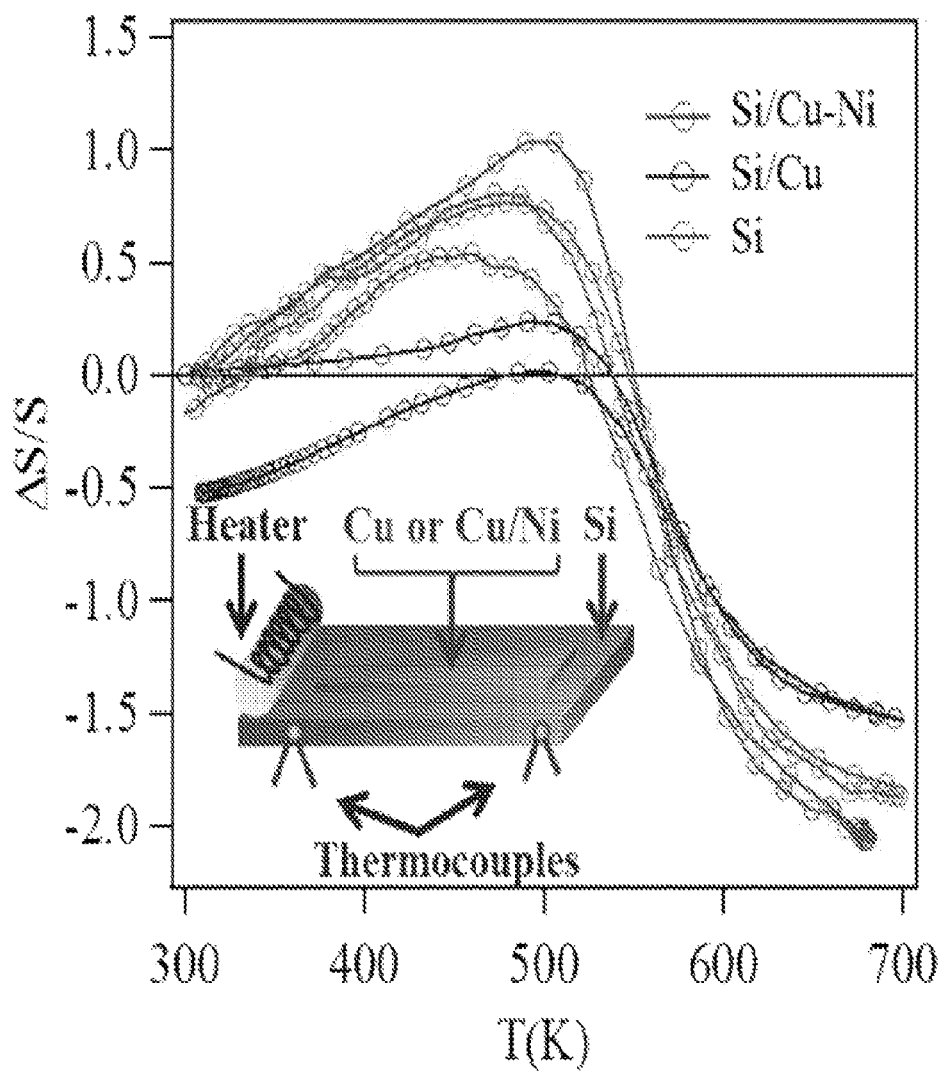
FIG. 5 is a graph showing normalized thermoelectric power curves for the Si, Si/Cu and Si/Cu—Ni samples as a function of the temperature, where the inset shows the setup for measuring the thermoelectric power.

Following cleaning, the cut wafers were left bare or coated with either the basic Cu ink (i.e., no Ni shell) or Cu@Ni ink synthesized using 1 mM of the Ni salt. The wafers coated with the ink were then IPL treated under the conditions described above. Each wafer was mounted onto the sample holder and two, K-type thermocouples were connected along the length of the wafer using a small amount of high purity conductive silver paint (FIG. 5, inset). A small heater was positioned in direct contact to the Si, closest to the first thermocouple. The sample holder was then inserted into a glass chamber and pumped down to $10^{-5}$ Torr. A Barnstead Thermolyne 2100 Tube Furnace was used to heat the wafer to 370° C. (643 K) and cool it back to room temperature at a rate of 5° C./min. The small heater created a localized temperature gradient along the length of the wafer. Subsequently, majority charge carriers (holes) diffused from the hot to the cold area, resulting in a potential difference. Both the temperature difference (ΔT) and open circuit potential difference (ΔV) along the length of the sample were measured simultaneously using Keithley sourcemeters (2400, 2410), nanovoltmers (2182A) and picoameters (6487), as well as a Fluke 8842A multimeter. The thermoelectric power of the sample at a given temperature was calculated; $S=\Delta V/\Delta T$.

Material Characterization. X-ray diffraction (XRD) of the films was carried out using a Bruker AXS D8 X-ray diffractometer using Ni-filtered Cu—$K_\alpha$ radiation with a step size of 0.02° and a scan speed of 2 sec/step. Raw data was subjected to background correction and Kα2 lines were removed. Size, morphology and STEM EDAX mapping were carried out with a Technai G220 electron microscope operated at 200 kV. A drop of acetone with the dispersed powder was taken on a porous carbon film supported on a gold grid, and then dried in vacuum. The thickness, t, of the deposited films was measured using a Technor Instruments Alpha-Step 500 surface profiler. Sheet resistance, $R_{sq}$, of the films was measured with a 4-point probe attached to a Keithley 2400 source-meter. The resistivity, ρ of the films was calculated from the $R_{sq}$ and the t of the films ($\rho=R_{sq}t$). The calculated ρ of the film does not take into account the porosity of the films. Surface morphology of the IPL treated films were examined by scanning electron microscopy (SEM). A FEI Nova NanoSEM 600 was used with an accelerating voltage of 15 kV and a working distance of 5-6 mm.

Example 1

Synthesis of Cu@Ni Core-shell Nanostructures

For the synthesis of Cu@Ni core-shell nanostructures, the initial focus was on the prevention of Cu diffusion into Si by incorporating a thin Ni shell around the Cu nanoparticles. To accomplish this, the entire process was carried out in three stages. The first stage dealt with the development of an economical room temperature process to make Cu@Ni core-shell nanostructures, while the second stage involved controlling the Ni shell thickness by variation of the reactant concentrations ($Ni(NO_3)_2$ and $NaBH_4$). Densification of the Cu@Ni core-shell film (fabricated by spray coating) and removal of the native oxide using the intense pulsed light sintering process was the final stage of the fabrication process. The mitigation of Cu diffusion by the Ni shell was then investigated.

There have been a number of published techniques for synthesizing Cu and Ni nanoparticles including electrochemical deposition, hydrothermal methods, electrolysis, microwave assisted polyol methods, reverse micellar synthesis, sonochemical methods, thermal reduction, and thermal decomposition of copper oxalate. Those methods typically lead to the formation of a Cu powder rather than dispersions for producing conductive films. However, there were only two reports for the synthesis of Cu@Ni core-shell nanostructures grown using a heated bath containing a solution of mixed metal salts. As a result of those conditions, only core-shell structures with diameters less than 100 nm were formed, with a Cu—Ni alloy interface. The process described herein below did not rely on the co-precipitation of metals in a single bath and was also been carried out at room (i.e., ambient) temperature. The scalability of the presently-disclosed reaction was also verified up to a 10 g scale.

As noted, the synthesis of a copper dispersion by the reduction of Tergitol capped $Cu^{2+}$ ions using sodium borohydride solution was described in an earlier work. By adjusting the concentrations of the reducing agent, $NaBH_4$ and capping agent, Tergitol, the diameter of the $Cu/Cu_2O$ nanoparticles was controlled. In these studies, the smallest of the nanoparticle dispersions with a measured diameter of approximately 10-20 nm was chosen. These nanoparticles were synthesized in a water/glycol (1:1 v/v) solvent (FIG. 1, step A) and were capped with Tergitol. In order to create a uniform shell of Ni on the Cu nanoparticles, the nanoparticles were first dried and then re-dispersed in an $Ni(NO_3)_2$ (acetone based) solution. The acetone was used to dissolve the Tergitol from the surface of the $Cu_2O$ nanoparticles, while the Ni ions simultaneously and homogeneously adsorb on the surface (FIG. 1, steps B-C). The concentration of the $Ni(NO_3)_2$ was adjusted between 1 mM and 20 mM to control the thickness of the Ni shell. These core-shell nanoparticles were the oxides of Cu and Ni ($Cu_2O@NiO$) and were reduced during the IPL process. To make a film using these core-shell nanostructures, the dispersions were spray deposited onto a silicon substrate followed by intense pulsed light sintering (FIG. 1, steps D-F).

Figures 2A, 2B, 2C:
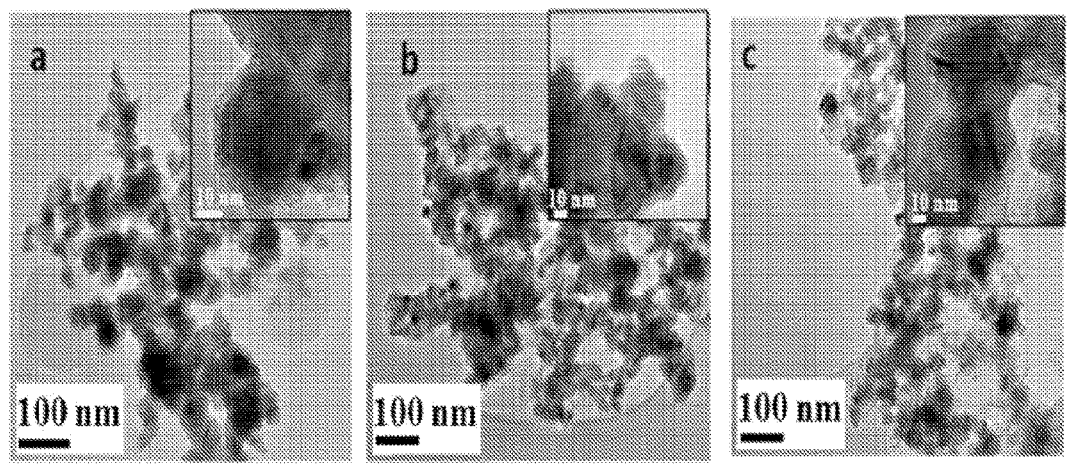
FIGS. 2A-2C include transmission electron microscopy (TEM) micrographs of Cu@Ni core-shell nanostructures obtained using a $Ni^{2+}$ concentration of 1 mM (FIG. 2A), 5 mM (FIG. 2B), and 20 mM (FIG. 2C), where the insets show high resolution TEM micrographs.
Figure 6:
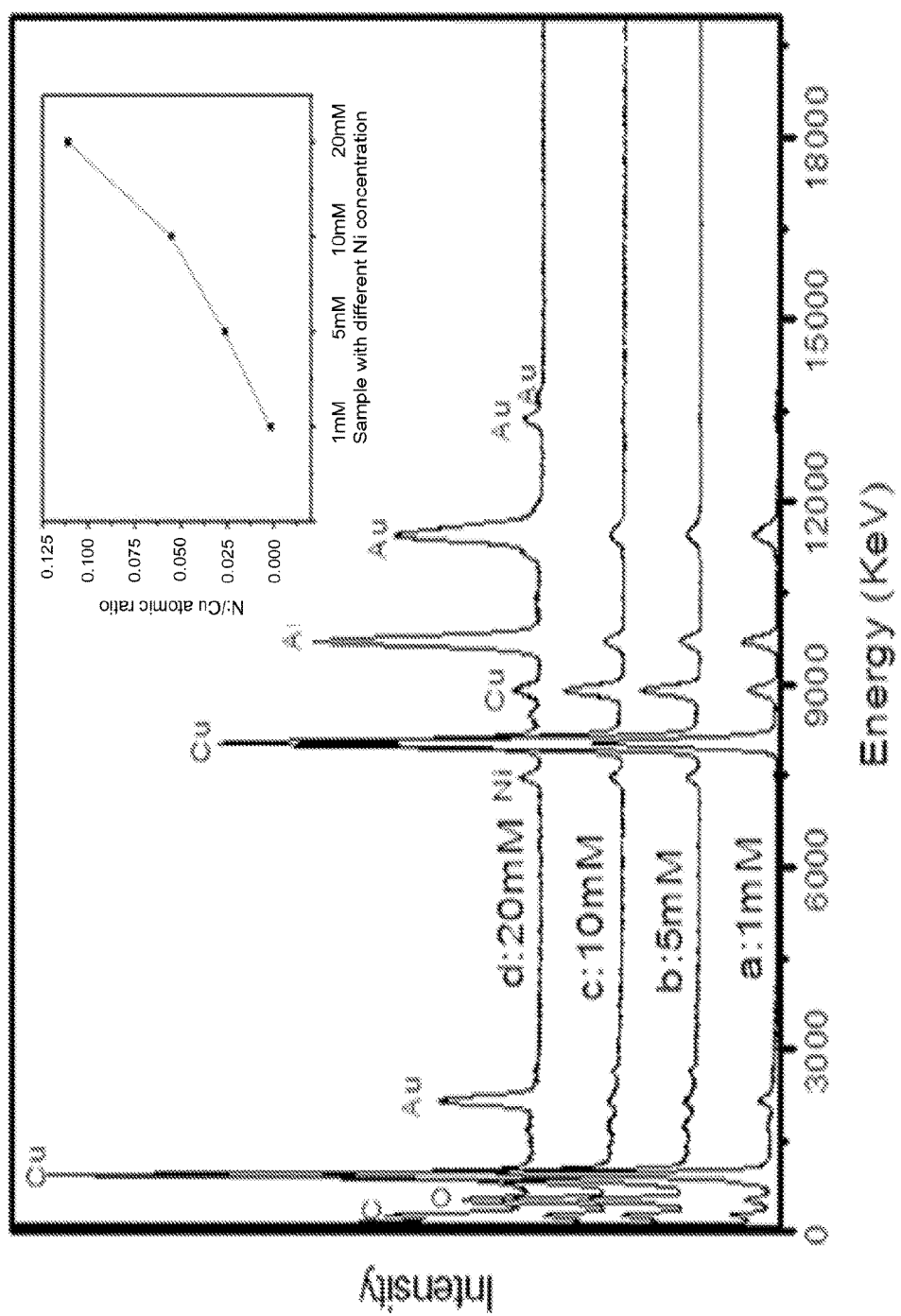
FIG. 6 is a graph showing the TEM-EDX pattern of samples at concentrations of 1 mM, 5 mM, 10 mM and 20 mM, where the inset shows TEM-EDX quantification results: Ni/Cu atomic ratio.

Transmission electron micrographs (TEM) of the $Cu_2O@NiO$ nanoparticles, synthesized using different concentrations of $Ni(NO_3)_2$; 1 mM, 5 mM, 10 mM and 20 mM are shown in FIGS. 2A-2C. FIGS. 2A-2C show that the size of Cu core nanoparticles was approximately 10-20 nm, while the thickness of the Ni shell grew as the $Ni^{2+}$ concentration was increased from 1 mM to 20 mM. The corresponding high resolution images are also shown in insets of FIGS. 2A-2C. From the images, it was observed that the $Cu_2O$ nanoparticles existed as an agglomeration, and that the NiO shells were formed around those agglomerates. Further, TEM EDX studies on the $Cu_2O@NiO$ core-shell confirmed the presence of Cu and Ni (FIG. 6). As expected the Cu/Ni ratio increased linearly with the $Ni^{2+}$ concentration (FIG. 6, inset). Those results indicated that as the concentration of Ni ions in the reaction was raised, the thickness of the Ni shell in the Cu@Ni core-shell nanoparticles increased. From these studies, it further appeared that by tuning the initial concentration of $Ni^{2+}$ ions, the thickness of the Ni shell could be controlled.

Example 2

Intense Pulsed Laser Sintering of Deposited Cu@Ni Films

The transformation of the oxidized core-shell nanoparticles into a bulk metallic film proceeded via two steps. The first was the reduction of the $Cu_2O@NiO$ precursors to their metallic forms, followed by the sintering and coalescence of these particles to form electrical pathways. Both stages capitalized on the high surface area to volume ratio associated with nano-sized particles. The high surface area provided a larger interface for the adsorption of reducing gases, thereby increasing the rate of reduction. In addition, the high surface to volume ratios could create a significant depression in the melting point temperatures of the metals, with the melting point of Cu ($T_{M\ bulk}$~1080° C.) and Ni ($T_{M\ bulk}$~1455° C.) being reduced to approximately 800 and 1270° C. for particles with a 4 nm radius. [1, 32]

When considering only the $Cu_2O$ system, both elevated temperatures and a reducing environment/atmosphere are needed for the reduction process to proceed. Kim et al.'s study on the reduction of $Cu_2O$ to Cu under a flow of 5% hydrogen ($H_2$ in helium), have shown that the reaction (Equation 1) proceeds without any intermediate phases being formed.

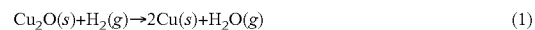

$$Cu_2O(s)+H_2(g) \rightarrow 2Cu(s)+H_2O(g) \qquad (1)$$

Under these conditions the temperature for the onset of $Cu_2O$ reduction occurred at approximately 300° C. with an activation energy of 114.6 kJmol$^{-1}$. Reduction of $Cu_2O$ has also been shown to occur at lower temperatures; however, the induction period where $H_2$ adsorption and dissociation takes place increases and the rate of the reaction decreases, resulting in significantly longer processing times (tens of minutes vs. hours). The reduction of NiO to Ni using $H_2$ proceeds via a similar route (Equation 2).

$$NiO(s)+H_2(g) \rightarrow Ni(s)+H_2O(g) \qquad (2)$$

Similarly to $Cu_2O$, the reduction of NiO begins with an induction period where $H_2$ is adsorbed and dissociated on the surface. This results in the "nucleation" of metallic Ni on the surface. Further reduction of the material occurs at the Ni/NiO interface and as the rate of reduction is proportional to interface area, an autocatalytic reaction occurs. Therefore the reduction of the oxide proceeds inwards towards the core of the particles as the H$^+$ diffuses in and $H_2O$ diffuses out. The $H_2O$ released in both the $Cu_2O$ and NiO reactions, results in a drop in the reduction rate in the closed systems as the $H_2O$ molecules adsorbed on the surface hinder the adsorption of $H_2$. In the NiO system, the activation energy for the reduction of the oxide to Ni is increased from approximately 85 kJmol$^{-1}$ to 127 kJmol$^{-1}$ when $H_2O$ is added to the system. Furthermore, the formation of a continuous metallic film on the surface is believed to hinder the diffusion of $H_2O$ out of the material.

Upon IPL treatment, the organic residues surrounding the system are decomposed to reducing gases. These gases are adsorbed onto the surface of the particles, reducing the NiO to Ni. As the reaction progresses the gases diffuse into the core of the particles, reducing both the NiO shell and the bulk of the particles ($Cu_2O$). Increasing the thickness of the NiO oxide shell has a number of effects on the system: (1) the overall particle size is increased, reducing the relative surface area available for the adsorption of gases; (2) the reducing gases must diffuse and react with a relatively larger volume of material; and (3) the decomposition of the organic chemicals do not necessarily produce reducing gases with a small molecular size (e.g., $H_2$). Therefore, the larger the molecules of the reducing gases, the lower the permeability of these gases in to the particles. Subsequently, the increase in the thickness of the Ni shell results in the incomplete reduction of the $Cu_2O$ core.

Figure 3A:
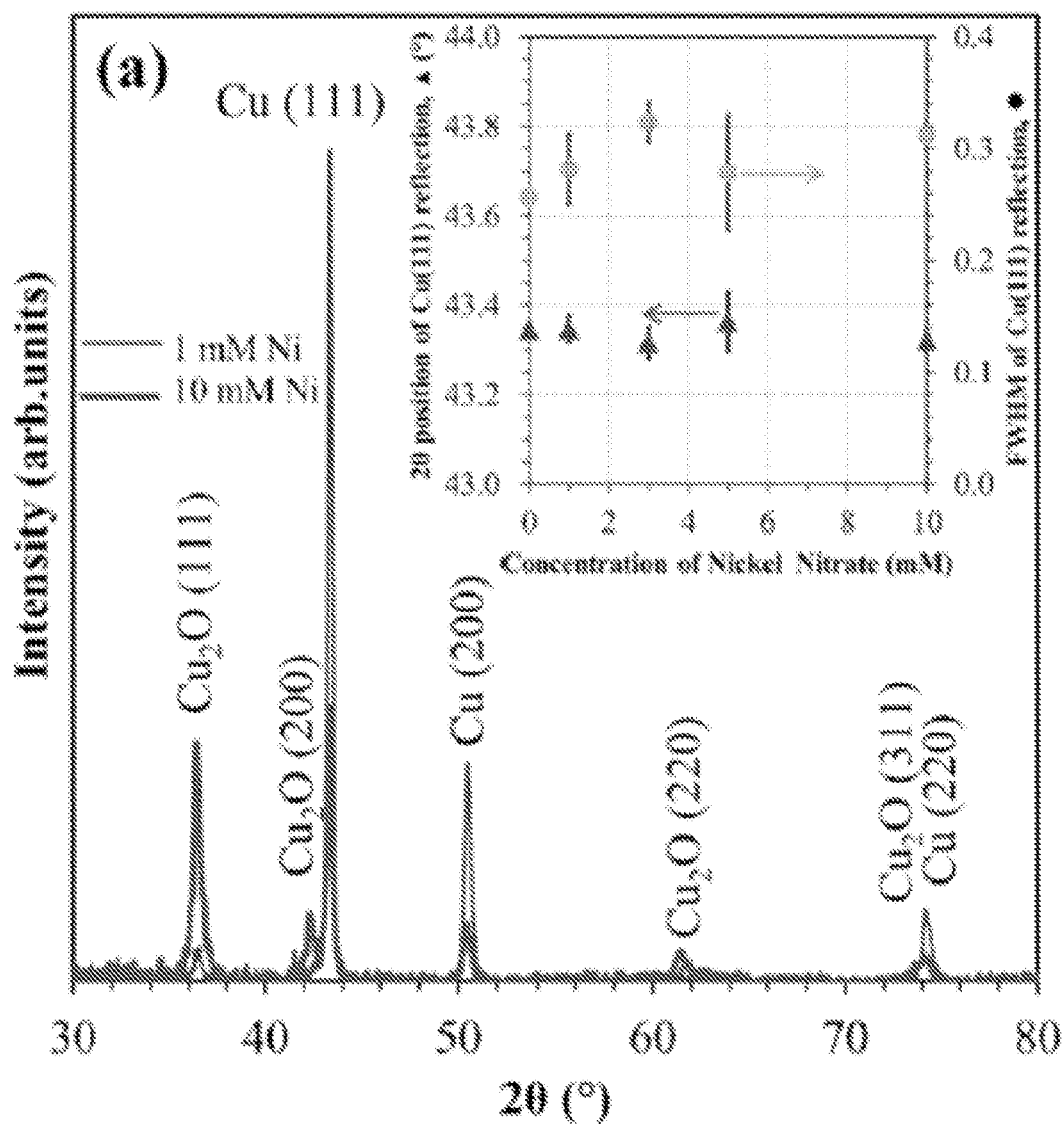
FIGS. 3A-3C include graphs showing: X-ray diffraction patterns of the Cu@Ni films after IPL treatment formed using 1 mM and 10 mM copper inks, where the inset shows the effect of the concentration of Ni nitrate solution on the $2\theta$ position and full width half maximum (FWHM) of the Cu(111) reflection, and where the error bars were calculated from the standard deviation (FIG. 3A); the ratio of the intensity of the Cu(111)/$Cu_2O$ (111) reflections after IPL treatment versus the concentration of nickel nitrate used to fabricate the nickel shell, where the error bars were calculated using the standard error (FIG. 3B); and the resistivity of the Cu—Ni IPL treated films versus concentration of nickel nitrate used to fabricate the nickel shell, where the error bars were calculated using the standard error (FIG. 3C)
Figure 3B:
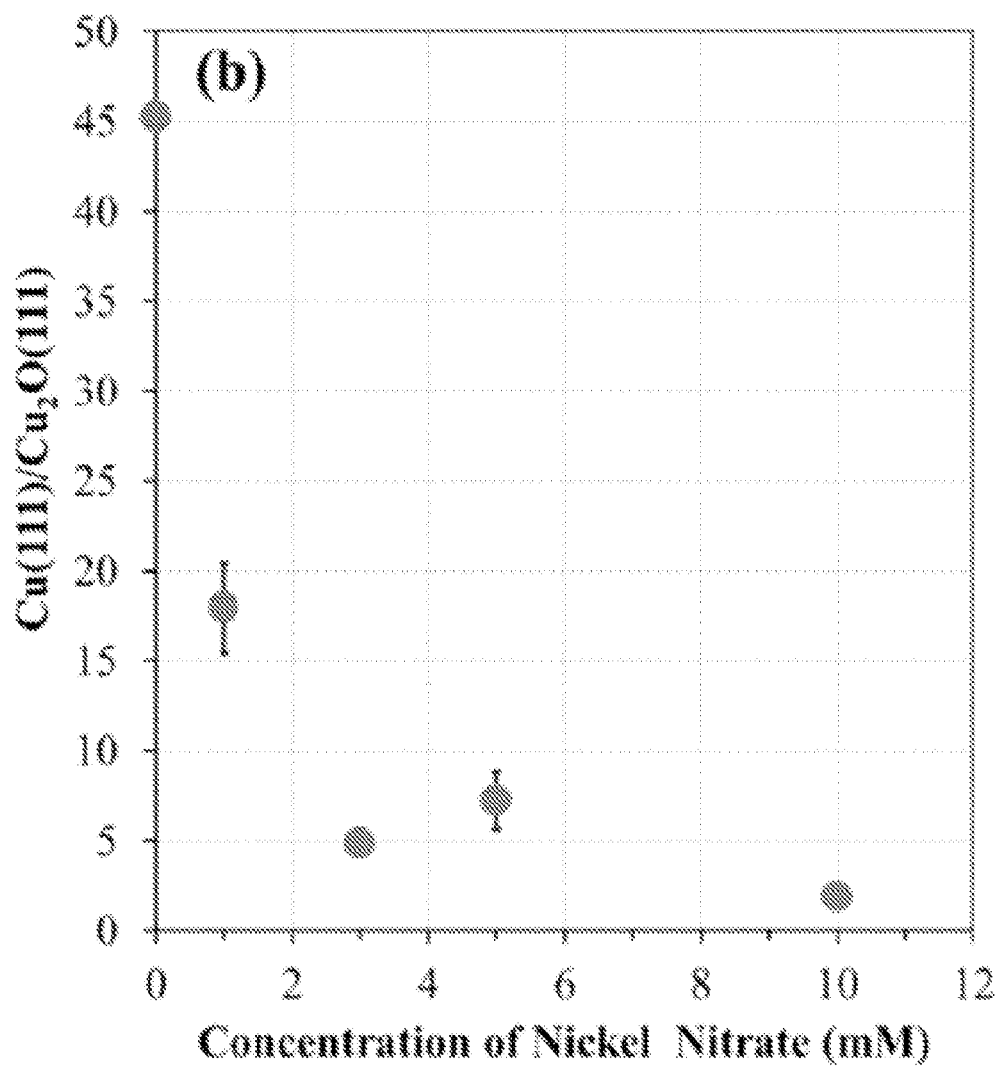
Figure 3C:
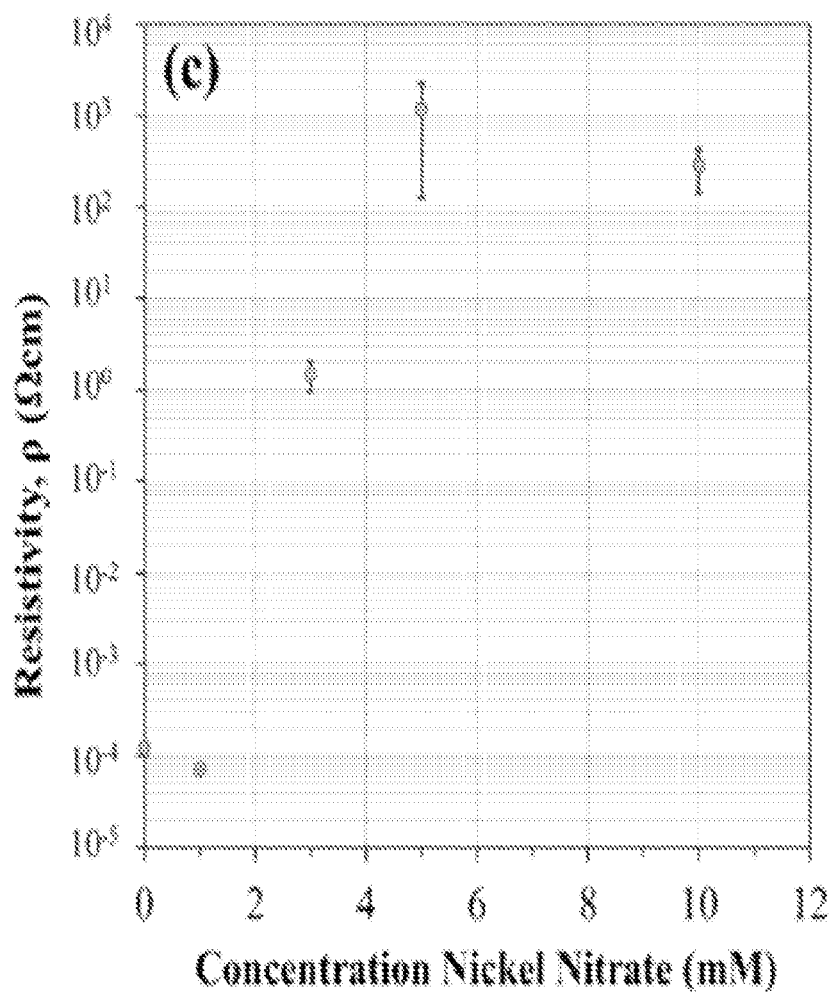

FIG. 3A shows the XRD diffraction patterns of the IPL treated films fabricated from 1 mM and 10 mM nickel nitrate. All the IPL treated films displayed (111), (200), (220) and (311) reflections corresponding to cubic $Cu_2O$ (ICDD 00-001-1142) and Cu (ICDD 00-001-1241). Due to the relatively small quantities of nickel nitrate used to synthesize the dispersions, no reflections for either NiO or Ni were observed. FIG. 3B also shows the effect of increasing the concentration of Ni salt on the ratio of the Cu(111)/Cu$_2$O (111) reflections. The results demonstrated a significant decrease in this ratio as the thickness of the Ni shell was increased. Indicating the increasing thickness of the Ni shell is hindering the reduction of the Cu$_2$O core. FIG. 3C shows the effect of the concentration of the Ni salt used to synthesize the shell on the resistivity, ρ of the films after IPL treatment. Using Ni salt concentrations of 5 and 10 mM, the ρ of the films remained above $10^2$ Ωcm. By decreasing the concentration of Ni salt in the synthesis stage to 3 mM, the reduction in the thickness of the shell yielded a two orders of magnitude drop in ρ. Further reductions in the Ni$^{2+}$ concentrations to 1 nM produced a ρ similar in magnitude to the films produced without the Ni shell. Resistivity values for bulk Cu and Ni have been reported as $1.67 \times 10^{-6}$ and $6.8 \times 10^{-6}$ Ω cm at 25° C. The films fabricated from the 1 mM Ni salt solutions were only one order of magnitude away from the bulk ρ of Ni due to the high porosity of these films. The films produced with thicker Ni shells demonstrated a significantly higher ρ due to the incomplete reduction of Cu$_2$O.

The low temperature synthesis method described above produced a Cu$_2$O core and a discrete NiO shell that does not appear to form an alloy, whereas earlier reports on the synthesis of Cu@Ni nanoparticles have found an alloy at this interface. Although the relatively small difference in the atomic radii of Cu and Ni is known to result in the easy formation of solid solutions, it would appear as though the IPL treatment is preserving the distinct boundary between the metals at the interface. Therefore, to investigate if Cu and Ni are alloying during the synthesis and subsequent IPL treatment, the positions of the XRD reflections were analyzed further. If alloying is present in the system, the reflections will broaden and shift between the corresponding positions for Cu and Ni. For example, the (111) reflection is expected to shift from a 2θ position of 43.19° for a 100% Cu system towards 44.60° for 100% Ni system, as Cu and Ni alloy. The position of the XRD reflections does not show an indication of Cu alloying with the Ni after IPL treatment (FIG. 3A, inset). Both the position of the Cu (111) and the full width half maximums (FWHM) do not vary significantly with an increasing Ni salt concentration. An analysis was implemented using a 95% confidence interval regression with the null and alternate hypotheses (Table 1).

TABLE 1

Hypotheses for confidence integral regression analysis of XRD data.

| | Cu(111) reflection | FWHM |
|---|---|---|
| Null Hypothesis - H$_0$ | Equal to Cu(111) | Equal to Cu width |
| Alternate Hypothesis - H$_1$ | Not equal to Cu(111) | Not equal to Cu width |

Figure 7A:
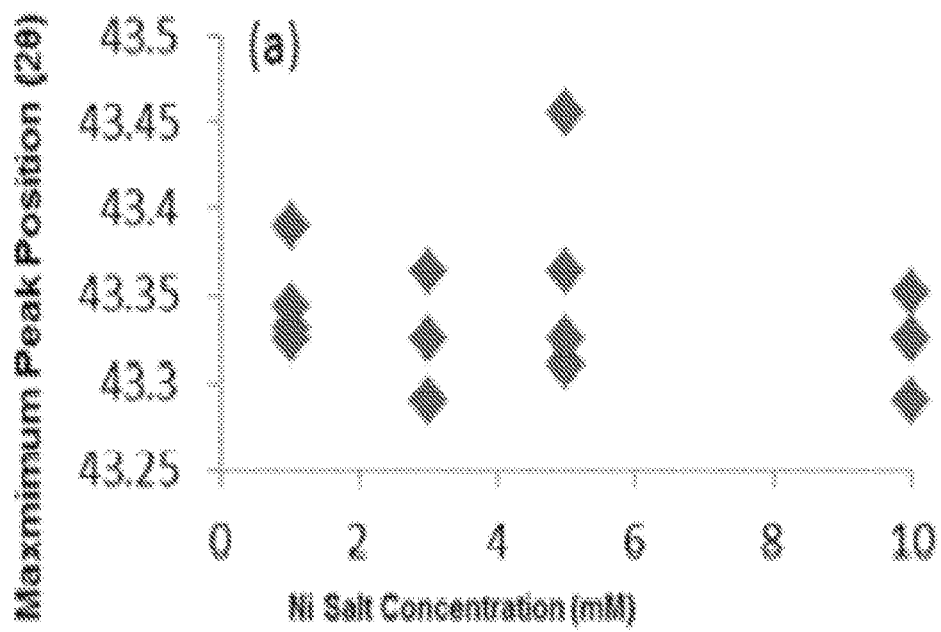
FIGS. 7A-7C include a graph showing the position of the Cu(111) reflections versus the concentration of the nickel salt (FIG. 7A), a graph showing the residuals for the analysis of the Cu(111) reflection versus the concentration of the nickel salt (FIG. 7B), and a table showing the tabulated linear regression results (FIG. 7C), where the integral regression analysis was performed for the position of the Cu(111) reflection using a 95% confidence interval linear regression, where the analysis of the data found the coefficients to be 43.35° (intercept) and $-0.0017°$ $mM^{-1}$ (slope), where the position of the maximum peak for the pure copper at $2\theta=43.3459°$ fell within the lower (43.305°) and upper (43.385°) bounds, and where the slope of zero fell within the lower ($-0.009°$ $mM^{-1}$) and upper (0.005° $mM^{-1}$) bounds.
Figure 7B:
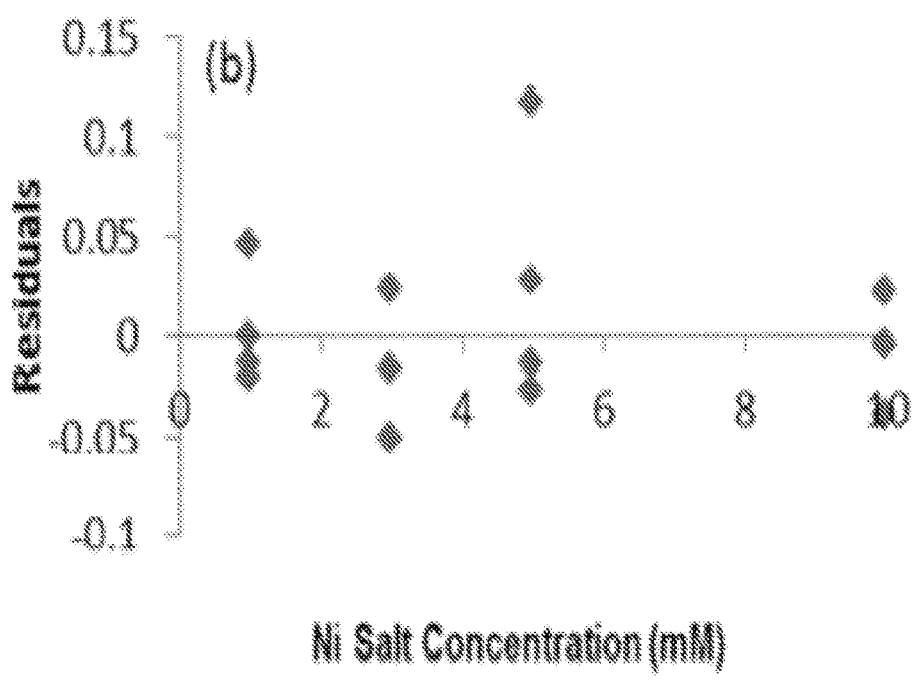
Figures 7C, 8A:
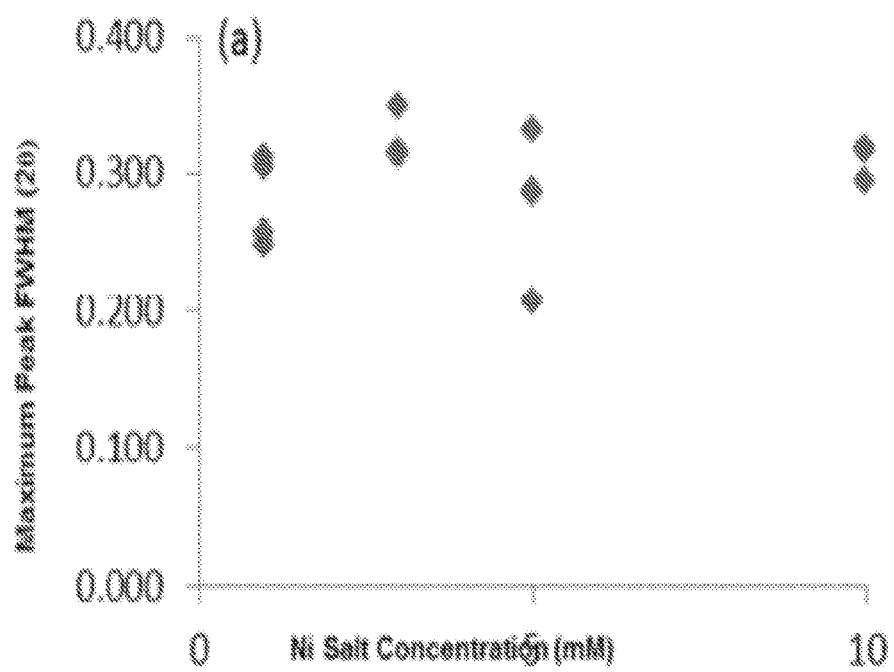
FIGS. 8A-8C include a graph showing the FWHM of the Cu(111) reflection versus the concentration of the Ni salt (FIG. 8A), the residuals for the Cu(111) reflection versus the concentration of the Ni salt (FIG. 8B), and a table showing the tabulated linear regression results (FIG. 8C), where integral regression analysis on the FWHM of the Cu(111) reflection was performed using a 95% confidence interval linear regression, where the analysis of the data found the coefficients to be 0.289° (intercept) and 0.002° $mM^{-1}$ (slope), where the position of the FWHM of pure copper at 2θ=0.257° fell within the lower (0.256°) and upper (0.323°) bounds, and where the slope of zero fell within the lower (−0.004° mM$^{-1}$) and upper (0.008° mM$^{-1}$) bounds.
Figures 8B, 8C:
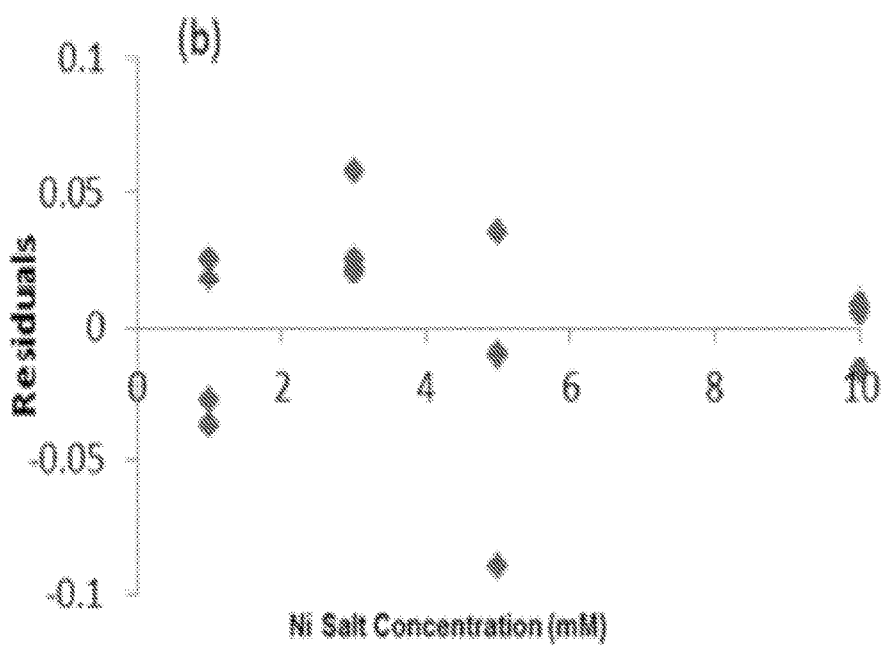
Figure 9A:
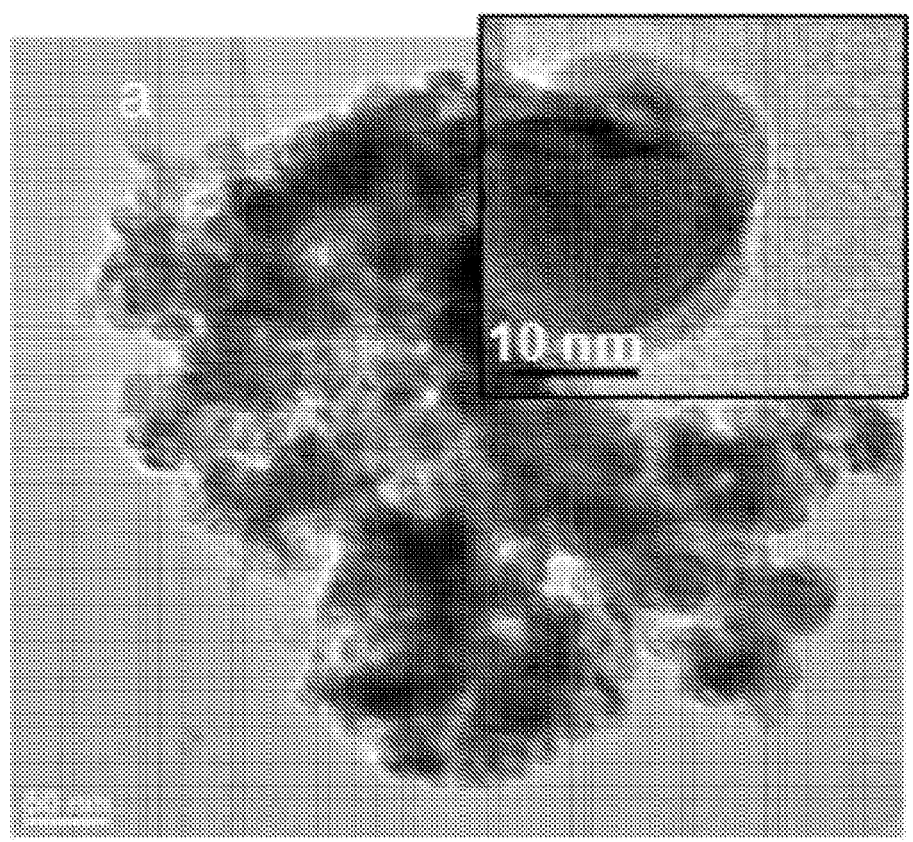
FIGS. 9A-9E include images showing Cu@Ni core-shells obtained after IPL sintering using an initial Ni$^{2+}$ concentration of 1 mM, including an image showing TEM micrographs (FIG. 9A-9B), Cu—K maps (FIG. 9C), Ni—K maps (FIG. 9D), and Cu—K and Ni—K overlaid micrographs (FIG. 9E)
Figure 9B:
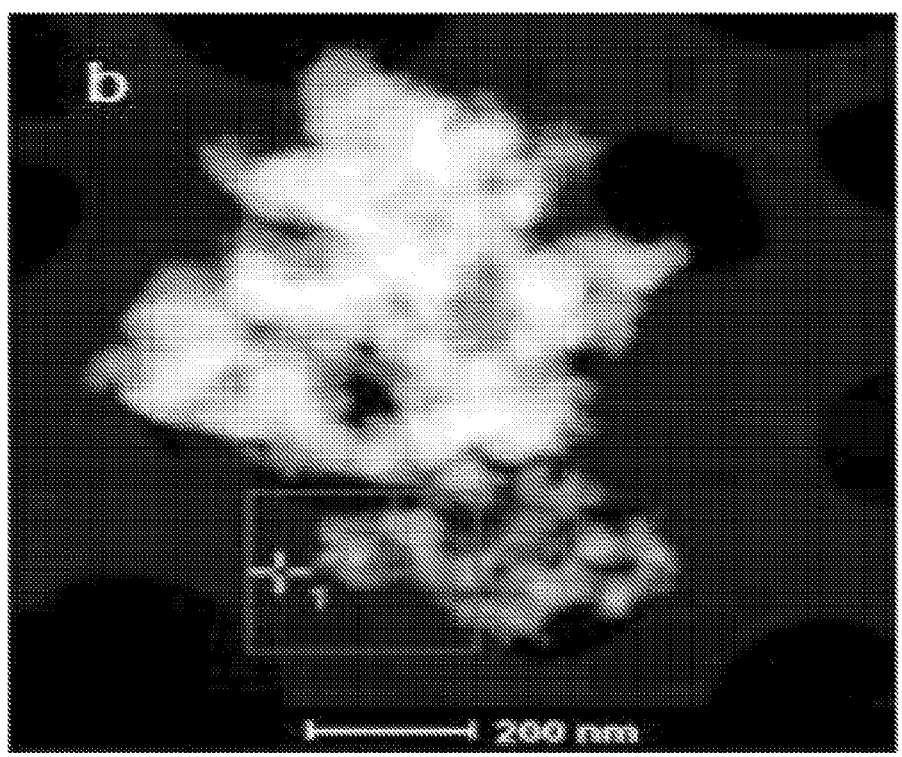
Figure 9C:
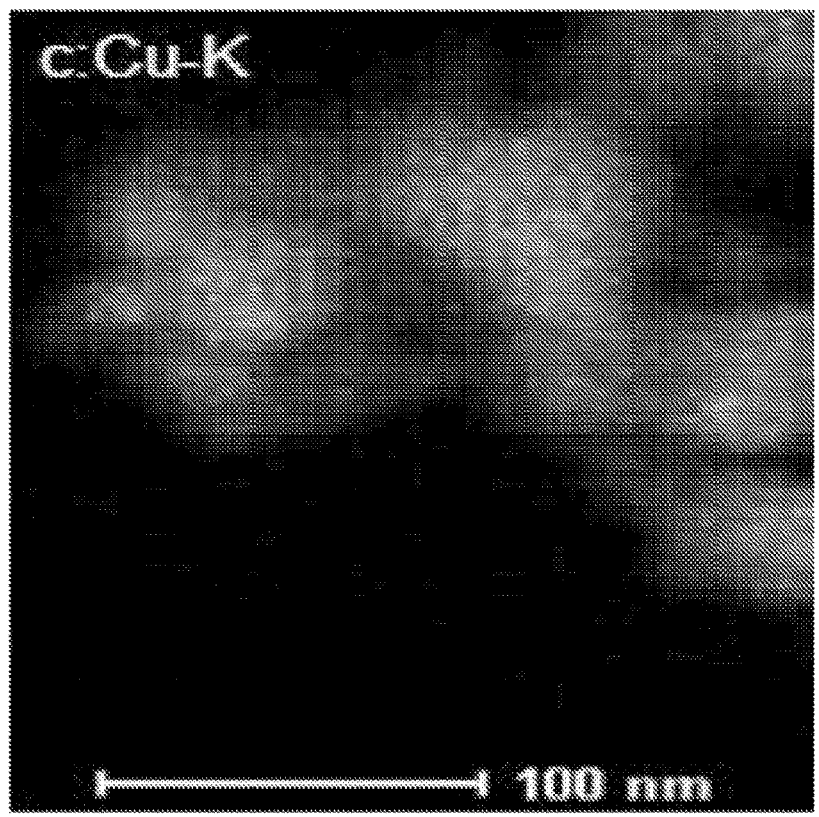
Figure 9D:
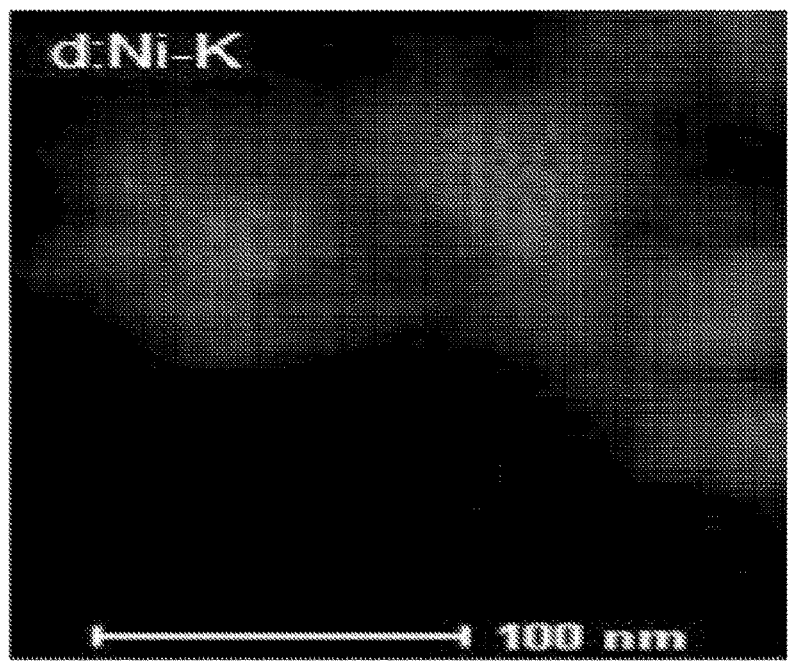
Figure 9E:
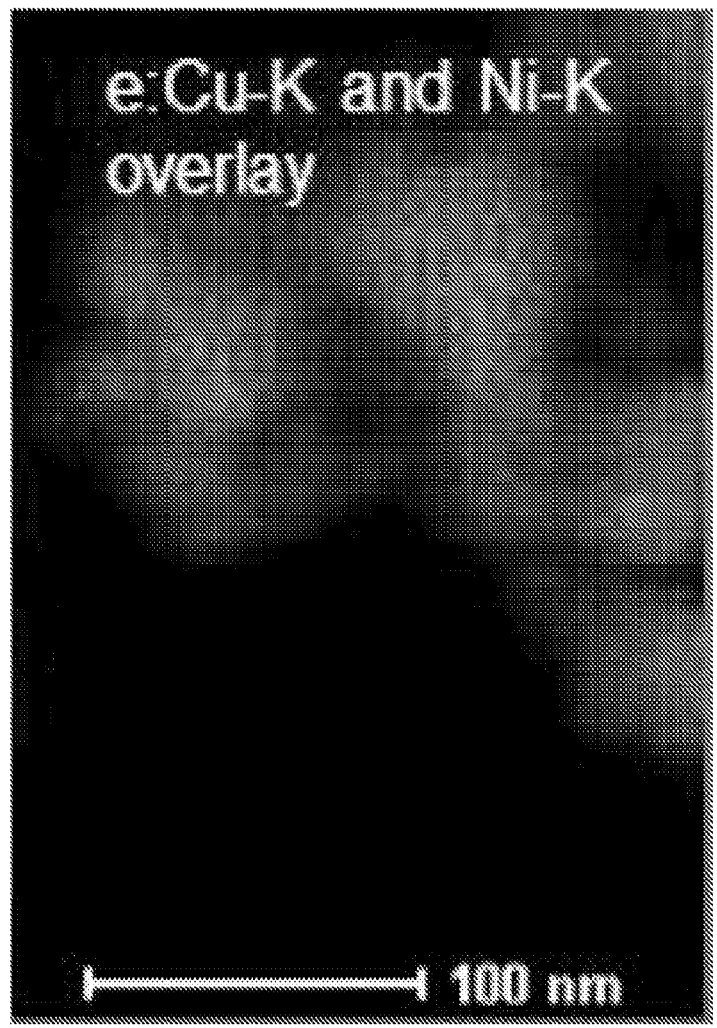
Figure 10A:
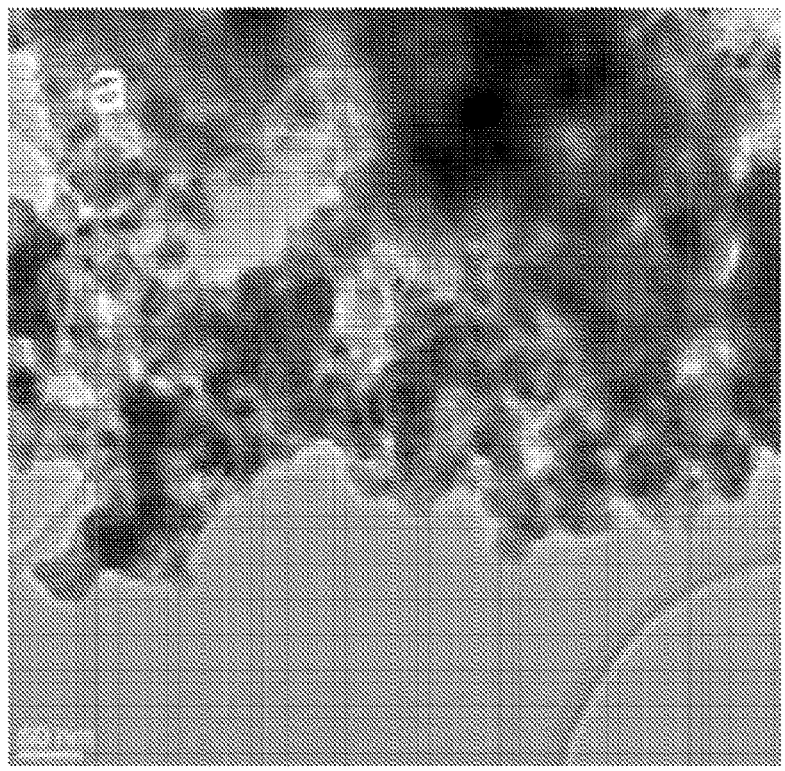
FIGS. 10A-10F include images showing Cu@Ni core-shells obtained after IPL sintering using initial Ni$^{2+}$ with a concentration of 20 mM including an image showing a TEM micrograph (FIG. 10A), a HRTEM micrograph (FIG. 10B), a STEM (FIG. 10C), Cu—K maps (FIG. 10D), Ni—K maps (FIG. 10E), and Cu—K and Ni—K overlaid micrographs (FIG. 10F)
Figure 10B:
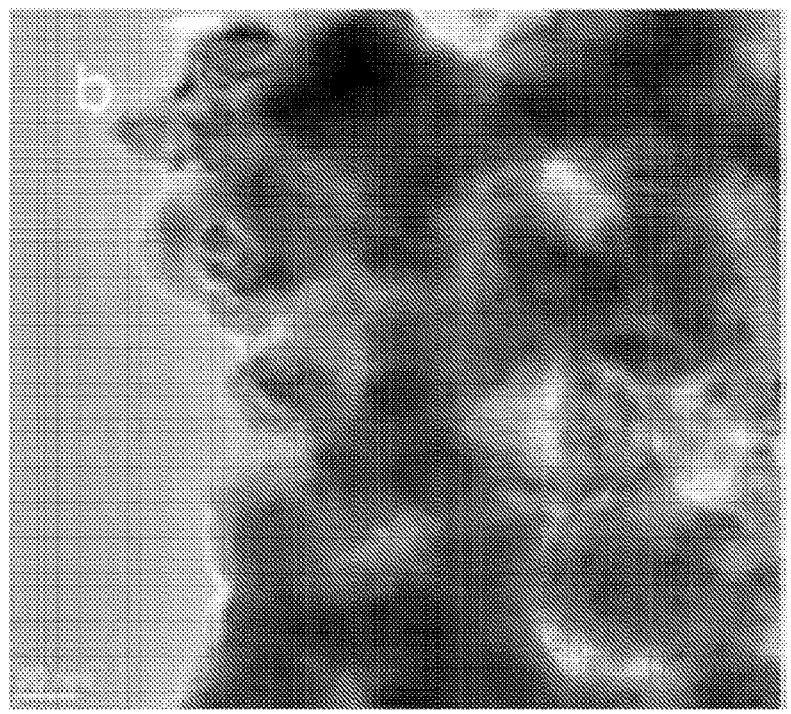
Figure 10C:
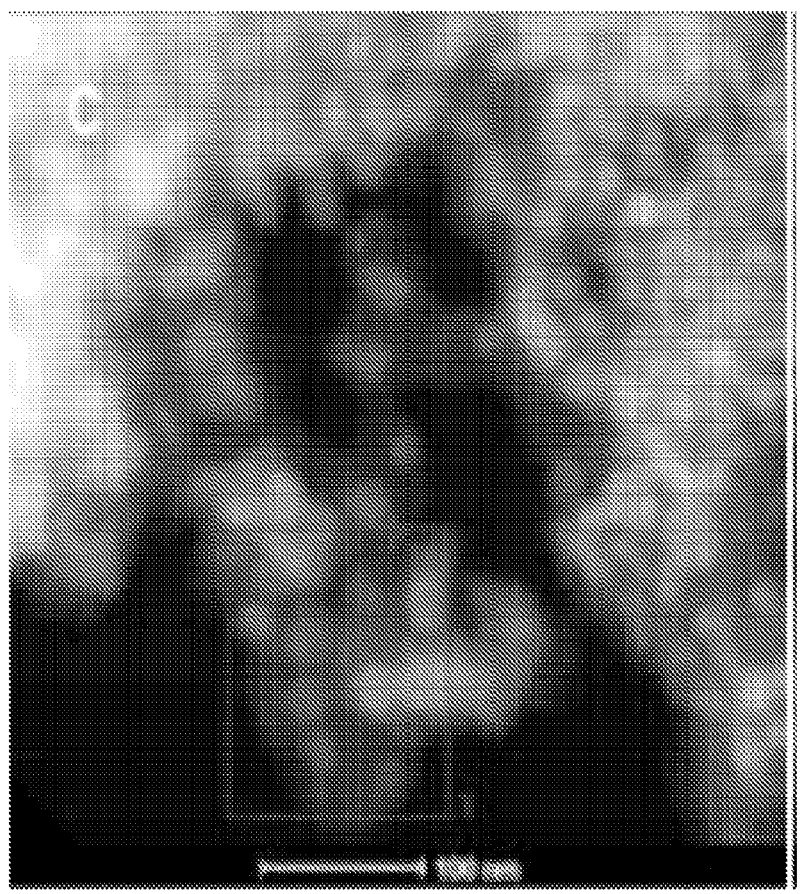
Figure 10D:
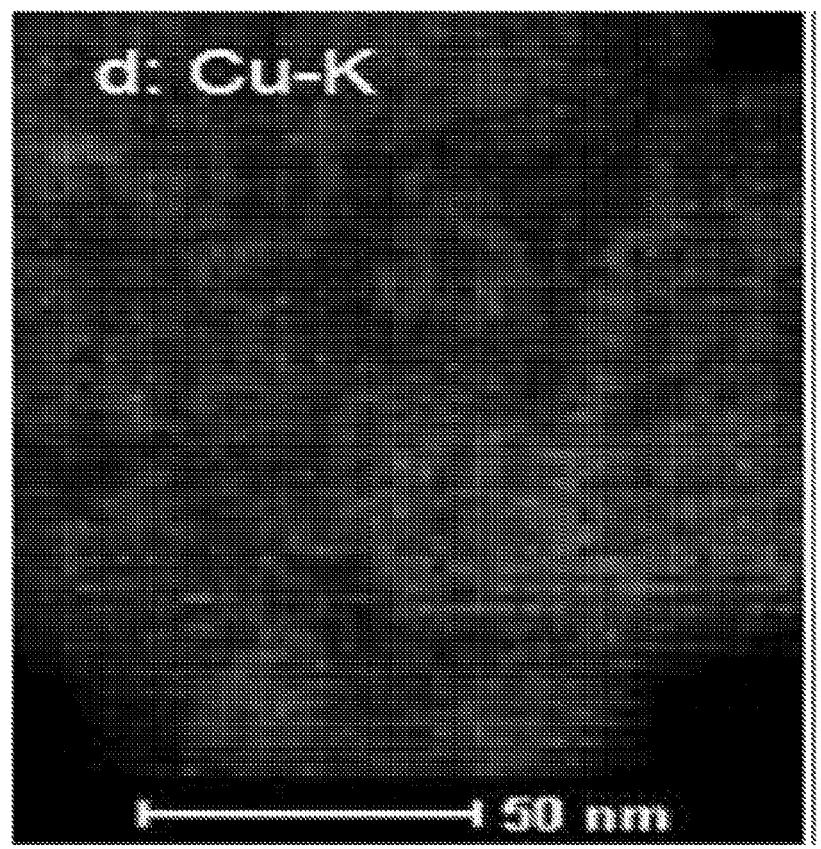
Figure 10E:
Figure 10F:
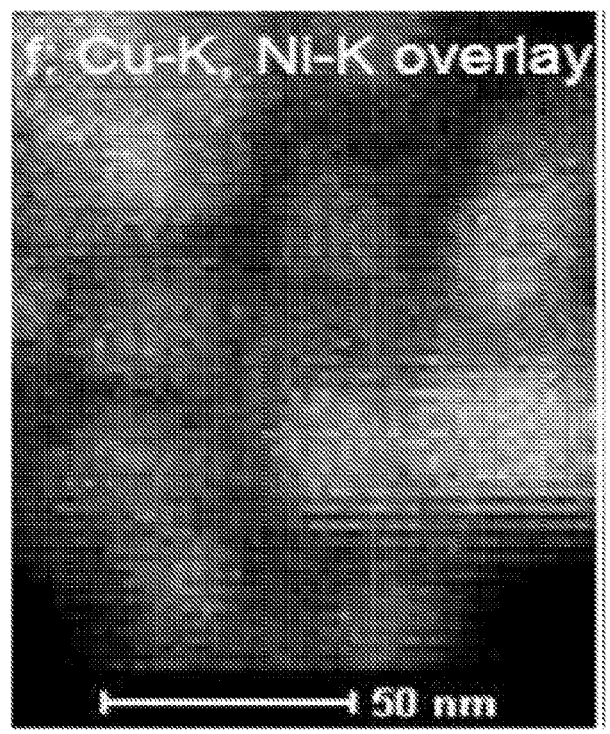

The value of the Cu (111) reflection falls within the lower and upper bounds for the intercept (FIGS. 7A-7C). Additionally the value of zero was also in between the lower and upper bounds for the slope. Therefore, the null hypothesis that the Cu (111) reflection positions for all patterns are the same failed to be rejected. A similar analysis was performed for the full width half maximum (FWHM) for the curves (FIGS. 8A-8C). The FWHM value observed in the Cu films fell within the upper and lower bounds of the 95% confidence interval. Additionally, a slope of zero also fell within the lower and upper bounds for the slope. Therefore, the null hypothesis, that the broadness of the reflections is equal for all concentrations of the Ni salt, also failed to be rejected, which supported the absence of a Cu—Ni alloy. Lastly, both data sets had residuals that did not show a recognizable pattern and were scattered randomly about the y-axis.

Figure 4A:
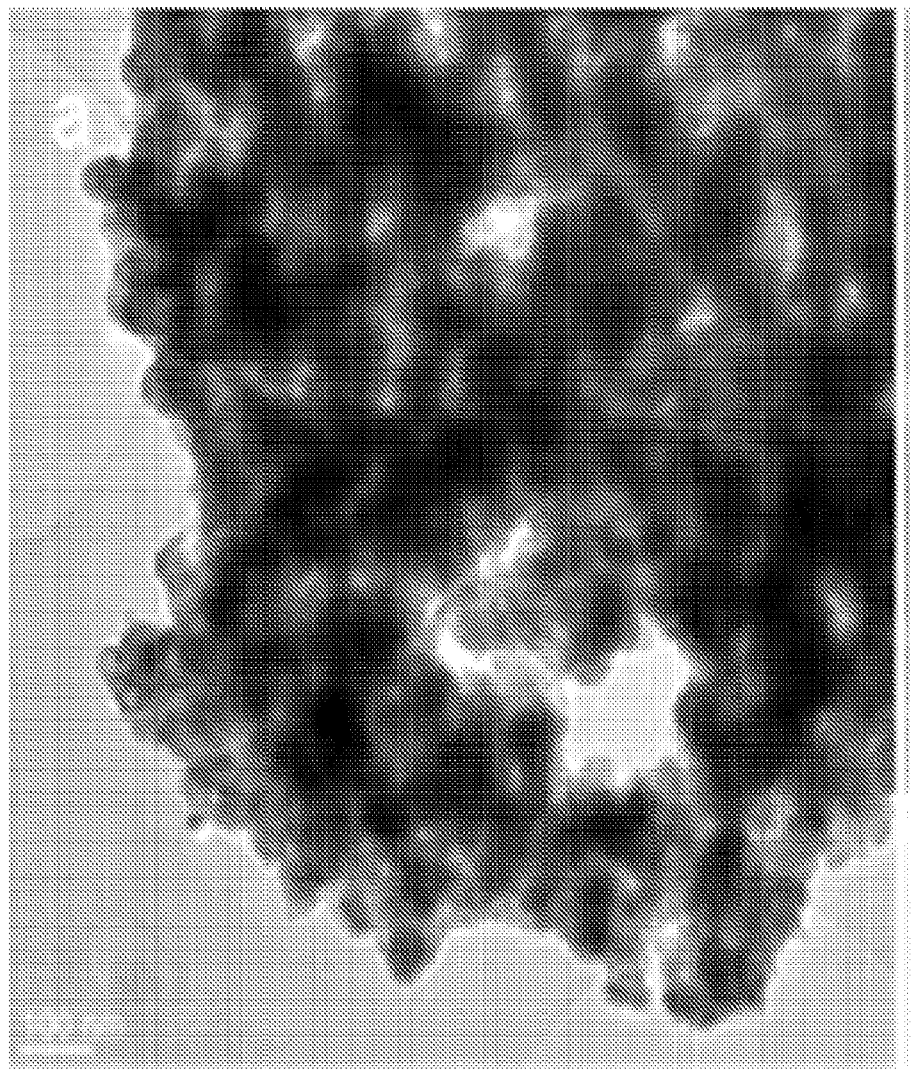
FIGS. 4A-4F are images of Cu@Ni core-shells obtained after IPL sintering using initial $Ni^{2+}$ with concentration of 5 mM, including an image of a TEM micrograph (FIG. 4A), a HRTEM micrograph (FIG. 4B), a STEM (FIG. 4C), Cu—K mapping (FIG. 4D), Ni—K mapping (FIG. 4E), and a Cu—K and Ni—K overlay mapped micrograph (FIG. 4F)
Figure 4B:
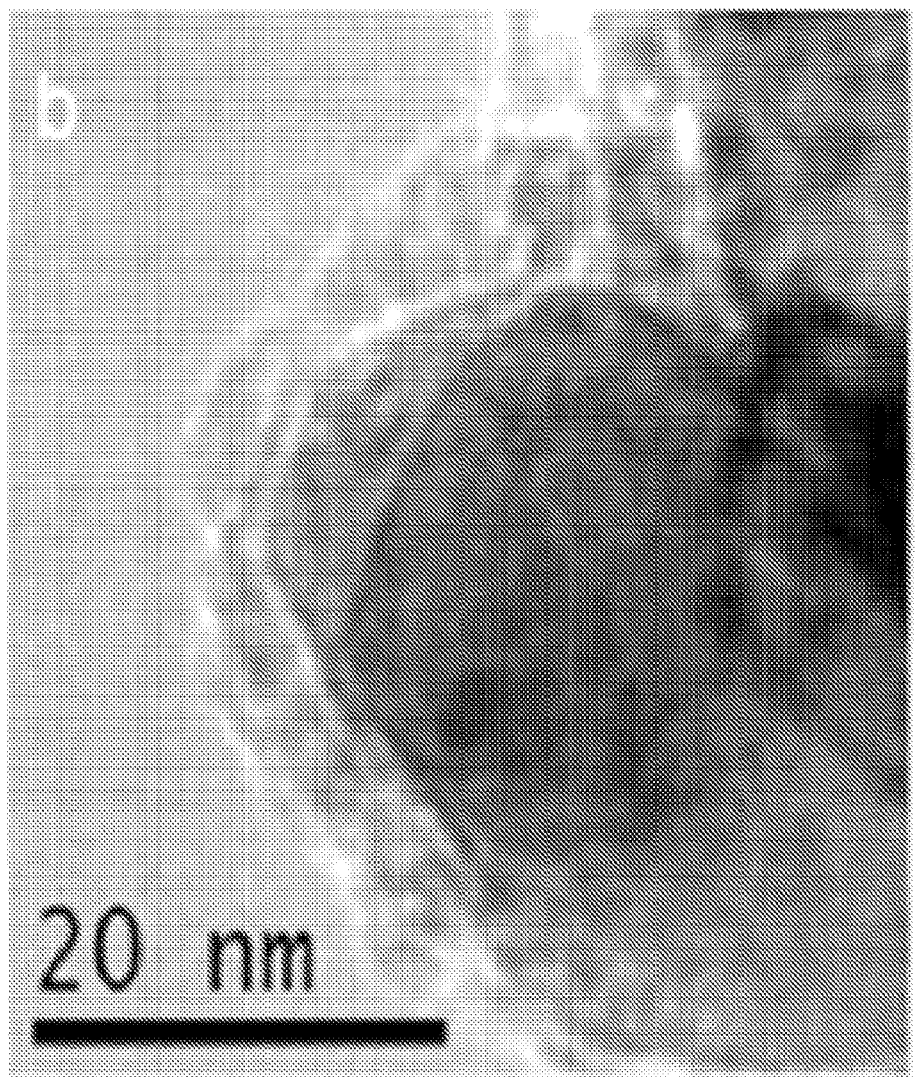
Figure 4C:
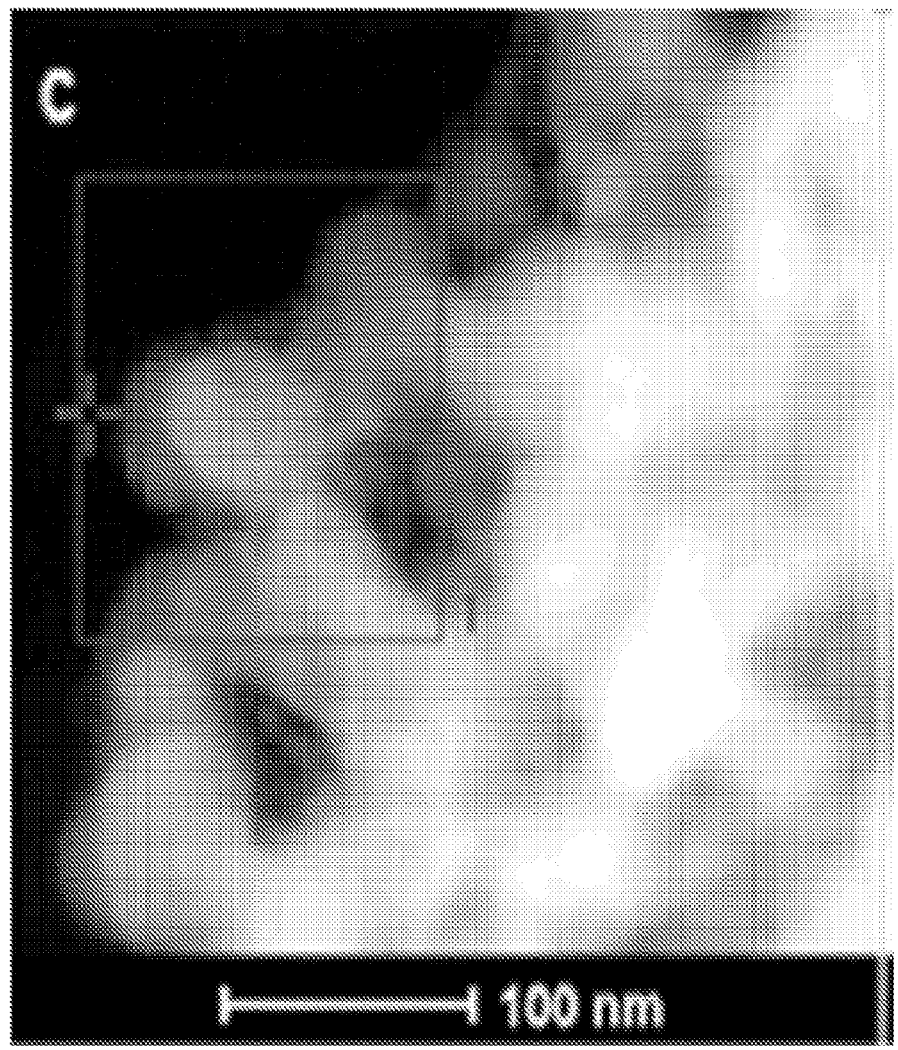
Figure 4D:
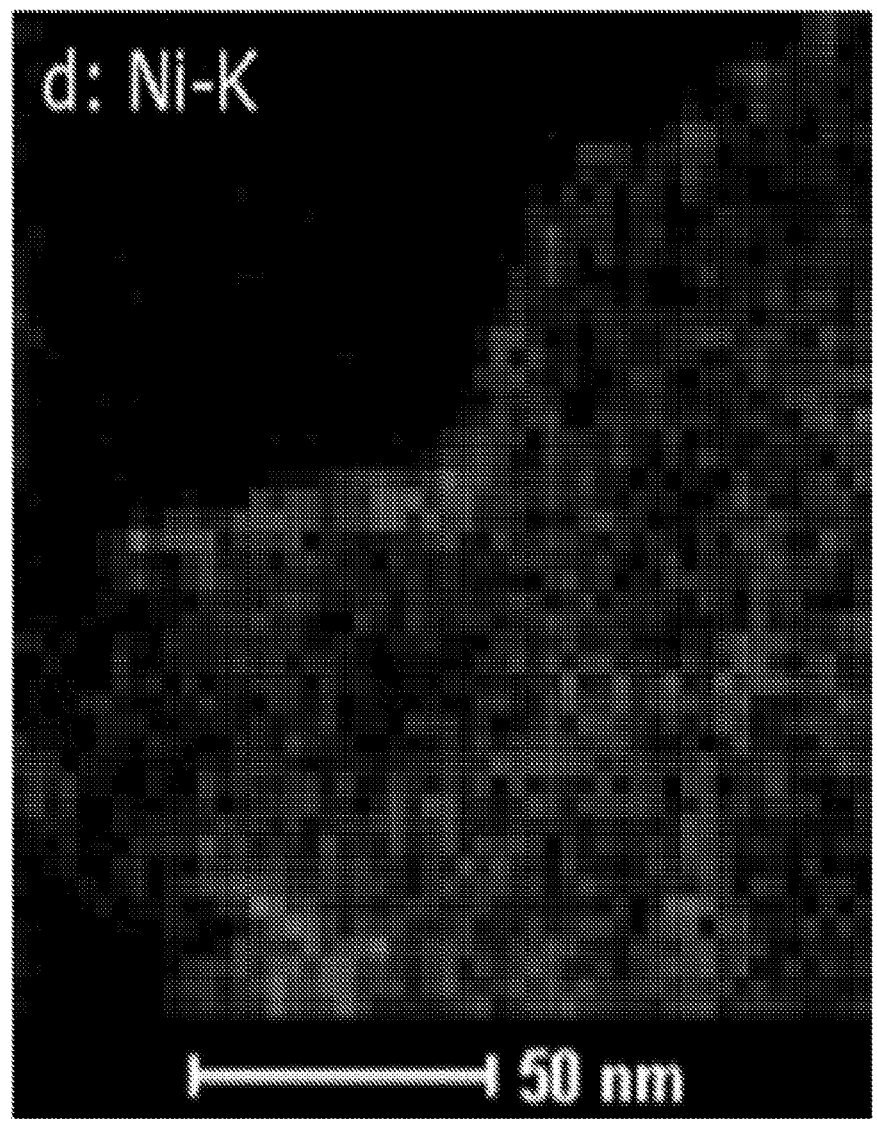
Figure 4E:
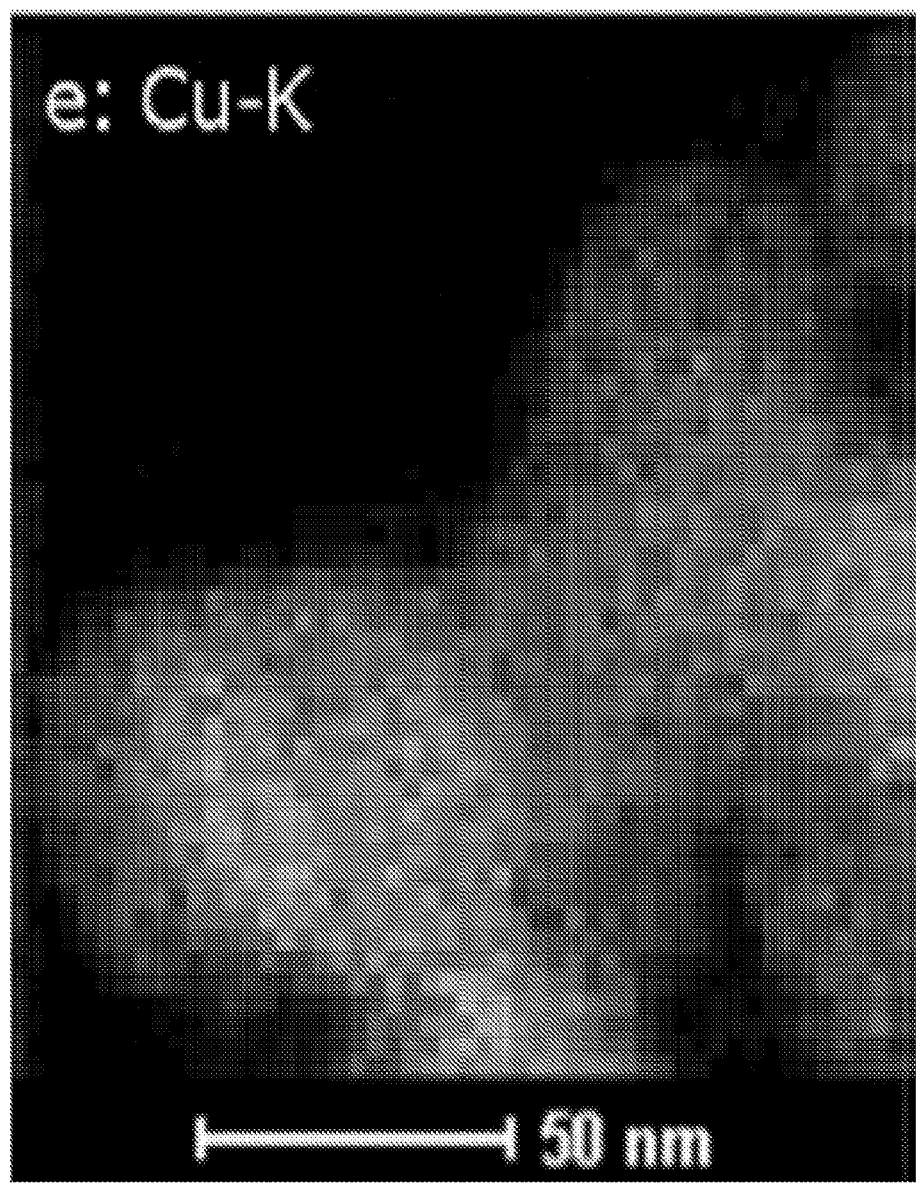
Figure 4F:
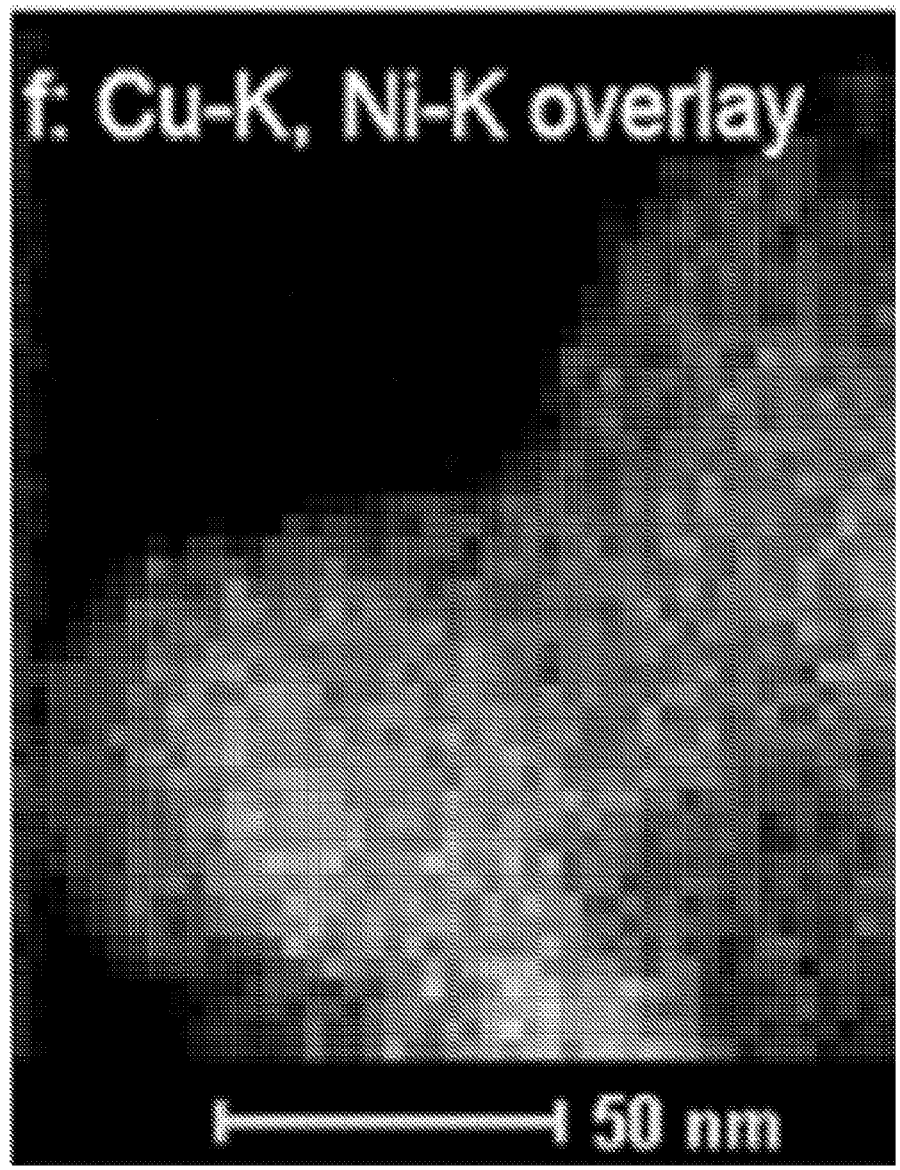

A closer examination of the core-shell structures was done using STEM-EDX to map the distributions of the Cu and Ni metals after the IPL process. The distribution of the metals after the IPL process for the material made using the 5 mM Ni$^{2+}$ ion concentration showed that the Ni encompassed the entirety of the Cu (FIGS. 4D-4E). (STEM-EDX mapping of the 1 mM and 20 mM are shown in the supporting information.) Additionally the Ni has formed a measureable shell (FIG. 4F, overlay) that increases in thickness as the concentration of Ni$^{2+}$ progresses from 1 mM to 20 mM (FIGS. 9-10). The shell of the 1 mM sample was very thin, much thinner than others reported earlier. This confirmed the room temperature synthesis of a Cu@Ni thin film using ambient temperature routes.

Example 3

Stability of the Core-shell on Si

One aim of the presently-disclosed subject matter was to provide an alternative to the silver-based pastes currently used in the mass production of crystalline silicon solar cells. However, the diffusivity of Cu into Si is known to be rapid in comparison to other elements such as silver. Therefore, and without wishing to be bound by any particular theory or mechanism, it was believed that if the Si was left unprotected, Cu could diffuse to the p-n junction and shunt the device; resulting in a drop in cell efficiency. The diffusion of Cu in to Si follows an Arrhenius relationship as a function of temperature. Based on Fick's first and second law the effective diffusivity of Cu in Si is governed by Equation 3.

$$D(cm^2/s) = 4.7 \times 10^3 \exp\left(\frac{-0.43 \text{ eV}}{k_B T}\right) \quad (3)$$

Where $k_B$ is Boltzmann's constant and T is the temperature. In Si, Cu is known to diffuse rapidly through interstitial sites, forming positively charged ions (Cu$^+$) at these sites. Consequently, it acts as a single electron donor in silicon, resulting in charge compensation in p-type Si. Substitutional diffusion of Cu on the other hand has been reported to be a significantly slower process. The solubility of Cu in Si is low and upon slow cooling it is found to precipitate near the surface, while fast cooling leads to the formation of Cu precipitates through the bulk of the material. In addition, the formation of Cu silicide's has been observed at temperatures as low as 200° C., resulting in a change in the material's electrical performance.

FIG. 5 shows the thermoelectric power curves for the Si, Si/Cu and Si/Cu—Ni samples as a function of the temperature. The results were normalized to their thermoelectric power at 300 K, (($S_T-S_{300K}$)/$S_{300K}$). The temperature behavior of each sample was typical for a doped semiconductor. At room temperature, the density of the holes was larger than that of the intrinsic electrons and holes, giving rise to a positive thermo power. As the temperature increased, ionization of the remaining acceptor atoms initially caused an increase in the thermo power due to the promotion of additional holes (the Fermi level moves towards the valence band edge). As the temperature increased further, the density of intrinsic holes and electrons became greater than that of the donor holes (extrinsic) causing the Fermi level to move toward the center of the bandgap. However, the electrons have a higher mobility than the holes in Si, therefore contribution of the intrinsic electrons to the thermo power was greater than the intrinsic holes. Thus, at a certain temperature the thermo power changed sign, indicating that the transport was dominated by the intrinsic conduction of electrons that are thermally excited across the bandgap rather than the donated holes. Cu can also donate charge carriers to the semiconductor; as such the thermoelectric properties of the wafer were changed. Upon cooling, the thermoelectric properties of the bare Si wafer did not change, indicating no physical or chemical changes to the material occurred. The Si/Cu sample on the other hand, demonstrated a large difference in its thermoelectric properties from its initial conditions; with a lower thermo power upon cooling. This indicated that Cu had diffused into the Si and the possible formation of Cu silicide. Comparatively the Si/Cu—Ni shows very little to no change in its thermo power after heating, indicating that the Ni shell was impeding Cu diffusion into the Si.

Discussion of Examples 1-3

In the above-described studies, efforts were undertaken to prevent copper diffusion into silicon by incorporating a nickel shell on to the surface of copper. That process was executed in three stages. In stage one, Cu@Ni core-shell nanostructures were synthesized using a room temperature solution based method and intense pulsed light treatment. The final dispersions could be easily deposited on to a substrate using evaporative solution-phase techniques; in the above case an ultrasonic spray was used to deposit films. During the initial synthesis stage $Cu_2O$ nanoparticles were surrounded with a NiO shell. The subsequent IPL treatment reduced both oxides to their corresponding metal forms in less than 1½ minutes. In addition, the IPL process sintered neighboring particles and lowered the resistivity of the films. During stage two, the thickness of the nickel shell was controlled. The processes were optimized so that the nickel shell uniformly coated the $Cu_2O$ particles, as well as provided a degree of control over the shell thickness. Finally, in stage three, by measuring the thermoelectric properties of silicon before and after being heated with Cu and Cu@Ni inks, it was shown that the nickel shell is able to mitigate the diffusion of Cu into silicon.

Materials and Methods for Examples 4-6

In additional experiments, copper (Cu) and cuprous oxide ($Cu_2O$) nanoparticles were synthesized using a simple chemical reduction method using copper nitrate hemipentahydrate as a precursor, sodium borohydride as a reducing agent, and a capping agent selected from lactic acid and citric acid. XRD and TEM characterization techniques were used to identify the composition, shape and size of the as-synthesized nanoparticles. Highly stable Cu and $Cu_2O$ dispersions in water were produced. Synthesis of the Cu—Ni core-shell nanoparticles was carried out using the synthesized Cu and $Cu_2O$ nanoparticles and nickel nitrate hemipentahydrate for the formation of the nickel shell. As described in further detail below, it was observed that the formation of the nickel shell on the nanoparticles depended on the concentration of nickel precursor and sodium borohydride.

Briefly, in these experiments, three different routes were used to synthesize the Cu and $Cu_2O$ particles with deionized water, copper nitrate hemipentahydrate ($Cu(NO_3)_2 \cdot 2.5H_2O$), lactic acid ($C_3H_6O_3$), citric acid ($C_6H_8O_7$), ammonium hydroxide ($NH_4OH$ —28% in water), sodium borohydride ($NaBH_4$), and methanol.

Route 1: Using Lactic acid as a capping agent. Cu nanoparticles were synthesized by modifying an existing synthesis method developed by Deng, et al. 0.008 mols (1.875 g) of copper nitrate hemipentahydrate was dissolved in 50 ml deionized water. Then, 0.42 mols (31 ml) of lactic acid was added to the solution. Ammonium hydroxide was injected to the above solution under constant stirring with a magnetic stirrer until the pH was raised to 10. In the last step, 30 to 40 ml aqueous solution of sodium borohydride, 0.142 M, was added to the solution slowly using a syringe pump with 0.5 ml/min rate until the color of the reaction mixture change to a deep henna color. Immediately after the color change, the dispersion was centrifuged to collect the nanoparticles. A small amount of deep red copper nanoparticles precipitated at the bottom of the centrifuge tube. Ethanol was used for further cleaning of the particles. The cleaned particles were then re-dispersed in deionized water.

Route 2: Using Citric acid as a capping agent. Cu nanoparticles were synthesized by chemical reduction of copper ions in aqueous solution at room temperature according to a literature method developed by Deng, et al. with some major modifications. In a typical procedure, 0.016 mols (3.718 g) of copper nitrate hemipentahydrate was dissolved in 100 ml deionized water. Ammonium hydroxide was then injected to the solution under constant stirring with a magnetic stirrer until the pH reached approximately 12 to 13. Around 5 ml of ammonium hydroxide was needed to get the pH around 12 to 13. The pH of the solution was measured using disposable pH strips. Citric acid was used as a capping agent. 0.021 moles (4.0 g) citric acid was added to the above solution. Then, 50 ml aqueous solution of sodium borohydride, (0.142 M) was added slowly to the solution. The color of the solution changed from blue to henna color as the sodium borohydride was added. The color of the solution turned to deep henna color after completely adding the 50 ml sodium borohydride aqueous solution. The reaction mixture was stirred for between 45 min to 1.5 hours. After the particles were precipitated down, the upper portion of the solution was discarded. The final solution was centrifuged for 10 min at 10000 rpm and the supernatant solution was carefully decanted to separate the nanoparticles. A small amount of deep red copper nanoparticles precipitated at the bottom of the centrifuge tube. For cleaning purposes, methanol was added to the separated particles and sonicated for a couple of minutes, then centrifuged to remove any unreacted reactants and reaction byproducts. This process was repeated until the methanol appeared clear. The cleaned particles were re-dispersed in deionized water.

Route 3: Using high concentrations of the Cu precursor with Citric acid as the capping agent. The scaled up synthesis was carried out by increasing all the chemicals except for the solvent. 0.1 moles of copper nitrate hemipentahydrate was dissolved in 100 ml deionized water. Ammonium hydroxide was added to the reaction mixture until the pH reached to 12 to 13. All other steps were the same as the synthesis method mentioned above for the citric acid capping agent. Briefly, 0.08 mols (18.76 g) of copper nitrate hemipentahydrate was dissolved in 100 ml deionized water. Ammonium hydroxide was then injected into the solution under constant stirring with a magnetic stirrer until the pH reached approximately 12 to 13. The pH of the solution was measured using disposable pH strips. Citric acid was used as a capping agent. 0.105 moles (20.0 g) citric acid was added to the above solution. Then, 250 ml aqueous solution of sodium borohydride, (0.142 M) was added slowly to the solution. The color of the solution changed from blue to henna color upon starting to add sodium borohydride. The color of the solution turned to deep henna color after completely adding the 50 ml sodium borohydride aqueous solution. The reaction mixture was stirred for approximately 1.5 hours. Methanol or acetone was added to the solution to precipitate the particles. After the particles were precipitated, the upper portion of the solution was discarded. The final solution was centrifuged for 10 min at 10000 rpm and the supernatant solution was carefully decanted to separate the nanoparticles. For cleaning purposes, methanol was added to the separated particles and sonicated for a couple of minutes then centrifuged to remove any unreacted reactants and reaction byproducts. This process was repeated until the methanol appeared clear. The cleaned particles were re-dispersed in deionized water.

Example 4

Cu Nanoparticle Synthesis Using Lactic Acid as a Capping Agent (Route 1)

Figure 11:
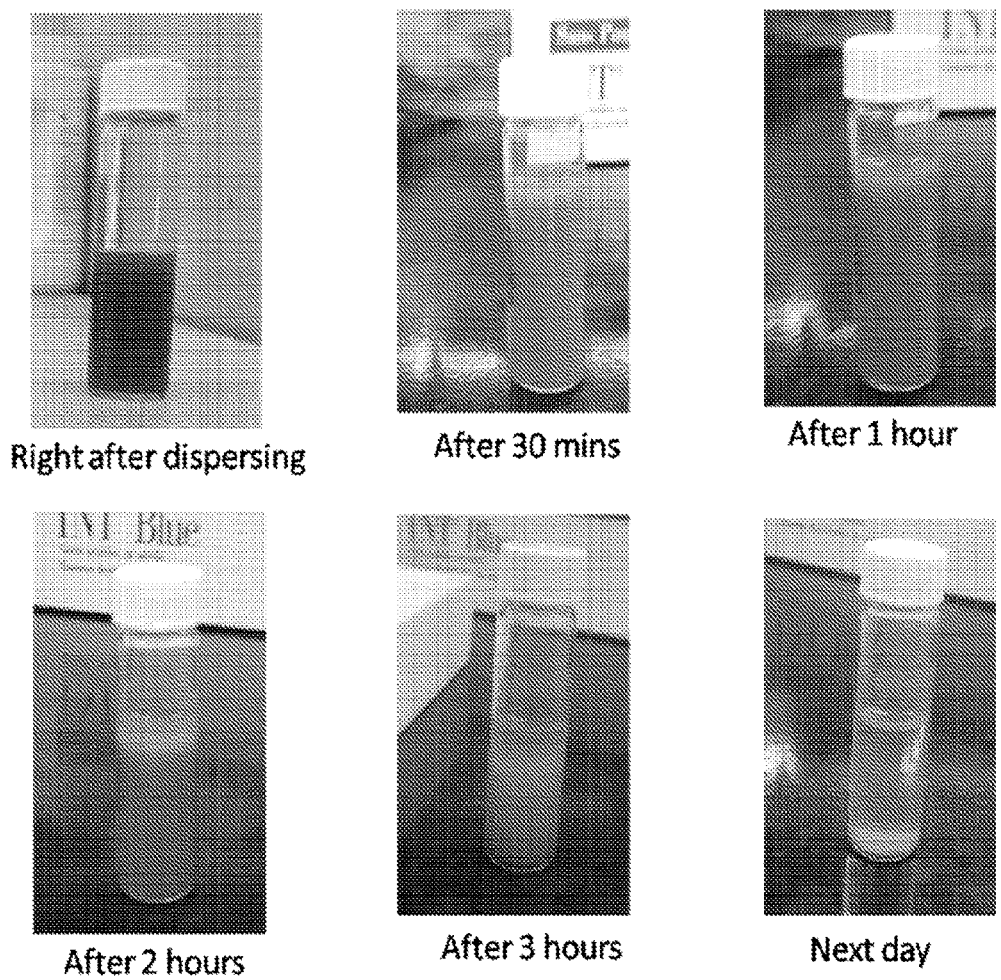
FIG. 11 includes images of lactic acid capped nanoparticle dispersions.

Initially, nanoparticles were synthesized by the reduction of copper nitrate hemipentahydrate with sodium borohydride and using lactic acid as a capping agent. In this reaction, a high concentration of ammonium hydroxide was required to raise the pH to 10. Slow addition of the reducing agent to the reaction mixture was important to obtain particles in the nano size regime. XRD of the centrifuged nanoparticles showed a mixture of $Cu_2O$ and Cu nanoparticles. The cleaned nanoparticles were re-dispersed in water and the stability of those particles was studied by visual observation. Color of the solution changed from red to yellow color right after dispersing the cleaned particles in water as shown in the FIG. 11. The color change was believed to be due to the oxidation of the particles.

Example 5

Cu Nanoparticle Synthesis using Citric Acid as a Capping Agent (Route 2)

Figure 12:
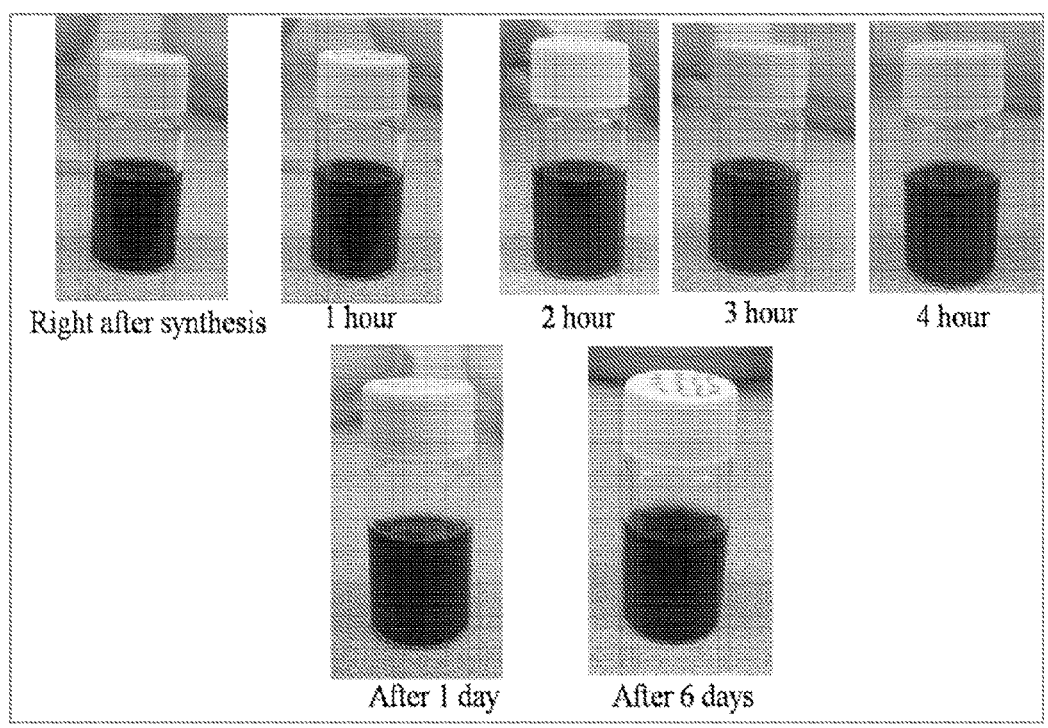
FIG. 12 includes images showing stable Cu nanoparticles dispersions synthesized using citric acid as the capping agent.

In this synthesis, Cu nanoparticles were synthesized by the reduction of copper nitrate hemipentahydrate with sodium borohydride using citric acid as capping agent. In this reaction, the pH of the reaction mixture played a role in the synthesis. Cu reduction in aqueous media depended on the pH of the reaction mixture. A pH greater than 7 was required to avoid the rapid release of hydrogen bubbles, which produced a large amount of Cu nuclei. A large amount of nuclei will aggregate into large agglomerates. However, high concentrations of ammonium hydroxide can cause the dissolution of the Cu nanoparticles. The cleaned Cu nanoparticles were deep red in color. From the literature, the deep red color could be attributed to pure copper nanoparticles. The cleaned nanoparticles were re-dispersed in water and sonicated for 5 min to enhance the dispersion of the particles. Stability of these particles was then studied by visual observation. The cleaned particle dispersions were deep red wine in color. Color of the solution didn't change over time. Particles were also stable and there was no apparent sedimentation of the particles over several days of observation. FIG. 12 shows that the particles synthesized using this method were chemically stable and were highly dispersible in aqueous medium.

Figure 13:
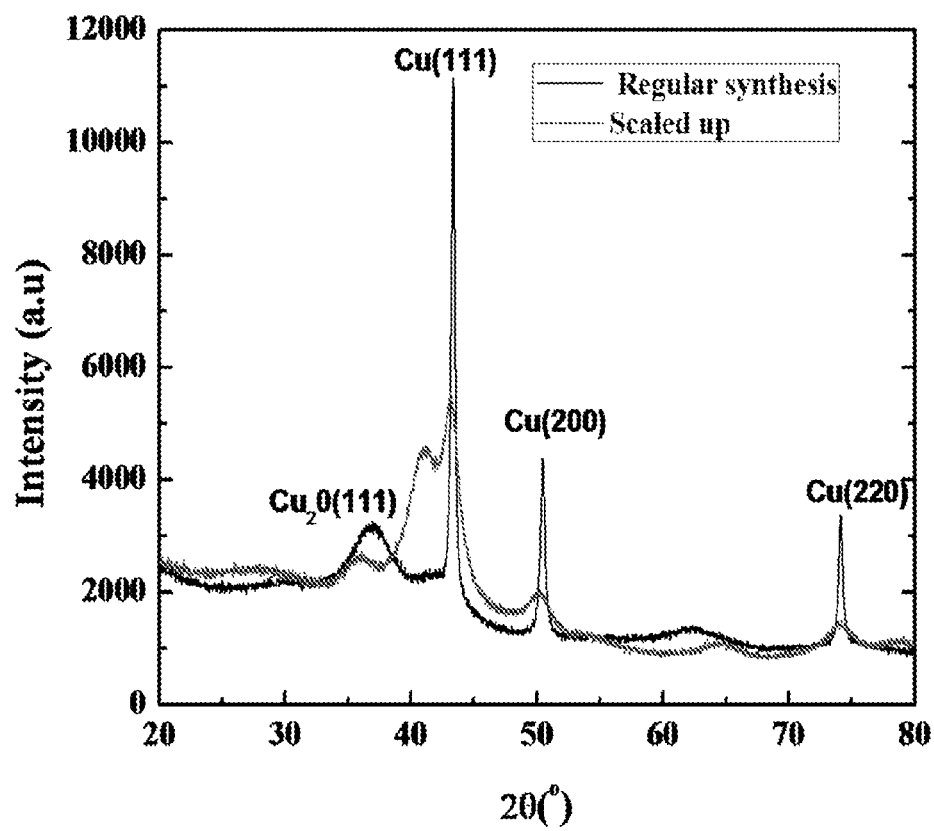
FIG. 13 is a graph showing XRD patterns of as cleaned nanoparticles capped with citric acid.
Figure 14:
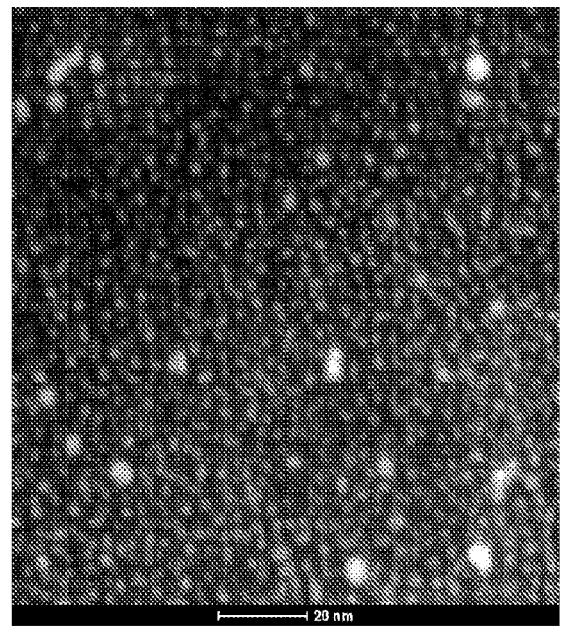
FIG. 14 is a TEM micrograph of the Cu nanoparticles synthesized with citric acid as the capping agent.

The XRD patterns of the synthesized nanoparticles using citric acid are shown in FIG. 13. The as-synthesized particles were a mixture of face centered cubic (fcc) Cu (JCPDS 04-836) and cubic $Cu_2O$ (JCPDS 05-0667). FIG. 14 shows the TEM micrograph of the cleaned nanoparticles synthesized using citric acid as a capping agent. The size of these particle were in the 1 to 5 nm range.

Example 6

Cu Nanoparticle Synthesis using High Concentrations of the Cu Precursor with Citric Acid as a Capping Agent (Route 3)

In this reaction, the concentrations of the chemicals used in Route 2 were scaled up. This resulted in the synthesis of a black precipitate. XRD of the nanoparticles showed a mixture of face centered cubic (fcc) Cu (JCPDS 04-836) and cubic $Cu_2O$ (JCPDS 05-0667).

Materials and Methods for Examples 7-8

To further assess the methodology described herein, nickel (Ni) shells were grown on the Cu and $Cu_2O$ nanoparticles that were grown via Routes 1 and 2 described above and using copper nanoparticles, deionized water, acetone, nickel nitrate hexahydrate $(Ni(NO_3)_2*6H_2O)$, sodium borohydride $(NaBH_4)$, and methanol. In these further experiments, two additional and different routes were used, with minor modifications being made to one of the routes.

Route 4: Ni shell grown in a acetone based solution. Cleaned copper nanoparticles were dispersed in acetone. 50 ml of aqueous 0.05 M ($2.5 \times 10^{-3}$ mols) nickel nitrate hexahydrate was added to copper nanoparticles dispersed in acetone. Subsequently, 5 0 ml aqueous 1.25 M ($6.25 \times 10^{-2}$ mols) solution of sodium borohydride was added to the solution using a syringe pump. The solution was probe sonicated for an hour. Particles were observed to precipitate during the sonication process. After the sonication process, particles were separated from the solution and re-dispersed in water.

Route 5: Ni shell grown in a water based solution. Cleaned copper nanoparticles were dispersed in 100 ml of water, and a solution of aqueous nickel hexahydrate was added to the dispersion. An aqueous solution of sodium borohydride was subsequently added via syringe pump. The solution was then probe sonicated for an hour. After sonication, particles were separated from the solution and re-dispersed in water. The concentration of the aqueous nickel nitrate hexahydrate was varied during the reactions. The concentrations of sodium borohydride used in the reaction was also varied from a 4:1 to 1:1 molar ratio with the nickel nitrate used in solution. Concentrations for two of the reactions are given below;

Route 5a. Approximately 0.5 g of copper nanoparticles were dispersed in 100 ml of water. 37.5 ml of 0.01 M ($3.75 \times 10^{-4}$ mols) aqueous nickel nitrate hexahydrate (0.01M) was added to the dispersion. 25 ml of 0.06 M ($1.45 \times 10^{-3}$ mols) solution of sodium borohydride was added to the dispersion. The dispersion was deep red in color after the reaction.

Route 5b. Approximately 0.7 g of copper nanoparticles was dispersed in 200 ml of water. The Cu particles were freshly prepared due to the difficulty of re-dispersing the dried particles in water. 50 mL of 0.05 M ($2.5 \times 10^{-3}$ mols) aqueous nickel nitrate hexahydrate was then added to the dispersion. Subsequently, 25 ml of 0.10 M ($2.5 \times 10^{-3}$ mols) solution of sodium borohydride water was added of the solution. The particles were observed to sediment after the completion of reaction. However, these particles could subsequently be re-dispersed in water. The re-dispersed particles were slightly black in color.

Example 7

Ni Shell Grown in a Acetone Based Solution

Figures 15A, 15B:
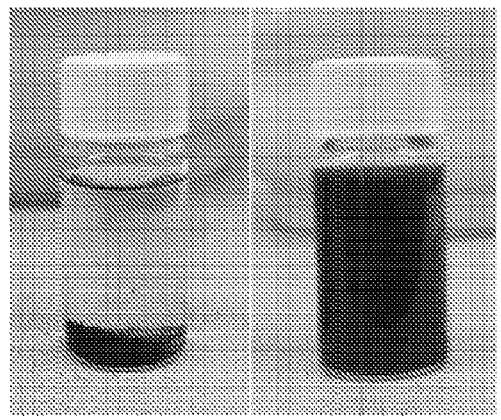
FIGS. 15A-15B include images of Cu—Ni particles synthesized in acetone, including an image so the particles in acetone (FIG. 15A) and an image of the particles re-dispersed in water (FIG. 15B)

When acetone was used as the solvent, particles precipitated during the reaction process as shown in FIG. 15A. Particles were cleaned and re-dispersed in the water after the reaction. These cleaned particles were well dispersed in the water (FIG. 15B).

Figure 16:
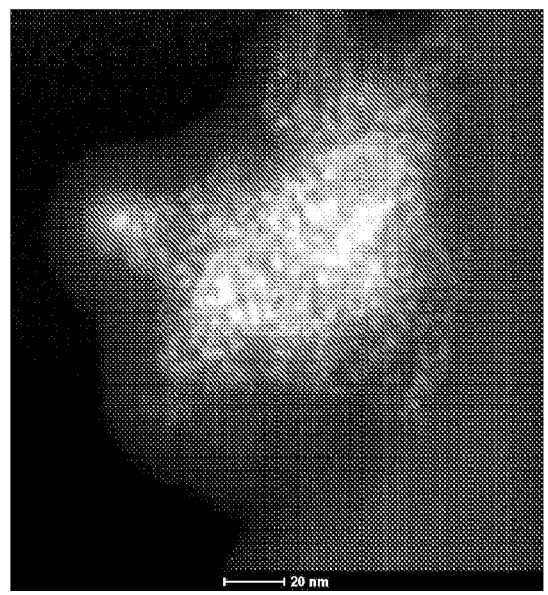
FIG. 16 includes an image of a TEM micrograph of Cu—Ni particles synthesized in acetone.
Figure 17:
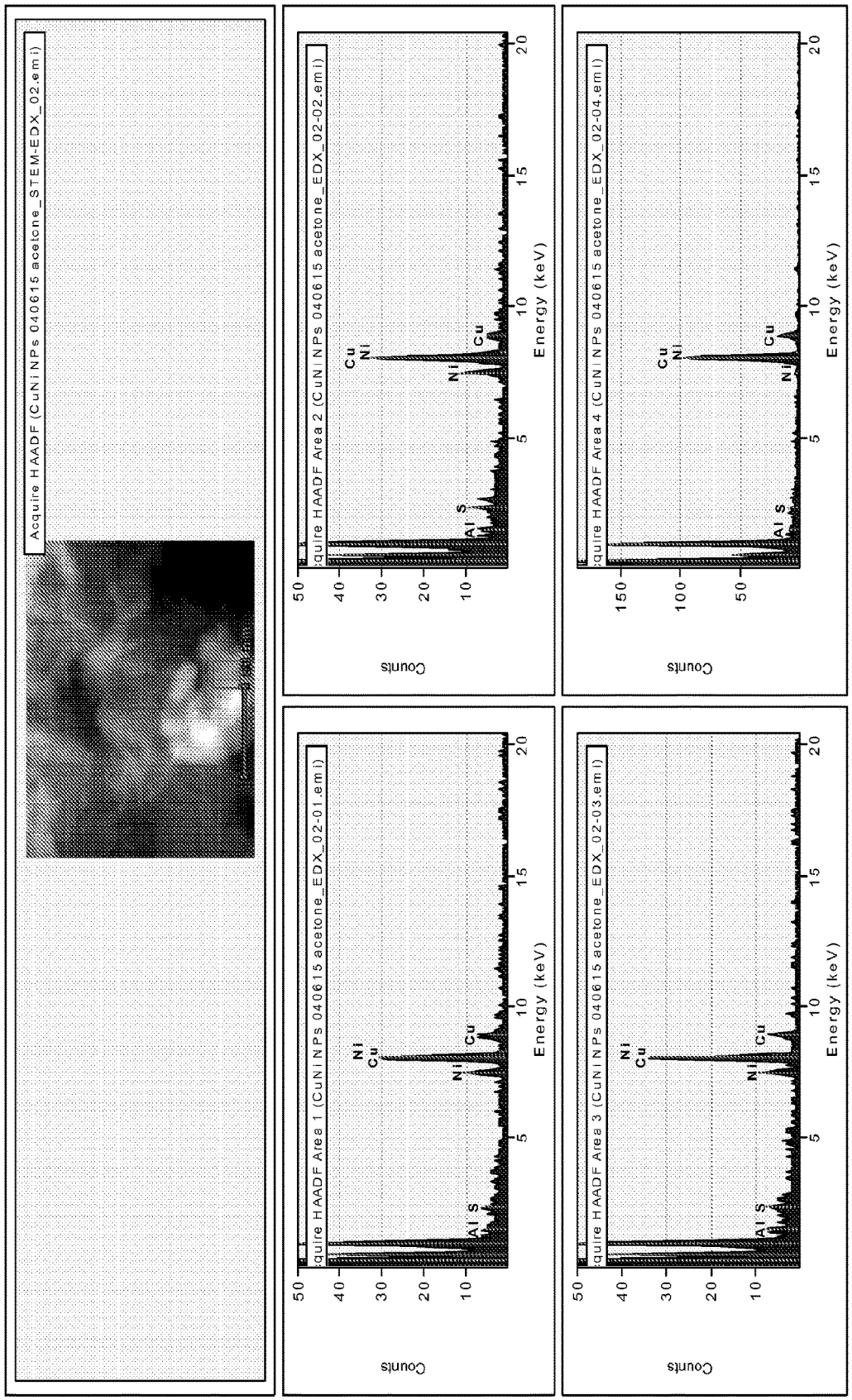
FIG. 17 includes graphs showing EDX spectra of Cu—Ni particles synthesized in acetone.

To understand the Ni shell formation on the copper nanoparticles, TEM analysis of the Cu—Ni structures was carried out (FIG. 16). EDX compositional analysis revealed the existence of nickel in the synthesized core-shell nanoparticles (FIG. 17). However, in this case, there was too much contamination to conduct mapping as evident from the TEM micrographs and EDX spectra.

Example 8

Ni Shell Grown in a Water Based Solution

Figure 18:
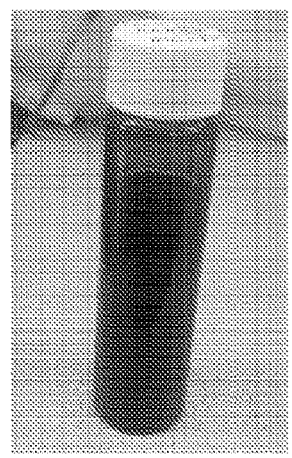
FIG. 18 is an image of Cu—Ni particles synthesized in water and re-dispersed in water.

In order to avoid the particle precipitation during reaction, acetone was replaced with water solvent. Cu—Ni nanoparticles grown via Route 5b describe above were black in color and after being re-dispersed in water, were stable for a long period of time (FIG. 18).

Figure 19:
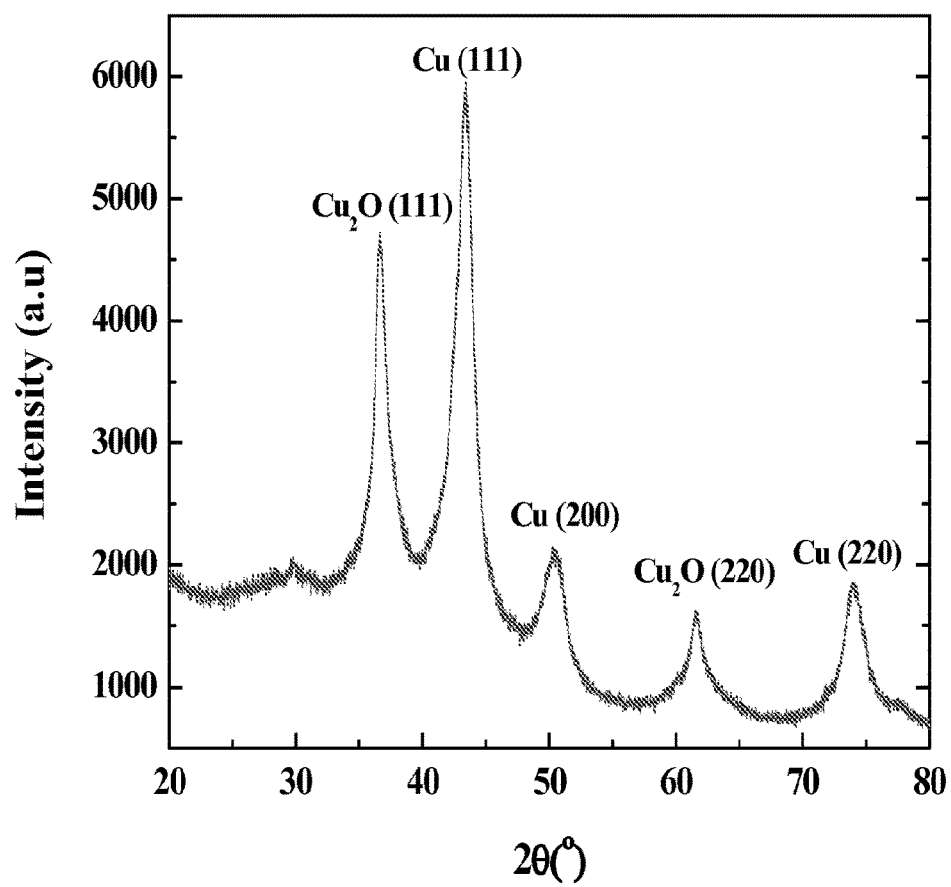
FIG. 19 is a graph showing XRD pattern of Cu—Ni nanoparticles synthesized in water.
Figure 20:
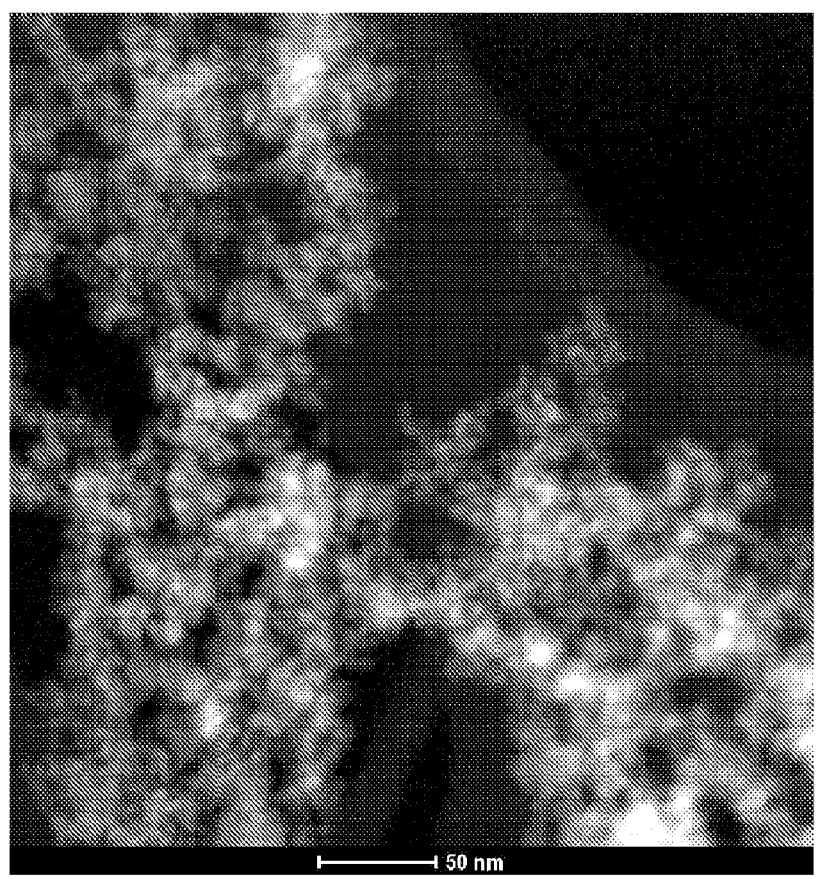
FIG. 20 is an image of a TEM micrograph of Cu—Ni particles synthesized in water.
Figure 21:
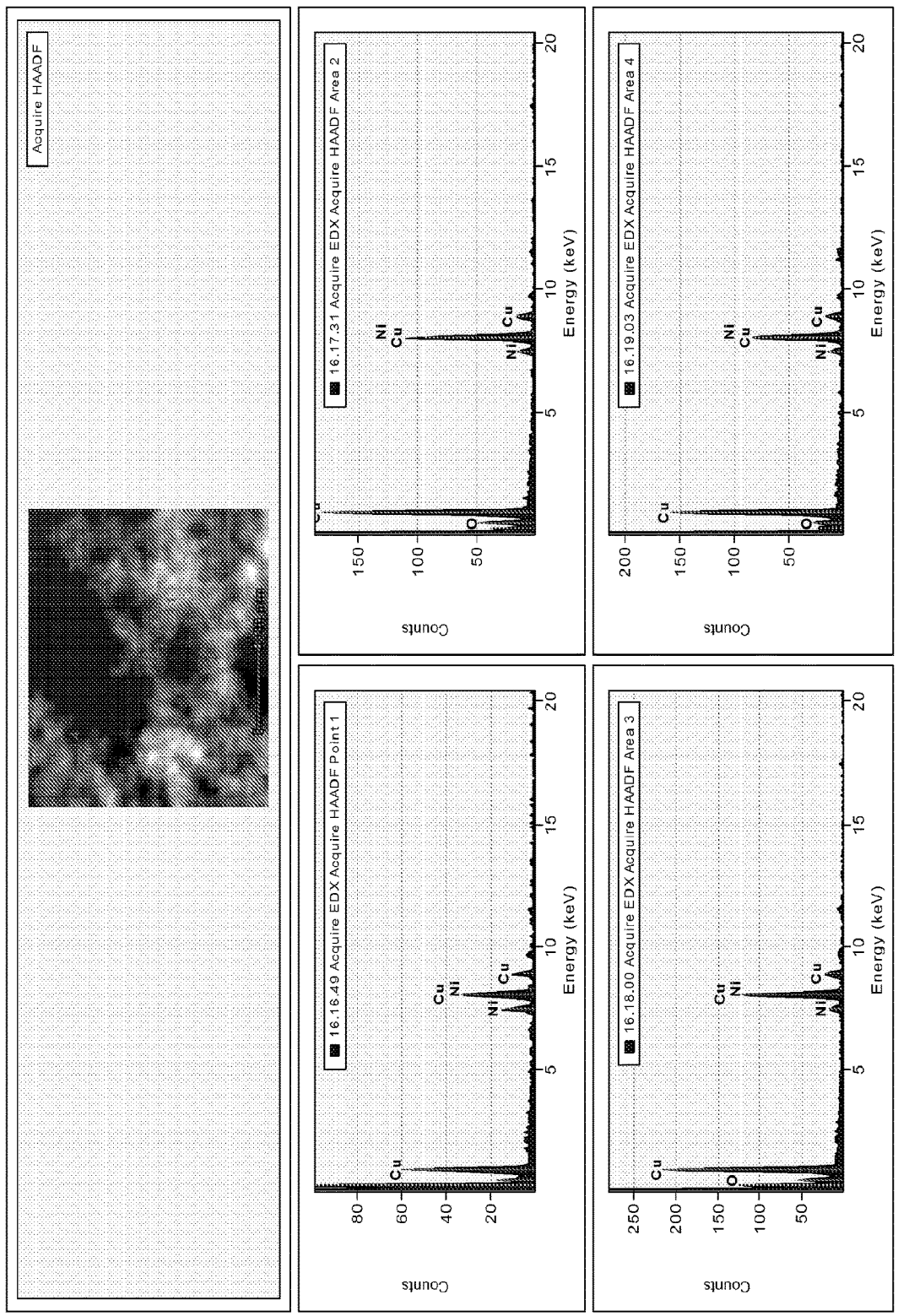
FIG. 21 includes graphs showing EDX spectra of Cu—Ni particles synthesized in water.
Figure 22:
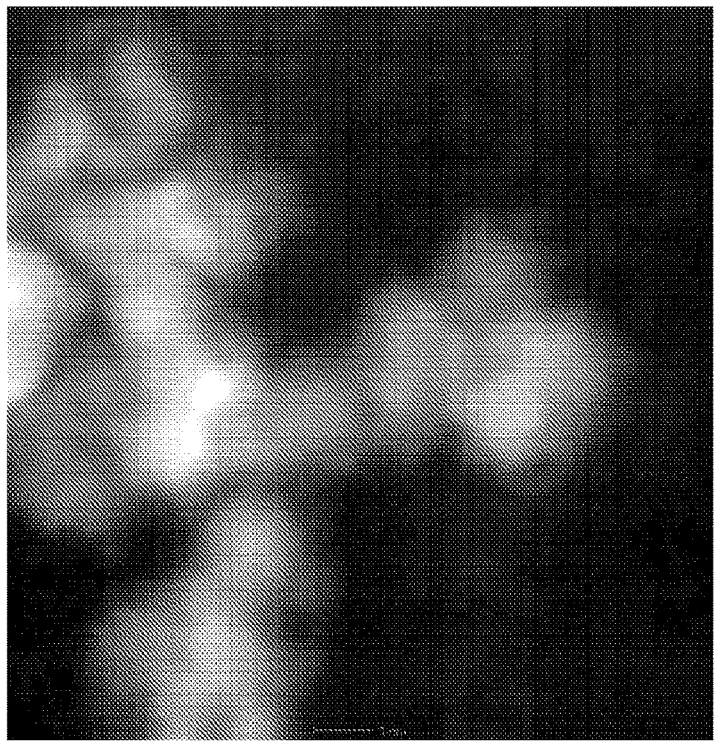
FIGS. 22A-22D include TEM micrographs of Cu—Ni nanoparticles including a higher magnification micrograph showing nickel layer as cloudiness (FIG. 22A), a micrograph showing the location of mapping (FIG. 22B), Ni—K mapping (FIG. 22C), and Cu—K mapping (FIG. 22D)
Figure 22:
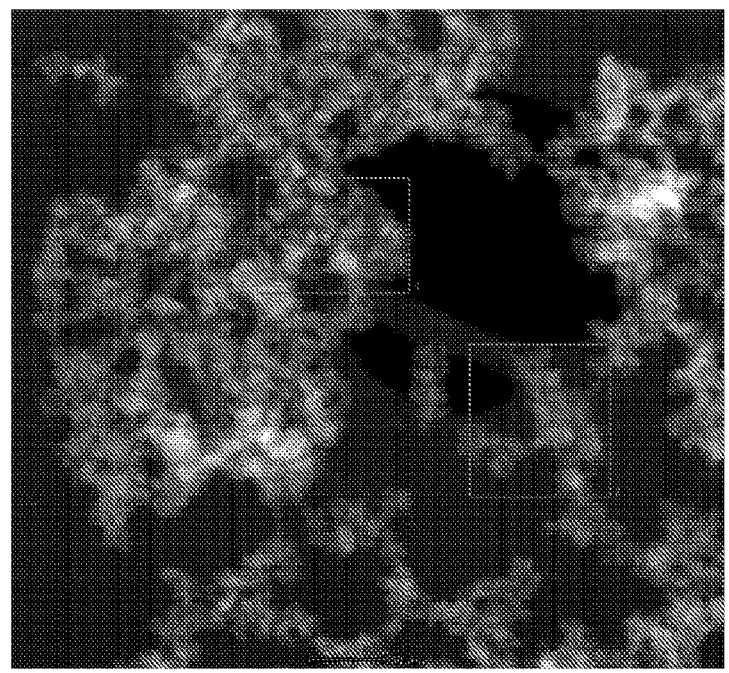
Figure 22C:
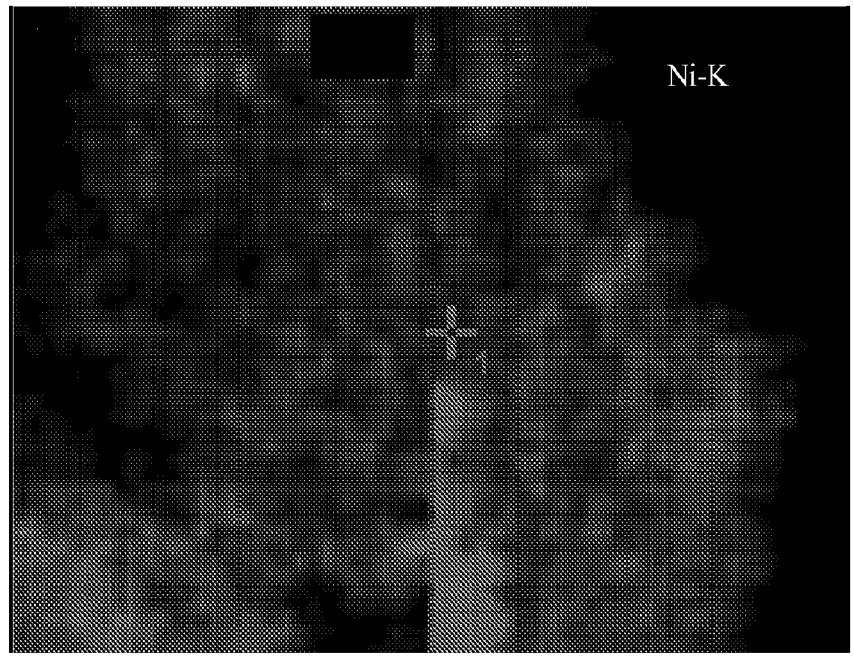
Figure 22D:
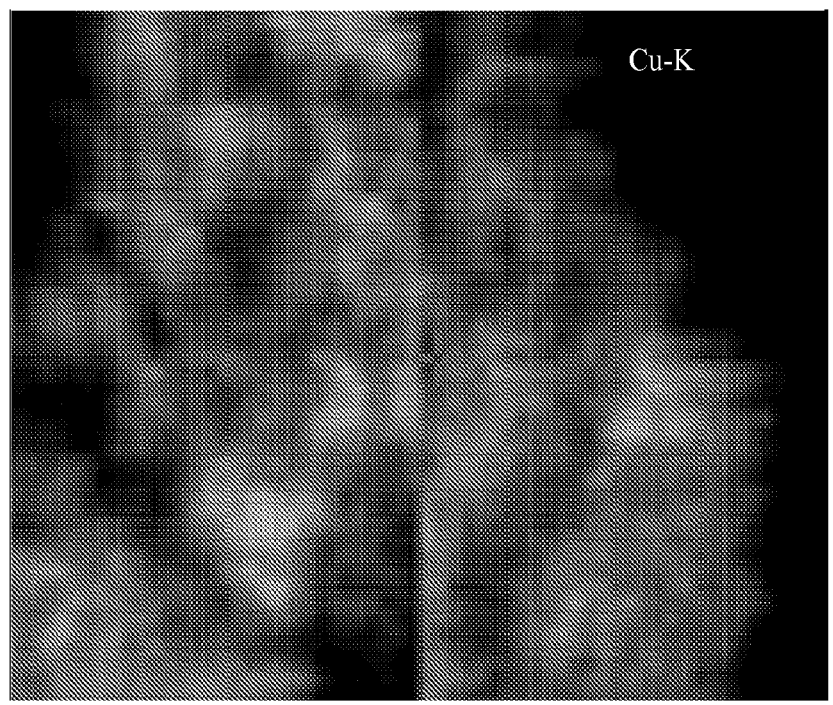
Figure 23A:
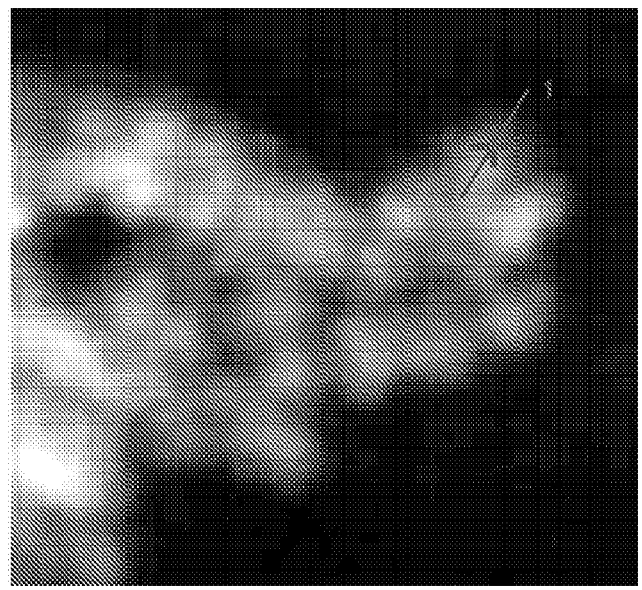
FIGS. 23A-23C include images and graphs showing line mapping of Cu—Ni nanoparticles including a TEM micrograph showing the location of line (FIG. 23A), a line profile of Ni—K (FIG. 23B), and a line profile of Cu—K (FIG. 23C).
Figure 23B:
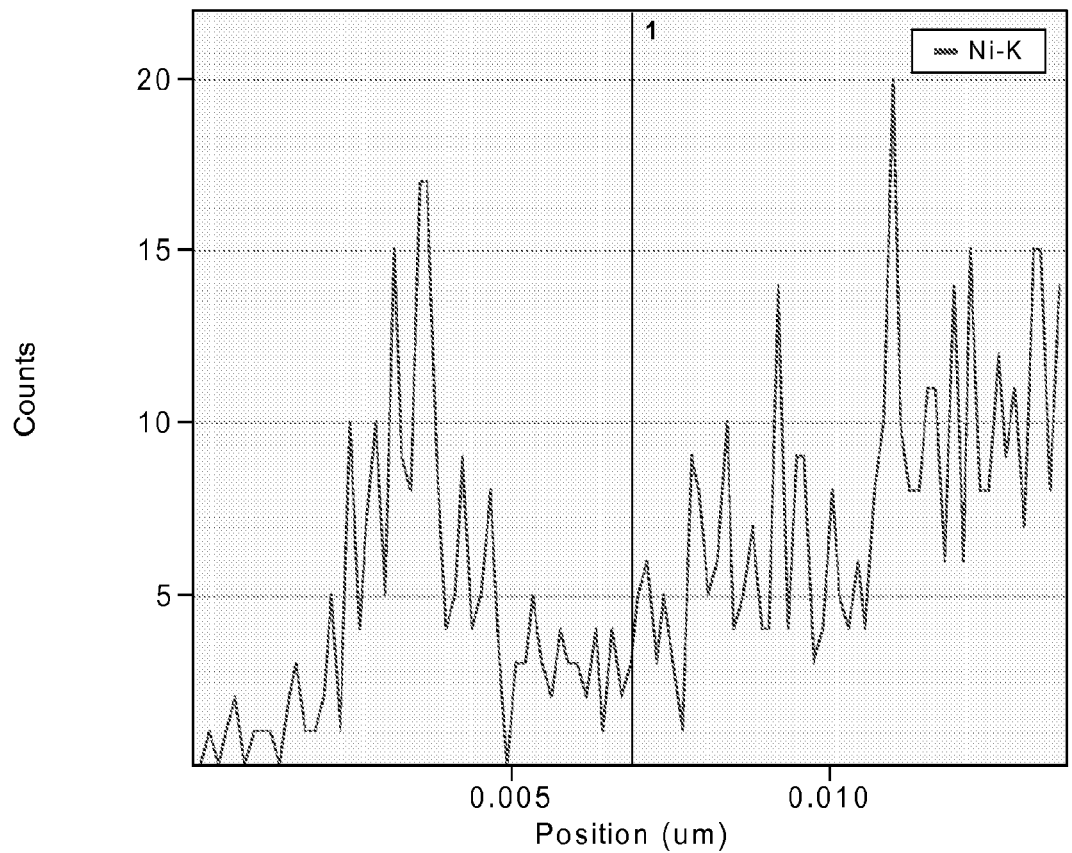
Figure 23C:
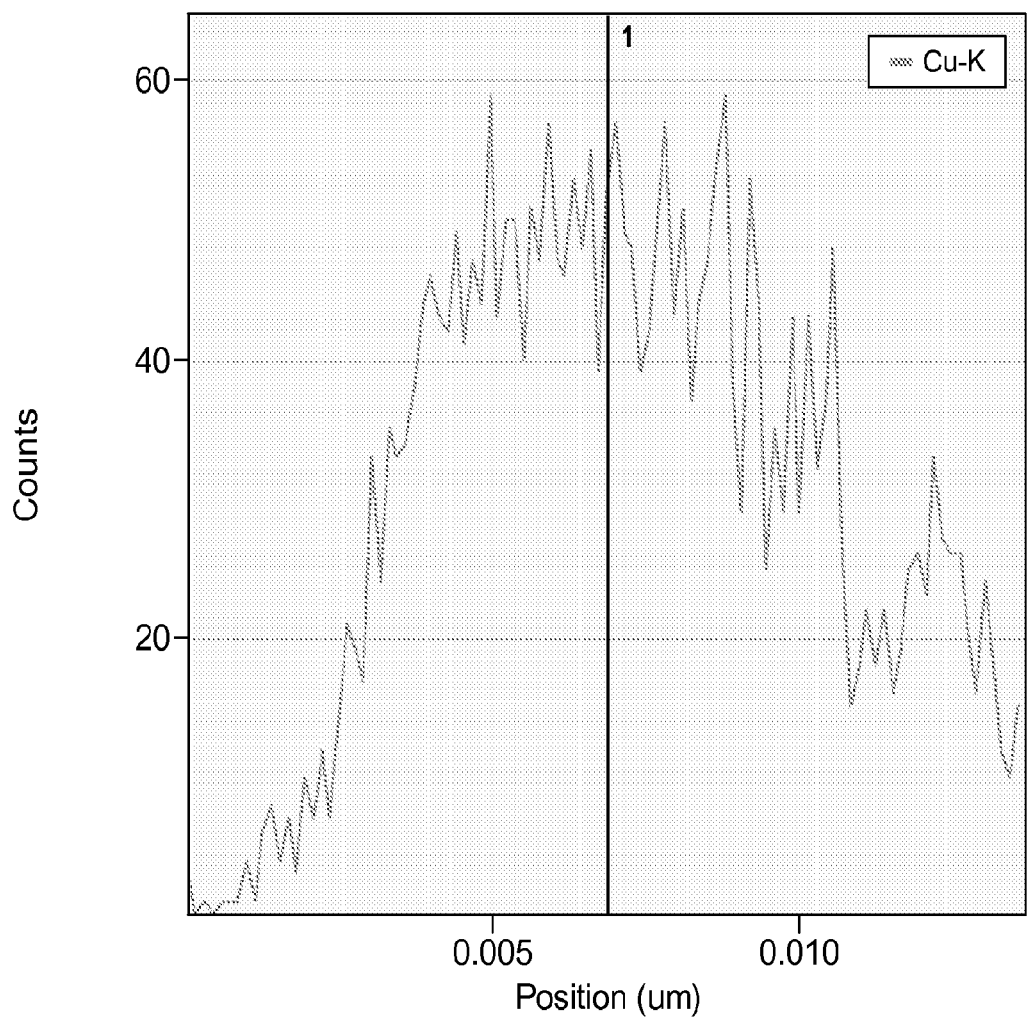

Structural characterization of the Cu—Ni nanoparticles was carried out using XRD and TEM. The XRD pattern of the Cu—Ni particles, synthesized in water, is shown in FIG. 19. The nickel content in Cu—Ni nanostructures was not detected in the XRD pattern. To understand the Ni shell formation on the copper nanoparticles, TEM analysis of the Cu—Ni structures was carried out (FIG. 20). EDX compositional analysis only revealed the existence of nickel in the synthesized core-shell nanoparticles synthesized in water when using higher molar ratios of sodium borohydride to nickel nitrate (Route 5a, FIG. 21). EDX mapping analysis confirmed the existence of the nickel on the copper nanoparticles (FIGS. 22A-22D). Line mapping of Ni and Cu particles in FIGS. 23A-23C confirmed that the Ni formed a shell around the Cu core.

Discussion of Examples 4-8

The foregoing studies illustrated a high-throughput, simple, and convenient method for the synthesis of copper nanoparticles through the reduction of copper salts in aqueous medium. A further synthesis method was developed to fabricate copper nanoparticles by modifying the existing methods using sodium borohydride and citric acid as a reducing agent and capping agent, respectively, As-synthesized particles were precipitated and cleaned using methanol. Cleaned nanoparticles were deep red in color and re-dispersed in water. These particles were highly dispersible in water and chemically stable. Ni shells were synthesized on these particles and their structural properties were analyzed. EDX mapping confirmed the successful formation of a nickel shell on the copper nanoparticles.

Example 9

Formulation and Optimization of Cu—Ni Core-shell Dispersions and Inks for Inkjet Printing The synthesis of the basic Cu$_2$O and Cu—Ni inks are described herein above. Aqueous inks made from these metallic core-shell particles are optimized to include a binder and any additional surfactant as needed for inkjet printing. Printing of these inks is optimized on a Dimatix materials printer equipped with a piezo electric printer including optimization of the droplet size and waveforms. Inks are printed and characterized on glass and Si wafers. Initial characterization includes, but is not limited to line width, thickness, resistivity and SEM images, with further studies being focused on providing the appropriate line thickness and width at optimal resolution and conductivity relative to screen printed lines, which is used as a benchmark (130 μm width and 12 μm thickness). These optimized formulas are used as the starting point for additional core-shell nanoparticle inks.

Example 10

Synthesis of Metallic Core-shell Inks Using Alternate Shells

The foregoing studies on core-shell nanoparticles is further extended to include a Cu core with the following metallic (M) nanoparticle shells: M=Ag and Sn. These Cu-M core-shell nanoparticles are synthesized in a reducing atmosphere in the presence of the appropriate metal salts and solvent. The wet chemistry synthesis is used to produce a stable dispersion that can either be used directly in an ink or concentrated and re-dispersed into an aqueous ink formulation. The first step in forming these metallic shells is the reduction of metal ions to their metal atoms, where the driving force for the reaction is the difference in the reduction potential of the metal and the reducing agent, $\Delta E^o$, where the reduction potential must be positive in order for the reaction to proceed. This is related to the free energy of the redox process as follows in Equation 4:

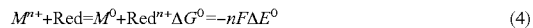

$$M^{n+}+\text{Red}=M^0+\text{Red}^{n+} \Delta G^0=-nF\Delta E^0 \qquad (4)$$

Reducing agents include borohydride, hydrazine, citrate and possibly ascorbic acid for the strongly electropositive metals like Ag$^+$. In addition to water, organic solvents such as ethylene glycol, propylene glycol and diethylene glycol are used because of the role as both solvents for the metal ions and as reducing agents. Those polyols are also desirable because of the common use and compatibility with inkjet printheads. In addition to producing water soluble metallic core-shell nanoparticles the reactions are carried out under mild temperatures (≤100° C.) wherever possible. Ligands and surfactants are used to stabilize the metallic nanoparticle dispersion as necessary. Primary ligands and surfactants include Tergitol, CTAB, poly(N-vinyl-2-pyrrolidone)(PVP), as well as others. Characterization of these dispersions include XRD, SEM, TEM, zeta potential measurements. Diffusion of the Cu into Si substrates is also investigated.

Example 11

Ink Formulation

The formulation of screen printed pastes enables the manufacturer to quickly substitute in the Cu paste without a major capital outlet for new equipment. In this regard, such screen printed inks typically consist of 3 major components: (1) solids content; (2) binding agent; and (3) the vehicle (solvent). These inks normally have a high viscosity as the paste must not seep through the mesh or crack during drying to be able to print clear and crisp lines. Therefore, organic binders can in certain instances be added to change the rheological properties of the paste. Inks for inkjet printing, on the other hand, must avoid aggregation to prevent clogging of the print head and ways are considered to minimize porosity in the printed lines; as a high porosity will create increased line p. Further additives such as glass frits can in further instances be added to improve contact performance.

With respect to additives, PbO as a major component in glass fits in Ag pastes has three primary roles: 1) to etch the antireflection $SiN_x$:H coating; 2) to facilitate ohmic contacts between the Ag paste and the Si; and 3) to provide mechanical strength. Two different models have been proposed for the mechanism of the Pb-based glass in the formation of inverted Ag pyramids on the n-type Si wafer. In some embodiments, however, to simplify the inks, the formulation of PbO nanoparticle dispersions can be co-deposited along with the Cu nanoparticles. In addition, PbO nanowires can be synthesized in a CVD reactor based on the experimental procedure published in our previous work. The synthesis of both PbO nanoparticles and nanowires allows a comparison of these effects on the creation of the conductive lines. The creation of that interconnected network also improves the strength of the contacts in addition to enhancing the conductivity. Finally the addition of Pb-free nanoparticles in the form of $Bi_2O_3$ is performed for incorporation into the metallic inks Due to environmental and health concerns with the Pb, Pb-free variations of Bi-based glasses to replace the PbO have been examined. However, a systematic study of the Pb- and Bi-based nanoparticles incorporated with the metallic ink does not exist. In this regard, the PbO and $Bi_2O_3$ nanoparticles are formulated into inks and printed to create conductive lines. Those aqueous inks will include some polyols (e.g. ethylene or diethylene glycols) and/or polymers, typically PVP as binders. If additional viscosity is needed, small amounts (0.1-1%) of natural gum arabic and/or polysaccharide gums, which have been shown to improve adhesion and viscosity of inkjet printed CNT inks, are used. Surfactants are added as needed to improve the printing and resolution of lines.

Example 12

Thermal Processing

Reactions and mechanisms involved in the thermal processing of the inks are also examined. There are 4 main processes involved after the ink is printed: (1) evaporation of the carrier solvent; (2) decomposition of the remaining organic chemicals; (3) reduction of the oxides; and (4) sintering, melting, and consolidation of the nanoparticles. In order to optimize the thermal processing in conjunction with optimization of the ink formulation, a model for the reactions taking place is formed. Thermo gravimetric analysis (TGA) can identify both physical transitions (e.g. evaporation, desorption, etc) and chemical reactions (e.g. decomposition, reduction, etc). At low temperatures, under isothermal conditions, measuring the weight loss with time provides information on how long the sample must be maintained at a certain temperature to evaporate all the solvent, or decompose the residual organic material. Calculating the first derivative weight loss of dynamic experiments also identifies the temperature at which these processes have the highest rate of evaporation/decomposition/reduction. Isothermal measurements can also provide kinetic information on the reactions occurring. The Arrhenius equation expressing the temperature dependence of the chemical process can be used to find the activation energy ($E_a$) of the reactions (Equation 5).

$$K=Ae(-E_a/RT) \quad (5)$$

In that equation, K is the rate constant, R is the gas constant, T is the thermodynamic temperature, and A is the frequency factor. It is worth noting that the addition of glass frits to the inks may cause a deviation from the Arrhenius behavior. Isothermal decomposition of the ink using conventional heating apparatus, followed by XRD studies provides information on the temperature at which reduction of the oxide begins and the reaction is completed. In addition to the chemical and physical changes to the printed patterns, the gases evolved during thermal processing are investigated using gas chromatography/mass spectroscopy. The gases evolved due to the decompositions of the inks have a direct impact on the rate of reduction of the metal oxide nanoparticles, as well as being an important safety consideration during the scaling up of the process.

Example 13

Optimization of the IPL Treatment

The current IPL process gradually ramps up the energy density (i.e. intensity) of the light pulses from 10.2 to 34.5 $Jcm^{-2}$, in order to accomplish the 4 stages described above. In total 80 pulses of light with a total energy input 1723 $Jcm^{-2}$ are applied, with a total processing time of less than 1½ minutes. In addition, the current IPL treatment takes place in a $N_2$ atmosphere. Therefore, to make the inks more appealing to the end user, formulating the inks for atmospheric processing is believed to be beneficial. Initial studies on the above-described $Cu_2O$ ink on PET has shown that a conducting film can be formed using only 1 pulse of light with an ED of 22.4 $Jcm^{-2}$ in air. However, the films showed that some $Cu_2O$ remained, as well as the formation of CuO. Another consideration is whether a closed or open system is used during IPL sintering. In an open system, the reducing gases may dissipate before reduction of the particles occurs. By utilizing the TGA results described above, the temperature at which each of the 4 stages (e.g. evaporation, reduction, etc.) occurs is known. Therefore, IPL process parameters such as energy density, pulse duration and number of pulses can be determined. The current IPL process uses a pulse duration of 2 ms, based on initial finite element analysis (FEA), the increase in temperature within the film can reach up to 1000° C. for a very short duration (less than 1 ms).

Example 14

Cu Diffusion

As noted, Cu is believed to dissolve interstitially forming a positively charged ion, as such it easily compensates for negatively charged acceptors. These recombination centers diminish charge carrier life time. Hence Cu has a stronger effect on p-type Si. The diffusivity, D of Cu in to Si can be modelled on Fick's first law (Equation 6);

$$D = D_0 \exp\left(\frac{-E_a}{k_B T}\right) \quad (6)$$

In equation 6, $D_o$ depends on the element, $k_B$ is the Boltzmann constant, $E_a$ is the activation energy. The diffusivity shows an Arrhenius relationship with temperature. Compared to Ag, Cu has an $E_a$ at least two times lower, therefore diffuses more rapidly in to Si. Therefore, barriers to prevent Cu diffusion are important for Cu contacts. When cooled, Cu is known to form Cu rich silicides; resulting in an increase in ρ. Due to changes in both the electrical and compositional properties, measurements to study the sheet and series resistance with respect to temperature then show the diffusion barrier properties of the shell.

Example 15

Printing

The inks described herein are applied using either screen printing or ink jet printing. Screen printing is the current industry standard method for producing c-Si cells, therefore less adjustment to production lines will be needed. However, as thinner c-Si cells are produced, processing steps that apply less pressure to the cells are needed to avoid breakage. Therefore, long term goals to apply the front contacts by inkjet printing are needed.

In screen printing the ink is essentially forced through a mesh screen. Particle size of the solids is limited by the mesh size which is determined by the diameter of the threads and the thread count. Typically less material is deposited through a mesh with a fine thread count, while a coarser mesh produces a thicker pattern. To print on to the substrate, the substrate is placed beneath the screen, leaving a gap between the screen and the substrate. The ink is then placed on the screen and is forced through the mesh using a scraper. To produce crisp patterns, the inks must be fairly viscous to avoid the ink flowing through the screen.

Ink jet printing can minimize waste as well as print finer lines. Principally, the inkjet technique digitally controls the ejection of ink droplets a print head. Both continuous (CIJ) and drop on demand inkjet (DOD) systems exist; however, the drop on demand method is by far the most common. The DOD piezoelectric system has less stringent requirements on the ink formulation, as it forms the droplet using mechanical force. Therefore, a piezoelectric print head is used.

As also noted, one of the uses for the inks is to replace the Ag in the front contacts and bus bars used on c-Si solar cells. In this regard, the inks must achieve the industry standards for the Ag fingers, so the printed contacts are investigated to study the following properties: (1) line resistivity and aspect ratio; (2) contact resistance; (3) PV performance; and (4) etching of the SiN$_x$:H antireflection coating, adhesion and solderability.

The ink must be able to be printed, using either screen printing or inkjet printing, to produce lines with a maximum width of 130 μm, a height of 12 μm, and length of 15-21 cm. The finger contacts, after thermal processing must have a specific line ρ of less than or equal to $3.0 \times 10^{-6}$ Ωcm, to compete with the Ag pastes. In this regard, and again without wishing to be bound by any particular theory or mechanism, it is believed that the porosity and the further reduction of the oxides in the presently-disclosed Cu—Ni films can be controlled to adjust the ρ of the lines.

The contact resistance, $R_c$ for these inks is also a relevant parameter as the $R_c$ for the inks should have a value less than or equal to $1.0 \times 10^{-3}$ Ωcm$^2$ on an emitter with a $R_{sq}$ of 40-60Ω/□ to compete with Ag contacts. In this regard, a 1-dimensional Transfer Length Model (TLM) is used to determine the resistance. To test the $R_c$, metal contacts are deposited on to a c-Si wafer. In order to replicate the conditions the contacts are used under, n-type c-Si wafers that are sourced for the substrate. Identical multiple contacts are deposited over the wafer, so that the distance (x) between the contacts increases. The current-voltage (I-V) characteristics will be measured to determine the resistance ($R_{total}$=V/I) (Equation 7).

$$R_{total} = \frac{R_{sem}}{w}x + \frac{2R_c}{w} \qquad (7)$$

The measured resistance is a combination of the semiconductors resistance, $R_{sem}$ and the $R_c$, and, as such, the $R_c$ can be determined. In addition the transfer length, $L_T$ can be found by extrapolating the results. $L_T$ is the distance over which most of the current transfers from the semiconductor in to the metal or vice versa; as such $L_T$ must be as large as possible. The total contact area, A is given as A=LW, (where W is the length of the contact) however the active area, $A_{act}$=$L_T$W. Therefore, if $L_T$ is significantly smaller than the contact length, $L_c$ the $A_{act}$ area would be much smaller. This leads to a higher current density flowing through the contact and the possible degradation of the contact.

The Cu contacts should also demonstrate long term stability when used on c-Si solar cells. Migration of Cu from the contacts to the active p-n junction can shunt the device, thereby the solar cells efficiency, η. The formation of Cu silicide's can also result in an increase to series resistance. As such, the contacts produced by the ink formulations are studied in situ. To measure the I-V performance of the contacts, p-n junction based c-Si wafers without the front contacts are sourced. I-V measurements of the full device provide information on the contacts performance. Accelerated aging of the cells followed by characterization of the performance of these cells will also provide information on the long term effects of the Cu based contacts.

The Ag based pastes normally include a PbO based glass frit needed to etch the SiN$_x$:H layer. The glassy region can improve adhesion of the contacts to the substrate; however they can also result in lower electrical conductivity. SEM cross-sectional images of the lines confirm etching through the anti-reflective coating and the formation of glassy regions. The bus bars made using these inks is able to have electrical contacts soldered to them without any detrimental effects to device performance.

Throughout this document, various references are mentioned. All such references are incorporated herein by reference, including the references in the following list:

REFERENCES

1. Park, S.-H. and H.-S. Kim, *Flash light sintering of nickel nanoparticles for printed electronics*. Thin Solid Films, 2014. 550: p. 575-581.
2. Perelaer, J., et al., Roll-to-roll compatible sintering of inkjet printed features by photonic and microwave exposure: from non-conductive ink to 40% bulk silver conductivity in less than 15 seconds. Adv Mater, 2012. 24(19): p. 2620-5.
3. Powell, D. M., et al., Crystalline silicon photovoltaics: a cost analysis framework for determining technology pathways to reach baseload electricity costs. Energy & Environmental Science, 2012. 5(3): p. 5874.
4. Istratov, A. A. and E. R. Weber, *Physics of Copper in Silicon*. Journal of The Electrochemical Society, 2002. 149(1): p. G21.
5. Abbel, R., et al., Photonic flash sintering of silver nanoparticle inks: a fast and convenient method for the preparation of highly conductive structures on foil. MRS Communications, 2012. 2(04): p. 145-150.
6. Chung, W. H., et al., In situ monitoring of a flash light sintering process using silver nano-ink for producing flexible electronics. Nanotechnology, 2013. 24(3): p. 035202.
7. Galagan, Y., et al., Photonic sintering of inkjet printed current collecting grids for organic solar cell applications. Organic Electronics, 2013. 14(1): p. 38-46.
8. Hösel, M. and F. C. Krebs, Large-scale roll-to-roll photonic sintering of flexo printed silver nanoparticle electrodes. Journal of Materials Chemistry, 2012. 22(31): p. 15683.
9. Lee, D. J., et al., Pulsed light sintering characteristics of inkjet-printed nanosilver films on a polymer substrate. Journal of Micromechanics and Microengineering, 2011. 21(12): p. 125023.
10. Yung, K. C., et al., *Ink-jet printing and camera flash sintering of silver tracks on different substrates*. Journal of Materials Processing Technology, 2010. 210(15): p. 2268-2272.
11. Han, W. S., et al., *Multi-pulsed white light sintering of printed Cu nanoinks*. Nanotechnology, 2011. 22(39): p. 395705.
12. Hwang, H. J., W. H. Chung, and H. S. Kim, In situ monitoring of flash-light sintering of copper nanoparticle ink for printed electronics. Nanotechnology, 2012. 23(48): p. 485205.
13. Kim, H.-S., et al., Intense pulsed light sintering of copper nanoink for printed electronics. Applied Physics A, 2009. 97(4): p. 791-798.
14. Ryu, J., H.-S. Kim, and H. T. Hahn, *Reactive Sintering of Copper Nanoparticles Using Intense Pulsed Light for Printed Electronics*. Journal of Electronic Materials, 2010. 40(1): p. 42-50.
15. Dharmadasa, R., et al., Room temperature synthesis of a copper ink for the intense pulsed light sintering of conductive copper films. ACS Appl Mater Interfaces, 2013. 5(24): p. 13227-34.
16. Dharmadasa, R., et al., Intense pulsed light treatment of cadmium telluride nanoparticle-based thin films. ACS Appl Mater Interfaces, 2014. 6(7): p. 5034-40.
17. Dharmadasa, R., I. M. Dharmadasa, and T. Druffel, *Intense Pulsed Light Sintering of Electrodeposited CdS Thin Films*. Advanced Engineering Materials, 2014.
18. Goodrich, A., et al., A wafer-based monocrystalline silicon photovoltaics road map: Utilizing known technology improvement opportunities for further reductions in manufacturing costs. Solar Energy Materials and Solar Cells, 2013. 114: p. 110-135.
19. Dharmadasa, R., et al., Room Temperature Synthesis of a Copper Ink for the Intense Pulsed Light Sintering of Conductive Copper Films. ACS applied materials & interfaces, 2013. 5(24): p. 13227-13234.
20. Kern, W., *The evolution of silicon wafer cleaning technology*. Journal of the Electrochemical Society, 1990. 137(6): p. 1887-1892.
21. Huang, L., et al., Synthesis of copper nanoparticles containing diamond-like carbon films by electrochemical method. Electrochemistry communications, 2006. 8(2): p. 262-266.
22. Liu, Z., et al., Synthesis of copper nanowires via a complex-surfactant-assisted hydrothermal reduction process. The Journal of Physical Chemistry B, 2003. 107(46): p. 12658-12661.
23. Zhou, X., et al., Parametric study on electrochemical deposition of copper nanoparticles on an ultrathin polypyrrole film deposited on a gold film electrode. Langmuir, 2004. 20(12): p. 5109-5113.
24. Blosi, M., et al., *Microwave-assisted polyol synthesis of Cu nanoparticles*. Journal of Nanoparticle Research, 2011. 13(1): p. 127-138.
25. Kitchens, C. L., M. C. McLeod, and C. B. Roberts, Chloride ion effects on synthesis and directed assembly of copper nanoparticles in liquid and compressed alkane microemulsions. Langmuir, 2005. 21(11): p. 5166-5173.
26. Capek, I., *Preparation of metal nanoparticles in water-in-oil (w/o) microemulsions*. Advances in colloid and interface science, 2004. 110(1): p. 49-74.
27. Ponce, A. A. and K. J. Klabunde, *Chemical and catalytic activity of copper nanoparticles prepared via metal vapor synthesis*. Journal of Molecular Catalysis A: Chemical, 2005. 225(1): p. 1-6.
28. Mohamed, M. A., A. K. Galwey, and S. A. Halawy, A comparative study of the thermal reactivities of some transition metal oxalates in selected atmospheres. Thermochimica acta, 2005. 429(1): p. 57-72.
29. Kumar, B., et al., Enhanced hydrogen/oxygen evolution and stability of nanocrystalline (4-6 nm) copper particles. J. Mater. Chem. A, 2013. 1(15): p. 4728-4735.
30. Carroll, K. J., et al., *Selective Nucleation and Growth of Cu and Ni Core/Shell Nanoparticles*. Chemistry of Materials, 2010. 22(7): p. 2175-2177.
31. Yamauchi, T., et al., Magnetic Cu—Ni (core-shell) nanoparticles in a one-pot reaction under microwave irradiation. Nanoscale, 2010. 2(4): p. 515-23.
32. Kim, H. S., et al., *Intense pulsed light sintering of copper nanoink for printed electronics*. Applied Physics a-Materials Science & Processing, 2009. 97(4): p. 791-798.
33. Kim, J. Y., et al., Reduction of CuO and Cu2O with H2: H Embedding and Kinetic Effects in the Formation of Suboxides. Journal of the American Chemical Society, 2003. 125(35): p. 10684-10692.
34. Svintsitskiy, D. A., et al., *In Situ XRD, XPS, TEM, and TPR Study of Highly Active in CO Oxidation CuO Nanopowders*. The Journal of Physical Chemistry C, 2013. 117(28): p. 14588-14599.
35. Richardson, J. T., R. Scates, and M. V. Twigg, *X-ray diffraction study of nickel oxide reduction by hydrogen*. Applied Catalysis A: General, 2003. 246(1): p. 137-150.
36. Johnson, B. C., *Electrical resistivity of copper and nickel thin-film interconnections*. Journal of Applied Physics, 1990. 67(6): p. 3018-3024.
37. Istratov, A. A. and E. R. Weber, *Physics of copper in silicon*. Journal of The Electrochemical Society, 2002. 149(1): p. G21-G30.
38. Istratov, A. and E. Weber, Electrical properties and recombination activity of copper, nickel and cobalt in silicon. Applied physics A, 1998. 66(2): p. 123-136.
39. Hall, R. and J. Racette, Diffusion and solubility of copper in extrinsic and intrinsic germanium, silicon, and gallium arsenide. Journal of Applied Physics, 2004. 35(2): p. 379-397.
40. Wang, M., Y. Lin, and M. Chen, *Barrier properties of very thin Ta and TaN layers against copper diffusion*. Journal of The Electrochemical Society, 1998. 145(7): p. 2538-2545.
41. Feldman, D., et al., Photovoltaic System Pricing Trends: Historical, Recent, and Near-Term Projections. 2013 Edition. 2013, Golden, CO: National Renewable Energy Laboratory.

42. Goodrich, A. C., et al., *Assessing the drivers of regional trends in solar photovoltaic manufacturing.* Energy & Environmental Science, 2013. 6(10): p. 2811-2821.
43. Wang, U., U. S. Solar Market Grew 76% in 2012, in Forbes. 2013.
44. Godfrey, A. B. and A. Kong, *Fine particles.* 2009, Google Patents.
45. Pope, D. S., K. A. Schroder, and I. M. Rawson, *Method for Reducing Thin Films on Low Temperature Substrates.* 2009, Google Patents.
46. Stassen, A. Z., Weiming, New Ag Metallization Pastes for Soalr Energy Cost Reduction. 2013.
47. Buzby, D. and A. Dobie, Fine line screen printing of thick film pastes on silicon solar cells. 2011.
48. Jha, M., et al., Room temperature solution-phase synthesis and intense pulsed light sintering of copper-nickel core-shell nanoparticles for conductive applications. submitted to Advanced Materials, 2014.
49. Hong, K. K., et al., Role of PbO-Based Glass Frit in Ag Thick-Film Contact Formation for Crystalline Si Solar Cells. Metals and Materials International, 2009. 15(2): p. 307-312.
50. Schubert, G., F. Huster, and P. Fath, Physical understanding of printed thick-film front contacts of crystalline Si solar cells-Review of existing models and recent developments. Solar Energy Materials and Solar Cells, 2006. 90(18-19): p. 3399-3406.
51. Vendra, V. K., et al., *Photoanode Area Dependent Efficiency and Recombination Effects in Dye-Sensitized Solar Cells.* Journal of the Electrochemical Society, 2012. 159(8): p. H728-H733.
52. Vendra, V. K., et al., *Nanowire architectures for iodide free dye-sensitized solar cells.* Journal of Materials Chemistry A, 2013.
53. Kalio, A., et al., *Development of lead-free silver ink for front contact metallization.* Solar Energy Materials and Solar Cells, 2012. 106: p. 51-54.
54. Zhu, X. M., C. L. Mai, and M. Y. Li, *Effects of B2O3 content variation on the Bi ions in Bi2O3-B2O3-SiO2 glass structure.* Journal of Non-Crystalline Solids, 2014. 388: p. 55-61.
55. Najeeb, C. K., et al., The effect of surface modifications of carbon nanotubes on the electrical properties of inkjet-printed SWNT/PEDOT-PSS composite line patterns. Nanotechnology, 2010. 21(38).
56. Panhuis, M. i. h., et al., Inkjet printed water sensitive transparent films from natural gum-carbon nanotube composites. Soft Matter, 2007. 3(7): p. 840-843.
57. Gabbott, P., Principles and applications of thermal analysis. 2008: John Wiley & Sons.
58. Magdassi, S., *The chemistry of inkjet inks.* Vol. 20. 2010: World scientific Singapore.
59. Neuhaus, D.-H. and A. Manzer, *Industrial silicon wafer solar cells.* Advances in OptoElectronics, 2008. 2007.
60. Raval, M. C. and C. S. Solanki, *Review of Ni—Cu Based Front Side Metallization for c-Si Solar Cells.* Journal of Solar Energy, 2013. 2013.
61. Schroder, D. K., *Semiconductor material and device characterization.* 2nd Edition ed. 1998: John Wiley & Sons.
62. D. Deng, Y. Jin, Y. Cheng, T. Qi, and F. Xiao, "Copper nanoparticles: Aqueous phase synthesis and conductive films fabrication at low sintering temperature," *ACS applied materials & interfaces*, vol. 5, pp. 3839-3846, 2013.
63. W. Yu, H. Xie, L. Chen, Y. Li, and C. Zhang, "Synthesis and characterization of monodispersed copper colloids in polar solvents," *Nanoscale research letters*, vol. 4, pp. 465-470, 2009.
64. Y. Lee, J.-r. Choi, K. J. Lee, N. E. Stott, and D. Kim, "Large-scale synthesis of copper nanoparticles by chemically controlled reduction for applications of inkjet-printed electronics," *Nanotechnology*, vol. 19, p. 415604, 2008.

What is claimed is:

1. A method of making a conductive ink, comprising:
synthesizing an amount of copper nanoparticles in a solution;
adding an amount of a barrier metal to the copper nanoparticles to form a dispersion of the barrier metal and the copper nanoparticles; and
placing the dispersion in a reducing environment to produce a conductive ink comprising core-shell nanostructures having a copper core and a barrier metal shell.

2. The method of claim 1, wherein the copper nanoparticles comprise pure copper nanoparticles, copper oxide nanoparticles, or a combination thereof.

3. The method of claim 1, wherein the barrier metal is selected from tin, silver, nickel, lead, bismuth, and salts, oxides, and combinations thereof.

4. The method of claim 1, wherein the step of adding the barrier metal to the copper nanoparticles comprises adding a hydrated salt of the barrier metal to the copper nanoparticles.

5. The method of claim 4, wherein the hydrated salt comprises nickel nitrate hexahydrate.

6. The method of claim 1, wherein the steps of synthesizing an amount of copper nanoparticles, adding an amount of a barrier metal to the copper nanoparticles, and placing the dispersion in a reducing environment are each performed at a temperature ranging from about ambient temperature to about 200° C.

7. The method of claim 1, wherein the step of adding the amount of the barrier metal to the copper nanoparticles comprises adding the barrier metal at a barrier metal to copper nanoparticle molar ratio equal to or less than about 1:1.

8. The method of claim 7, wherein the barrier metal comprises an aqueous solution of the barrier metal.

9. The method of claim 1, wherein the copper nanoparticles have a diameter of about 10 nm to about 20 nm.

10. The method of claim 1, wherein the core-shell nanostructures have a diameter of about 10 nm to about 100 nm.

11. The method of claim 1, wherein the step of synthesizing the copper nanoparticles comprises:
providing a hydrate of a copper salt in the solution;
mixing the hydrate of the copper salt with an amount of a copper salt reducing agent.

12. The method of claim 11, wherein the copper salt reducing agent is selected from a borohydride, a hydrazine, a citrate, an ascorbic acid, and combinations thereof.

13. The method of claim 11, wherein the solution further comprises ethylene glycol, propylene glycol, diethylene glycol, or combinations thereof.

14. The method of claim 1, wherein the solution further comprises a capping agent.

15. The method of claim 11, further comprising the step of adjusting a pH of the solution to a basic pH prior to mixing the hydrate of the copper salt with the amount of the copper salt reducing agent.

16. The method of claim 15, wherein the basic pH is about 10 to about 11.

17. The method of claim 11, wherein the copper salt comprises copper nitrate ($Cu(NO_3)_2$).

18. A conductive ink produced by the method according to claim 1, further comprising a plurality of core-shell nanostructures, each nanostructure including a copper core and a barrier metal shell, each core-shell nanostructure having a diameter of less than about 500 nm, and each core-shell nanostructure including a boundary between the copper core and the barrier metal shell.

19. A method of forming a copper film from a copper nanoparticle ink, comprising:
synthesizing an amount of copper nanoparticles in a solution;
adding an amount of a barrier metal to the copper nanoparticles to form a dispersion of the barrier metal and the copper nanoparticles;
placing the dispersion in a reducing environment to produce a copper ink comprising core-shell nanostructures having a copper core and a barrier metal shell;
applying the copper ink to a substrate; and
sintering the copper ink.

20. The method of claim 19, wherein the substrate is selected from glass, polyethylene terephthalate, silicon, and combinations thereof.

21. The method of claim 19, wherein the step of sintering the copper ink comprises intense pulsed light sintering of the copper ink.

22. The method of claim 21, wherein the intense pulsed light sintering comprises applying one or more pulses of light, each of the one or more pulses of light having an energy of about 1 $Jcm^{-2}$ to about 50 $Jcm^{-2}$.

23. The method of claim 19, wherein the step of applying the copper ink comprises printing the copper ink onto the substrate.

24. The method of claim 23, wherein the step of printing the copper ink comprises screen printing, inkjet printing, or aerosol jet printing the copper ink.

* * * * *